United States Patent
Domen et al.

(10) Patent No.: US 6,555,403 B1
(45) Date of Patent: Apr. 29, 2003

(54) SEMICONDUCTOR LASER, SEMICONDUCTOR LIGHT EMITTING DEVICE, AND METHODS OF MANUFACTURING THE SAME

(75) Inventors: Kay Domen; Shinichi Kubota; Akito Kuramata; Reiko Soejima, all of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/124,895

(22) Filed: Jul. 30, 1998

(30) Foreign Application Priority Data

| Jul. 30, 1997 | (JP) | 9-204364 |
| Aug. 7, 1997 | (JP) | 9-213672 |
| Sep. 29, 1997 | (JP) | 9-263158 |
| Sep. 30, 1997 | (JP) | 9-265336 |
| Oct. 23, 1997 | (JP) | 9-291020 |
| Feb. 26, 1998 | (JP) | 10-044900 |
| Mar. 24, 1998 | (JP) | 10-075652 |

(51) Int. Cl.[7] ............................................. H01L 21/00
(52) U.S. Cl. .................. 438/22; 438/22; 257/10; 257/11; 257/12; 257/13; 257/14; 257/79; 257/80; 257/81; 257/82; 257/83; 257/84; 257/85; 257/86
(58) Field of Search .................. 438/22; 257/10, 257/13–14, 12, 79–87; 372/46

(56) References Cited

U.S. PATENT DOCUMENTS

| 5,247,533 A | | 9/1993 | Okazaki et al. ........... 372/45 |
| 5,358,898 A | * | 10/1994 | Ogita et al. ............... 437/129 |
| 5,793,054 A | * | 8/1998 | Nido .......................... 257/18 |
| 5,828,684 A | * | 10/1998 | Van de Walle ............ 372/45 |
| 5,923,690 A | * | 7/1999 | Kume et al. ............... 372/46 |
| 5,963,787 A | * | 10/1999 | Kimura et al. ............ 438/46 |
| 5,966,396 A | * | 10/1999 | Okazaki et al. ........... 372/46 |
| 5,972,730 A | * | 10/1999 | Saito et al. ............... 438/39 |
| 6,015,979 A | * | 1/2000 | Sugiura et al. ............ 257/86 |
| 6,017,807 A | * | 1/2000 | Furakawa et al. ......... 438/502 |

FOREIGN PATENT DOCUMENTS

| JP | 4-781 | 1/1992 |
| JP | 6-260682 | 9/1994 |
| JP | 6-260683 | 9/1994 |
| JP | 6-268257 | 9/1994 |
| JP | 7-94784 | 4/1995 |
| JP | 08056046 A | 2/1996 |
| JP | 8-316528 | 11/1996 |

* cited by examiner

Primary Examiner—Matthew Smith
Assistant Examiner—Granvill D Lee
(74) Attorney, Agent, or Firm—Armstrong Westerman & Hattori, LLP

(57) ABSTRACT

There are provided a semiconductor laser, a semiconductor light emitting device, and methods of manufacturing the same wherein a threshold current density in a short wavelength semiconductor laser using a nitride compound semiconductor can be reduced. An active layer is composed of a single gain layer having a thickness of more than 3 nm, and optical guiding layers are provided between the active layer and cladding layers respectively.

58 Claims, 44 Drawing Sheets

$E_C$ : CONDUCTION BAND EDGE
$E_V$ : VALENCE BAND EDGE

SEMICONDUCTOR LASER, SEMICONDUCTOR LIGHT EMITTING DEVICE, AND METHODS OF MANUFACTURING THE SAME

BACKGROUND OF THE INVENTION

1. Field of the Invention

The present invention relates to a semiconductor laser, a semiconductor light emitting device, andmethods of manufacturing the same and, more particularly, a semiconductor laser which has a feature in configuration to reduce a threshold current density in a semiconductor laser using a nitride compound semiconductor, and a method of manufacturing the same.

2. Description of the Prior Art

In the prior art, a short wavelength semiconductor laser has been employed as a light source of an optical disk, a DVD (digital versatil disk) drive, etc. Since a recording density of the optical disk is in inverse proportion to square of a wavelength of a laser beam, a semiconductor laser which is able to emit a laser beam of shorter wavelength is requested. A currently available semiconductor laser which is able to emit a shortest wavelength is a red-light emitting semiconductor laser which has a wavelength of about 630 to 650 nm and is incorporated into the DVD drive put on sale in last year.

However, in order to enhance the recording density higher in a photo memory device, a shorter wavelength of an output light is needed. By way of example, a blue-light semiconductor laser which has a wavelength or around 400 nm is indispensable for recording moving pictures on the optical disk for two hours. Hence, in recent years, the short wavelength emitting semiconductor laser which has a wavelength in a blue light emitting range has been developed actively as a next generation optical disk light source.

As material for the blue-light emitting semiconductor laser mentioned above, ZnSe (Zinc selen) system in group II–VI compound semiconductor and GaN system in group III–V compound semiconductor have been studied. Since the ZnSe system can substantially lattice-match with Gays which has attained great actual results as a high quality substrate, it has been considered for a long time that the ZnSe system is more advantageous than the GaN system. Therefore, most of the research scholars in the world have been engaged with study of the ZnSe system and thus the ZnSe system has gone ahead in the field of semiconductor laser study.

As for the ZnSe system, room-temperature continuous-wave oscillation (CW oscillation) due to the injection excitation has already been reported. However, since essentially the ZnSe system is material which is ready to deteriorate, its reliability becomes an issue and therefore the ZnSe system has not yet come up to practical implementation.

In contrast, in the case of the GaN system, after the announcement of the GaN (gallium nitride) high luminance LED being manufactured by Nichia Chemical Co., Ltd. at the end of 1993 which acts as the boundary, the GaN being excellent in environment resistance such as reliability which is the bottleneck of the ZnSe system has been looked at again and the number of the research scholars in the world has been risen largely.

Then, study of the GaN system has advanced rapidly since the success of pulse laser oscillation has been reported similarly by Nichia Chemical Co., Ltd. early in December, 1995. After oscillation duration of 35 hours has been reported in the room-temperature continuous-wave oscillation (CW oscillation), currently the oscillation duration of 10,000 hours has been presumed in an accelerated test.

Next, the short wavelength light emitting semiconductor device in the prior art will be explained with reference to FIGS. 1, 2 and FIG. 3 hereinbelow. FIG. 1 is a schematic sectional view, taken along its optical axis, showing the short wavelength emitting semiconductor laser in the prior art, and FIG. 2 is a schematic sectional view showing a short wavelength light emitting diode in the prior art. FIG. 3 is a schematic sectional view showing the short wavelength emitting semiconductor laser having a different buffer layer structure in the prior art.

The semicnductor laser is formed as follows.

First, as shown in FIG. 1, a GaN buffer layer 812, an n-type GaN buffer layer 813, an n-type $In_{0.1}Ga_{0.9}N$ (indium gallium nitride) layer 814, an n-type $Al_{0.15}Ga_{0.85}N$ (aluminum gallium nitride) cladding layer 815, an n-type GaN optical guiding layer 816, an InGaN MQW (multi-quantum well) active layer 817, a p-type $Al_{0.2}Ga_{0.8}N$ layer 818, a p-type GaN optical guiding layer 819, a p-type $Al_{0.15}Ga_{0.85}N$ cladding layer 820, and a p-type GaN contact layer 821 are epitaxially grown in sequence on a sapphire substrate 811 having a (0001) plane as a principal plane, by an MOVPE (metal organic vapor-phase epitaxy) method.

Then, a part of the n-type GaN buffer layer 813 is exposed by means of dry etching, then an n-side electrode 822 made of Ti/Au (titanium/gold) is formed on an exposed surface and also a p-side electrode 823 made of Ni/Au (nickel/gold) is formed on the p-type GaN contact layer 821, Then, a pair of parallel and surfaces are formed by applying dry etching. A pulse laser oscillation can be achieved successfully by adopting the end surfaces as resonator faces. If necessary, refer S. Nakamura et al.; Japanese Journal of Applied Physics, vol.35, p.L74, 1996).

In FIG. 2, in the case of the light emitting diode, the GaN buffer layer 812, an n-type GaN layer 824, an n-type or p-type $In_{0.15}Ga_{0.85}N$ active layer 825, and a p-type GaN layer 826 are epitaxially grown on the sapphire substrate 811 by the MOVPE method.

In this case, in order to obtain a practical luminescence brightness as the light emitting diode which can be operated by virtue of low injection, a Si (silicon) concentration or Zn (zinc) concentration in the $In_{0.15}Ga_{0.85}N$ active layer 825 must be set to $1 \times 10^{17}$ to $1 \times 10^{21}$ atoms/cm$^3$ and also a thickness of the $In_{0.15}Ga_{0.85}N$ active layer 825 must be set to 1 to 500 nm, more preferably 10 to 100 nm If necessary, refer Patent application Publication (KOKAI) Hei 6-260682 and Patent application Publication (KOKAI) Hei 6-260683.

FIG. 3 is a sectional view, taken along its optical axis, showing another short wavelength semiconductor laser in the prior art. First, a GaN buffer layer 832, an n-type GaN intermediate layer 833, an n-type $Al_{0.09}Ga_{0.91}N$ cladding layer 834, an n-type GaN optical guiding layer 835, an MQW active layer 836, a p-type $Al_{0.18}Ga_{0.82}N$ overflow preventing layer 837, a p-type GaN optical guiding layer 836, a p-type $Al_{0.09}Ga_{0.91}N$ cladding layer 839, and a p-type GaN contact layer 840 are epitaxially grown in sequence on a sapphire substrate 831 having the (0001) plane as the principal plane, by the MOVPE method.

Then, like the case in FIG. 1, the p-type GaN contact layer 840 and the p-type $Al_{0.09}Ga_{0.91}N$ cladding layer 839 are mesa-etched by virtue of dry etching, then a part of the n-type GaN intermediate layer 833 is exposed by means of dry etching, then an n-side electrode 841 made of Ti/Au is provided on an exposed surface of the n-type GaN intermediate layer 833 and also a p-side electrode 843 made of Ni/Au is provided on the p-type G&N contact layer 840 via a stripe-like opening or a $SiO_2$ (silicon oxidation) film 842. Then, a pair of parallel end surfaces acting as resonator faces respectively are formed by applying dry etching.

In addition, it has been proposed that the overflow preventing layer, i.e., the carrier stopper layer is provided to the n-side layer side. If necessary, refer Patent application Publication (KOKAI) Hei 10-56236. In this case, an n-type Si doped $Al_{0.15}Ga_{0.85}N$ layer as a hole stopper layer, whose n-type impurity concentration is $1\times10^{19}$ atoms/cm$^3$, and a p-type Mg doped $Al_{0.15}Ga_{0.85}N$ layer as an electron stopper layer, whose p-type impurity concentration is $5\times10^{19}$ atoms/cm$^3$, are provided between the active layers and the optical guiding layers respectively. At that time, the growth temperature is 1100° C. which is a usual temperature used to grow GaN or ALGWN.

However, in the case of the short wavelength semiconductor laser in the prior art, there has been such a problem that the threshold current density is very large such as about 3.6 kA/cm$^2$. This is because material of the nitride compound semiconductor needs essentially a large carrier density to generate the optical gain.

More particularly, this is because group Ill–V compound semiconductor having a zincblende crystal structure such as AlGaAs system, AlInGaAs system, etc. is used in the semiconductor laser which has been practically used in the prior art, whereas nitride compound semiconductor has a hexagonal crystal wurtzite structure having a very wide forbidden bandwidth and also has physical properties totally different from those of zincblende crystal material.

SUMMARY OF THE INVENTION

It is an object of the present invention to reduce a threshold current density in a short wavelength semiconductor laser using a nitride compound semiconductor.

For easy understanding of the present invention, a layer structure of a semiconductor laser will be shown in FIG. 4. In the following explanation, the term "n-side" means that the position is deviated toward the n-side electrode from a center of the active layer, while the term "p-side" means that the position is deviated toward the p-side electrode from the center of the active layer.

(1) According to the present invention, in the semiconductor laser using the nitride compound semiconductor, a structure is employed wherein the active layer which is positioned between the cladding layers 2 and 6 is composed of a single gain layer having a thickness of more than 3 nm and optical guiding layers 3, 5 are provided between the active layer 4 and the cladding layers 2, 6 respectively.

In this manner, if the active layer is composed of the single gain layer, the injection current into the active layer 4 is utilized effectively and therefore the threshold current density $J_{th}$ can be reduced. In this case, since an optical confinement factor Γ becomes small if the thickness of the active layer 4 is below 3 nm and thus the threshold current density $J_{th}$ is increased, it is effective to set the thickness of the active layer 4 to more than 3 nm. The single gain layer may be or may not be formed of the quantum well structure, but the single quantum well layer should be utilized if the quantum well structure is employed in this case. The single quantum well structure is called SQW hereinafter and the multi-quantum well structure is called MQW hereinafter.

For example, in the semiconductor laser made of the nitride compound semiconductor, in case the cavity loss is small such as 100 cm$^{-1}$, the threshold current density $J_{th}$ by which the modal gain Gm can exceed the cavity loss to thus commence the laser oscillation is different according to the number of the quantum well layers in the gain layer. If the number of the quantum well layers in the gain layer is set to n (n is a natural number), the magnitude of the threshold current density $J_{th}$ (n layers) can be given in the following order.

$J_{th}$ (one layer)<$J_{th}$ (two layers)<$J_{th}$ (three layers)<$J_{th}$ (four layers)<$J_{th}$ (five layers)

In other words, if the total thickness of the active-layer 4 is set a fixed amount, the threshold current density can be reduced as the layer number of the quantum well layers constituting the active layer 4 is made small. The threshold current density can be most reduced if the active layer is composed of the single layer. An example of the characteristic curve showing a relationship between the current density and the modal gain by using the number of the quantum well layer as a parameter is illustrated in FIG. 5.

In the present invention, an SCH (separate confinement Heterostructure) structure in which the optical guiding layers 3, 5 are formed between the active layer 4 and the cladding layers (barrier layers) 2, 6 is employed. Hence, an optical confinement factor Γ of the active layer 4 can be increased and therefore the threshold Fermi level $E^F_{th}$ can be lowered. As a result, the threshold current density $J_{th}$ of the short wavelength semiconductor laser can be lowered and further overflow of the electron in the active layer 4 can be reduced to thus improve the efficiency.

According to the present invention, in the semiconductor laser using the nitride compound semiconductor, the active layer 4 is composed of the single gain layer hating a thickness of more than 3 nm and such active layer 4 is made of the undoped layer.

In this manner, if the active layer 4 is formed of the undoped layer, the impurity scattering can be made small and thus the hole mobility can be enhanced. As a consequence, the holes can be injected more uniformly into the active layer 4.

In this case, it is preferable that the impurity concentration of the undoped layer should be below $1.0\times10^{17}$ atoms/cm$^3$. In the case of the undoped layer, sometimes the impurity contained in the upper and lower cladding layers 2, 6 is doped automatically into the active layer 4. In such case, resultantly the impurity is sometimes contained in the undoped layer at the concentration of below $1.0\times10^{17}$ atoms/cm$^3$.

It is preferable that the thickness of the above gain layer should be set to more than 6 nm though it gives both merit and demerit as described follows.

That is that when the thickness of the above gain layer should be set to more than 6 nm, it gives merit that an optical confinement of the gain layer is increased to be lowered the threshold of the Fermi level and as the result reduce the decrease of the overflow current, and demerit that the threshold $J_{th}$ is increased.

Also, it is preferable that the thickness of the above gain layer should be set to less than 30 nm. The modal gain Gm is increased with the increase of the thickness of the gain layer. However, since the threshold current density $J_{th}$ has the relation of $J_{th}=N_{th}\cdot d\cdot e/\tau_s$, ($N_{th}$ is the threshold carrier density, d is a thickness of the active layer, e is an elementary charge.) an upper limit of the thickness of the gain layer which can use effectively the current thereinto is about 30 nm. In this point, the thickness of the gain layer may be set to 3 to 30 nm.

Also, in the present invention, the thickness of the gain layer is preferably set to below 10 nm.

The thickness of the gain layer may be set to below 30 nm, since the thickness of the above gain layer gives demerit of the increasing of the threshold current density $J_{th}$ and merit of the lowering the threshold of the Fermi as described above.

In the SCH structure of the single quanta well structure, barrier layers are provided between the gain layer and the optical guiding layers 3, 5 respectively.

If the barrier layers are provided on and below the gain layer, the gain layer can serve as the well layer irrespective of the band structure of the optical guiding layers 3, 5, whereby a single quantum well structure can be constructed. In order to enhance the carrier injection efficiency, the forbidden bandwidth of the barrier layer may be set narrower than those of the optical guiding layers 3, 5. In case carrier confinement is regarded as the most important item, the forbidden bandwidth of the barrier layer may be aet wider than those of the optical guiding layers 3, 5. The forbidden bandwidth is also called an energy band gap.

(2) According to the present invention, when the cavity loss (threshold gain) of semiconductor laser is larger, in the semiconductor laser using the nitride corvound semiconductor, the active layer is composed of a multi-quantum well structure having two layers of gain layer ad shown in FIG. 5.

As stated above, if the layer number of the quantum well layer is set at 2, the threshold current density $J_{th}$ can be reduced smaller in the multi-quantum well structure.

In addition, when the cavity loss (threshold gain) of semiconductor laser is much larger, the layer number of the quantum well layer being set at 3 can be reduced further smaller in the multi-quantum well structure.

According to the present invention, in the semiconductor laser using the nitride compound semiconductor, the active layer is composed of the multi-quantu well structure having two or three layers of gain layer, each layer having a thickness of more than 6 nm.

For instance, as shown in FIG. 5, in case the cavity loss is increased like 200 cm$^{-1}$, the threshold current density $J_{th}$ by which the modal gain Gm exceeds the cavity loss to start the laser oscillation becomes $J_{th}$ (two layers)<$J_{th}$ (three layers)≈$J_{th}$ (one layer)<$J_{th}$ (four layers)<$J_{th}$ (five layers) The threshold current density $J_{th}$ can be reduced in the case that the multi-quantum well structure in which the gain layer is composed of two layers is employed.

In addition, the above gain layer is composed of the undoped layer. Like this, if the multi-quantum well structure active layer is employed, it is desired that the gain layer is formed of the undoped layer and thus the hole mobility should be enhanced by reducing the impurity scattering. As a result, the holes can be injected more uniformly.

Also, it is preferable that the above gain layer 4 should be formed of the nitride compound semiconductor such as GaN, InGaN, AlGaN, AlInGaN, or the like, i.e., $Al_xGa_yIn_{1-x-y}N$ where $0 \leq x < 1$, $0 < y \leq 1$).

(3) According to the present invention, in the semiconductor laser using the nitride compound semiconductor, a multi quantum well structure is employed as the active layer and also the maximum position of the emitted light intensity distribution is shiftedtowardthep-side claddinglayer side from a center position of the active layer.

In this fashion, if the maximum position of the emitted light intensity distribution in the active layer is shifted toward the p-side cladding layer side from the center position of the active layer so as to be equal to the maximum optical gain position in the maximum position of the emitted light intensity distribution, the optical confinement effect can be enhanced and the threshold current density can be reduced.

In this case, it is preferable that the maximum position of the emitted light intensity distribution coincides with a position of the first quantum well layer from the p-side cladding layer side of the multi-quantum well structure. In the MQW semiconductor laser using the nitride compound semiconductor, it is desired that, since the optical gain in the first quantum well layer from the p-side cladding layer side is made maximum, the maximum value of the emitted light intensity distribution should be positioned in the first quantum well layer. It is preferable that, in order to adjust the maximum value position of the emitted light intensity distribution, an n-side optical guiding layer is provided between the active layer and the n-type cladding layer, and a p-side optical guiding layer is provided between the active layer and the p-type cladding layer, and the forbidden bandwidth (energy band gap) of the n-side optical guiding layer is set wider than that of the p-side optical guiding layer.

In the nitride compound semiconductor, since the wider the forbidden bandwidth the smaller the refractive index, the emitted light intensity distribution is shifted towards the p-side if the forbidden bandwidth of the n-side optical p-side optical guiding layer is set wider than that of the p-side optical guiding layer.

It is preferable that, in order to adjust the maximum value position of the emitted light intensity distribution, the n-side optical guiding layer is provided between the active layer and the n-type cladding layer, and in addition a thickness of the p-side optical guiding layer is set thicker than that of the n-side optical guiding layer.

Asymmetry of the light guide structure can be formed by providing the thickness of the p-side optical guiding layer and the n-side optical guiding layer in an SCH structure asymmetrically. Also, the emitted light intensity distribution can be shifted toward the p side by setting the thickness of the p-side optical guiding layer thicker than that of the n-side optical guiding layer.

In order to adjust the maximum value position of the emitted light intensity distribution, the forbidden bandwidth of the n-type cladding layer may be set wider than that of the p-type cladding layer.

The emitted light intensity distribution can be shifted toward the p side by. setting the forbidden bandwidth of the n-type cladding layer wider than that of the p-type cladding layer. In this case, the forbidden bandwidth of the n-side optical guiding layer may be set wider than that of the p-side optical guiding layer, otherwise the thickness of the optical guiding layers may be set asymmetrically.

(4) According to the present invention, in the semiconductor laser using the nitride compound semiconductor, a single quantum well (SQW) structure is employed as the active layer, and an intermediate layer (i.e., electron blocking layer or overflow stop layer) which has an energy band gap wider than the active layer is provided between the active layer and the p-side optical guiding layer, and a displacement between the maximum position of the emitted light intensity distribution and the center position of the active layer due to the intermediate layer can be compensated by the n-side layer. The bandgap of the intermediate layer is wider than that of the active layer and optical guiding layer.

If the intermediate layer which having the wide energy band gap is provided between the active layer and the p-side optical guiding layer to prevent the overflow of electrons, the maximum .position of the emitted light intensity distribution is displaced toward the n side from the center position of the active layer due to the intermediate layer. However, such displacement can be compensated by making the energy band gap of the n-side layer wider, and also the maximum position of the emitted light intensity distribution can be equal substantially to the center position of the active layer.

In this event, it is preferable that the n-side layer should be composed at least of the n-side optical guiding layer and that the forbidden bandwidth of the n-side optical guiding layer should be set wider than that of the p-side optical guiding layer.

Likewise, if the forbidden bandwidth of the n-side optical guiding layer should be set wider than that of the p-side optical guiding layer, the emitted light intensity distribution can be moved toward the p side and accordingly the maximum position of the emitted light intensity distribution can coincide substantially with the center position of the active layer.

Also, it is preferable that the n-side layer should be composed at least of the n-side optical guiding layer and that the thickness of the n-side optical guiding layer should be set thinner than that of the p-side optical guiding layer.

In this manner, if asymmetry is introduced by setting the thickness of the n-side optical guiding layer thinner than that of the p-side optical guiding layer, the emitted light intensity distribution can be shifted toward the p side and therefore the maximum position of the emitted light intensity distribution can substantially coincide with the center position of the active layer.

In this case, it is preferable that the n-side layer should be composed at least of the n-type cladding layer and that the forbidden bandwidth of the n-type cladding layer should be set wider than that of the p-type cladding layer.

In this fashion, the emitted light intensity distribution can be shifted toward the p side by setting the forbidden bandwidth of the n-type cladding layer wider than that of the p-type cladding layer and thus the maximum position of the emitted light intensity distribution can substantially coincide with the center position of the active layer. In this case, the forbidden bandwidth of the n-side optical guiding layer may be set wider than that of the p-aide optical guiding layer, otherwise the thickness of the optical guiding layers may be set asymmetrically.

Further, it is preferable that the well layer constituting the active layer in the above quantum well structure should be formed of $Al_xGa_yIn_{1-x-y}N$ (where $0 \leq x < 1$, $0 < y \leq 1$).

It is preferable that, as the well layer constituting the active layer in the above quantum well structure in the short wavelength semiconductor laser, the nitride compound semiconductor such as GaN, InGaN, AlGaN, AlInGaN, or the like, i.e., $Al_xGa_yIn_{1-x-y}N$ (where $0 \leq x < 1$, $0 < y \leq 1$) shouldbe employed.

(5) According to the present invention, in the semiconductor laser using the nitride compound semiconductor, the p-side optical guiding layer is composed of either InGaN or GaN and the impurity concentration of the p-side optical guiding layer is set to below $1 \times 10^{17}$ atoms/cm$^3$.

In this way, in case the p-side optical guiding layer (low impurity concentration layer) made of InGaN or GaN whose impurity concentration of the p-side optical guiding layer is set to below $1 \times 10^{17}$ atoms/cm$^3$ is employed, the hole mobility in the p-side optical guiding layer can be enhanced and also the hole injection efficiency can be improved. In addition, since the crystal quality of the optical guiding layer can be improved by reducing the impurity concentration of the optical guiding layer, non-radiative recombination can be reduced. As a result, the threshold current density $J_{th}$ can be made low.

In this case, it is preferable that the p-side optical guiding layer should be composed of the undoped layer, Moreover, it is preferable that the hole mobility in the p-side optical guiding layer should be set in excess of 2 cm$^2$/V·s.

As described above, when the hole mobility in the low impurity concentration layer (p-side optical guiding layer) becomes higher, holes can be injected more effectively, and the hole mobility of more than 2 cm$^2$/V·s which is considered at present to enable the laser oscillation is needed.

(6) According to the present invention, in the semiconductor laser using the nitride compound semiconductor, the thickness of the p-side optical guiding layer is set thinner than that of the n-side optical guiding layer.

Like this, non-radiative recombination in the p-side optical guiding layer can be reduced by setting the thickness of the p-side optical guiding layer thinner than that of the n-side optical guiding layer. As a result, the semiconductor laser having the low threshold current density $J_{th}$ can be constructed.

Also, according to the present invention, in the semiconductor laser using the nitride compound semiconductor, the thickness of the paide optical guiding layer is set to below 0.1 $\mu$m.

In this way, if the thickness of the p-side optical guiding layer is set to below 0.1 $\mu$m, more preferably less than 0.08 $\mu$m (80 nm), non-radiative recombination in the p-side optical guiding layer can be reduced effectively.

It is preferable that the forbidden bandwidth (energy band gap) of the p-side optical guiding layer should be set wider than that of the n-side optical guiding layer.

Like the above, overflow of the electrons into the p-side optical guiding layer side can be prevented by setting the forbidden bandwidth of the p-side optical guiding layer wider than that of the n-side optical guiding layer.

(7) According to the present invention, in the semiconductor laser using the nitride compound semiconductor, composition of the p-side optical guiding layer is selected such that the forbidden bandwidth is made small in a region adjacent to the active layer and also the forbidden bandwidth is made large in a region adjacent to the p-type cladding layer.

If such p-side optical guiding layer is emloyed, overflow of the electron into the p-side cladding layer can be prevented while holding the sufficient optical confinement.

Either continuous (graded) change or step-like change may be adopted as the change of the forbidden bandwidth in the p-side optical guiding layer. The step-like change may be obtained by the multi-layered structure, e.g., two-layered structure and forth.

(8) According to the present invention, in the semiconductor laser using the nitride compound semiconductor, a structure in which the forbidden bandwidth (energy band gap) of the p-type optical guiding layer is made continuously smaller from the side being adjacent to the active layer toward the side being adjacent to the p-type cladding layer is employed.

In this manner, if the p-side optical guiding layer in which the forbidden bandwidth of the p-type optical guiding layer is reduced continuously smaller from the side being adjacent to the active layer toward the side being adjacent to the p-type cladding layer, i.e., the p-side inversely graded optical guiding layer, no energy spike serving as the bar for the hole injection is generated and as a result overflow of the electron can be prevented while keeping the enough hole injection.

In this case, the narrow forbidden bandwidth layer constituting the p-side optical guiding layer is formed of InGaN or GaN and the wide forbidden bandwidth layer is formed of AMGaN.

As above, it is desired that, in order to prevent overflow of the electron effectively, AlGaN should be employed as the wide forbidden bandwidth layer because ΔEc/ΔEg on a GaN/AlGaN interface or an InGaN/AlGaN interface is large.

The ΔEc is a energy discontinuity of the conduction band and the ΔEg is a difference in band gap.

(9) According to the present invention, in the semiconductor laser using the nitride compound semiconductor, the photoluminescence wavelength distribution in the active layer in the resonator is set to less than 90 meV.

Like this, in the short wavelength semiconductor laser, it is preferable that the photoluminescence wavelength distribution in the active layer in the resonator must be set to less than 90 mev to suppress the multi-wavelength oscillation, and more preferably it should be set to less than 50 meV.

It is preferable that the photoluminescence wavelength distribution in the active layer in the resonator should be set to less than 50 meV.

(10) According to the present invention, in the semiconductor light emitting device using the nitride compound semiconductor, the dislocation density in the active layer in the resonator is set to less than $1 \times 10^9$ cm$^{-2}$.

In the prior art, the dislocation density in the short wavelength semiconductor laser is on the order of $10^9$ cm$^{-2}$, i.e., $1 \times 10^9$ cm$^{-2}$ to $1 \times 10^{10}$ cm$^{-2}$. The magnitude or level of unevenness of the PL (photoluminescence) peak wavelength coincides with the dislocation interval.

Therefore, in the present invention, the dislocation density in the active layer in the resonator is set to less than $1 \times 10^9$ cm$^{-2}$, preferably less than $1 \times 10^8$ cm$^{-2}$ and more preferably less than $1 \times 10^7$ cm$^{-2}$, by reducing the dislocation density in the active layer in the resonator to then reduce the PL peak wavelength distribution.

More particularly, in the short wavelength semiconductor laser in the prior art, since the sapphire whose lattice mismatching is very large such as about 13% has been employed as the growth substrate, the dislocation density in the active layer in the resonator has been about $1 \times 10^{10}$ cm$^{-2}$. Nevertheless, in the nitride compound semiconductor, it has been said that the dislocation has no influence upon the device characteristics since dislocation does not form the non-radiative center. For this reason, regardless of the dislocation density, development of the devices employing the nitride compound semiconductor have been proceeded.

However, the dislocation density and the uneven composition have a correlation. The uneven composition decreases when the dislocation density is reduced. By employing the SiC (silicon carbide) substrate, the lattice mismatching can be significantly reduced like 3%, As a result, the dislocation density in the active layer can be reduced less than $1 \times 10^{10}$ cm$^{-2}$, and reduced at least on the order of $10^7$ cm$^{-2}$. For the above reason, the short wavelength semiconductor light emitting device in which the multi-wavelength oscillation is suppressed can be practically implemented.

It is preferable that the dislocation density in the active layer in the resonator should be set to less than $1 \times 10^8$ cm$^{-2}$.

Also, it is preferable that In should be contained in the active layer as a constituent element.

In this fashion, if the semiconductor in which In should be contained as a constituent element is employed as the active layer, especially if InGaN whose in composition ratio is relatively high Is employed, an active layer having excellent crystal quality, which is suited for a blue-light emitting device, especially a blue-light emitting semiconductor laser, can be implemented by satisfying the above conditions of the luminescence wavelength and the dislocation density.

(11) According to the present invention, in the semiconductor laser using the nitride compound semiconductor, the growth rate used in growing the active layer is set to more than 0.1 μm/hour.

In the nitride compound semiconductor, if the growth rate used in growing the active layer is set to less than 0.1 μm/hour, the PL wavelength distribution, i.e., a PL peak wavelength distribution becomes large. Under a growth rate for the active layer of 0.075 μm/hour, the PL peak wavelength distribution increases, especially when In composition of InGaN increases. Consequently, the laser oscilatiqn becomes impossible Accordingly, since the PL peak wavelength distribution can be reduced less than 90 meV by employing the growth rate of more than 0.1 μm/hour, the semiconductor laser in which the multi-wavelength oscillation is suppressed can be fabricated with good reproducibility and the blue-light emitting device which has a narrow half width and a high impurity as an LED can be practically implemented.

It is preferable that the growth rate should be set to more than 0.2 μm/hour.

In this way, if the growth rate is increased, the PL peak wavelength distribution can be made narrower, so that suppression of the multi-wavelength oscillation can be made easy.

It is preferable that the growth rate should be set to more than 0.3 μm/hour especially.

As above, in case the growth rate is set to more than 0.3 μm/hour, when the InGaN having the relatively large In composition ratio which is suitable for the blue-light emitting device is to be grown, the increase of the PL peak wavelength distribution does not occur and the active layer which has the narrow PL peak wavelength distribution of less than 90 meV, for example, can be grown with good reproducibility and the active layer which has high PL light intensity and good crystal quality can be grown.

It is preferable that the SiC substrate should be employed as the substrate and a surface of the SiC substrate should be etched.

In other words, since distribution of photoluminescence wavelength (i e., dislocation density of the active layer) caused by uneven composition depends upon surface defect density of the substrate, the active layer with the small dislocation density can be grown with reproducibility by removing the surface defect by means of etching, especially dry etching of the surface even if the SiC substrate is employed.

It is preferable that In should be contained in the active layer formed over the substrate as a constituent element.

In other words, the manufacturing method of the present invention is especially effective for the semiconductor light emitting device having the active layer in which In is contained as the constituent element.

(12) According to the present invention, in the semiconductor laser using the nitride compound semiconductor, the p-type cladding layer is composed of a multi-layered structure in which an intermediate layer having a narrow forbidden bandwidth is put between two p-type semiconductor layers each having a wide rorbidden bandwidth.

By putting the intermediate layer with narrow band gap into the p-cladding layer, electrons in the p-cladding layer due to the overflow are trapped in the intermediate layer, and recombine radiatively. Since radiative recombination does not generate heat, as this emits energy as light, the positive feedback of overflow and heat generation is supressed. Consequently, the threshold current density for laser oscillation can be reduced.

It is preferable that the intermediate layer 6 is composed of a single layer having a narrow forbidden bandwidth.

Such intermediate layer may be composed of the single layer having a narrow forbidden bandwidth. In this case, it is desired that p-type impurity should be doped into the layer to reduce resistance of the p-type cladding layer.

Also, it is preferable that the forbidden bandwidth should be changed continuously in the intermediate layer such that the lowest forbidden bandwidth is given at any position between two p-type semiconductor layers each having a wide forbidden bandwidth.

In this way, if composition of material of the intermediate layer is changed to have a substantially U-shaped forbidden bandwidth distribution, hole injection into the p-side optical guiding layer can be made smooth.

It is preferable that the intermediate layer is composed of the multi-layered structure in which a plurality of wide forbidden bandwidth layers and narrow forbidden bandwidth layers are laminated alternatively.

Like the above, the intermediate layer may be composed of the multi-layered structure. In this case, crystal quality can be improved by using undoped narrow forbidden bandwidth layers, so that radiative recombination probability in the narrow forbidden bandwidth layers can be enhanced.

Also, in this case, it is preferable that the forbidden bandwidth located between the wide forbidden bandwidth layers and the narrow forbidden bandwidth layers constituting the intermediate layer should be changed continuously.

In this manner, the holes can be injected into the p-side optical guiding layer smoothly by changing the forbidden bandwidth located between the wide forbidden bandwidth layers and the narrow forbidden bandwidth layers constituting the intermediate layer continuously.

It is preferable that at least a part of the narrow forbidden bandwidth layers in the intermediate layer should be formed as an undoped layer.

In this fashion, if at least a part of the narrow forbidden bandwidth layers in the intermediate layer is formed as an undoped layer, the crystal quality can be improved and also the radiative recombination probability can be enhanced.

It is preferable that, in the p-type semiconductor layer or the intermediate layer, the wide forbidden bandwidth layers should be formed of AlGaN and the narrow forbidden bandwidth layers should be formed of InGaN, GaN, or AlGaN.

(13) According to the present invention, in the multi-quantum well structure semiconductor laser using the nitride compound semiconductor, the thickness of the barrier layer constituting the multi-quantum well active layer is set to below 5 nm.

In the nitride compound semiconductor, since a penetration of the wave function from the well layer is small, the problem of reduction of the optical gain does not become so serious even if the thickness of the barrier layer constituting the multi-quantum well active layer is made thin. Therefore, the characteristics of the multi-quantum well structure semiconductor laser can be improved if inhomogeneous carrier injection among wells is improved by setting the thickness of the barrier layer constituting the multi-quantum well active layer to below 5 nm.

In this case, it is preferable that the barrier layer constituting the multi-quantum well active layer is formed of InGaN having the In composition ratio of more than 0.04 As the composition ratio of In in InGaN is larger, the energy bandgap of the InGaN is smaller, and the strain of the barrier layer made of the InGaN is larger. The strain of the barrier layer having the composition ratio set more than 0.04 can be smaller than the critical strain value by thinning the thickness of the barrier layer. The carriers inject to the wells of the multi-quantum well structure efficiently in such the composition ratio of In over 0.04.

(14) According to the present invention, in the semiconductor laser using the nitride compound semiconductor, an impurity concentration of the electron blocking layer provided on the p side of the active layer is set to below $1.0 \times 10^{17}$.

In this case, it is preferable that the electron blocking layer provided on the p side of the active layer is formed of the undoped layer.

If the electron blocking layer provided on the p side of the active layer is formed of the layer in which the impurity concentration is below $1.0 \times 10^{17}$ atoms/cm$^3$, especially, the undoped layer, the holes are not scattered by the impurity. Therefore, the effective hole mobility can be improved, the hole injection efficiency can be improved, and the applied voltage can be lowered.

(15) According to the present invention, in the semiconductor laser using the nitride compound semiconductor, a atructure in which the forbidden bandwidth in the p-side region of the electron blocking layer adjacent to the p side relative to the active layer is changed gradually is employed.

In this manner, the electron affinity between the electron blocking layer and the p-aide layer (i.e., the p-side optical guiding layer or. the p-side cladding layer) can be changed gradually by changing the forbidden bandwidth gradually in the p-side region of the electron blocking layer. As a result, generation of notches which act as potential barriers on an interface between the electron blocking layer and the p-side layer can be suppressed. If generation of the notches can be suppressed, the hole injection efficiency can be improved and the applied voltage can be made small. Both the continuous change and the step-like change are included in the change of the forbidden bandwidth.

Also, according to the present invention, in the semiconductor laser using the nitride compound semiconductor, the forbidden bandwidth in the n-side region of the electron blocking layer adjacent to the p side of the active layer, which is close to the active layer, is changed gradually.

In this manner, the electron affinity between the electron blocking layer and the active layer can be changed gradually by changing. the forbidden bandwidth gradually in the n-side region of the electron blocking layer. As a result, since generation of notches which act as potential barriers on an interface between the electron blocking layer and the active layer can be suppressed, the hole injection efficiency can be improved and the applied voltage V can be made small. Both the continuous change and the step-like change are included in the change of the forbidden bandwidth.

In the present invention, in the semiconductor laser using the nitride compound semiconductor, both forbidden bandwidths in the n-side region and the p-side region of the electron blocking layer adjacent to the p side of the active layer are changed gradually.

In this way, the electron affinity between the electron locking layer and the active layer and the electron affinity etween the electron blocking layer and the p-side layer can be changed gradually by changing the forbidden bandwidths gradually in the n-side region and the p-side region of the electron blocking layer respectively. As a result, since generation of notches which act as potential barriers on both interfaces can be suppressed, the hole injection efficiency can be improved and also the applied voltage V can be reduced.

(16) According to the present invention, in the semiconductor laser using the nitride compound semiconductor, a Mg concentration in the electron blocking layer provided in the p-side region of the active layer is set to more than $7 \times 10^{19}$ atoms/cm$^3$.

Like the above, by setting the Mg concentration in the electron blocking layer provided in the p-side region of the active layer to more than $7 \times 10^{19}$ atoms/cm$^3$, overflow of the carrier can be suppressed effectively based on evaluation of the emission spectrum.

The reason, though not made fully clear, may be supposed like that impurity level is formed at high density in the valence band side of the electron blocking layer and then, since the holes are injected into the active layer via the impurity conduction (or hopping conduction) or the tunnel conduction through the impurity-level concentration is so high that holes are injected into the active layer via the impurity levels by hopping conduction or tunneling conduction. As a result, the hole injection efficiency is improved.

(17) According to the present invention, in the method of manufacturing the semiconductor laser using the nitride compound semiconductor, a growth temperature of the electron blocking layer adjacent to the p side of the active layer is set to 600 to 900° C.

In this case, it is preferable that the growth temperature of the electron blocking layer is set to be identical to that of the active layer.

Like this, if the growth temperature of the electron blocking layer is set to 600 to 900° C. which is lower than around 1100° C. of the growth temperature in the prior art and is identical to that of the active layer, luminescence intensity in the active layer can be enhanced and also light emission in the p-side optical guiding layer can be reduced.

If magnesium (Mg) is doped in the electron blocking layer, it is preferable that Mg should be doped such that the concentration exceeds $7 \times 10^{19}$ atoms/cm$^3$.

The electron blocking layer having such Mg concentration and provided on the p side of the active layer can suppress the overflow of the carrier from the active layer effectively in an evaluation of emission spectrum.

BRIE DESCRIPTION OF THE DRAWINGS

Figure 27A:
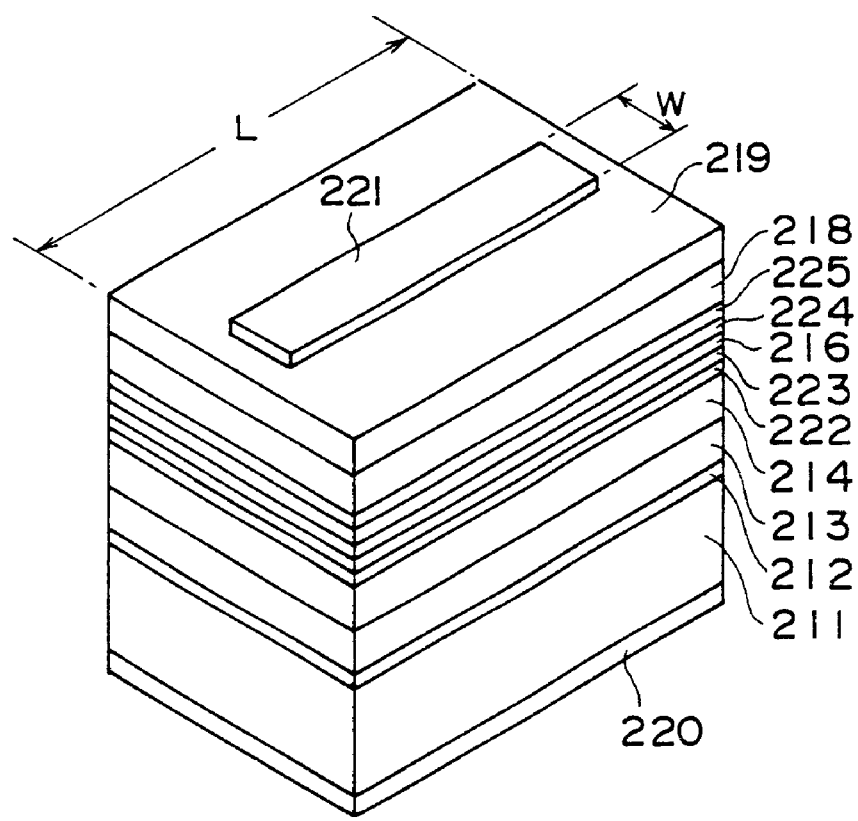
Figure 27B:
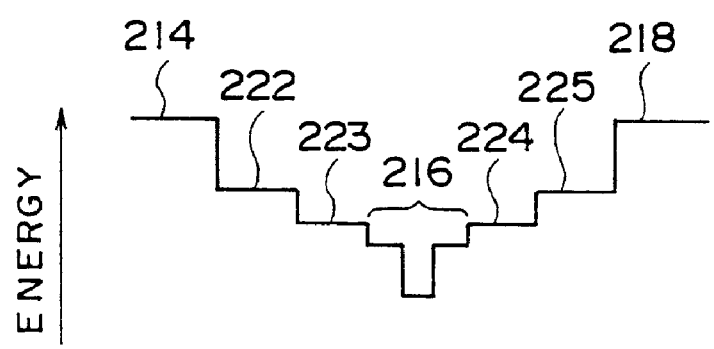
Figure 28A:
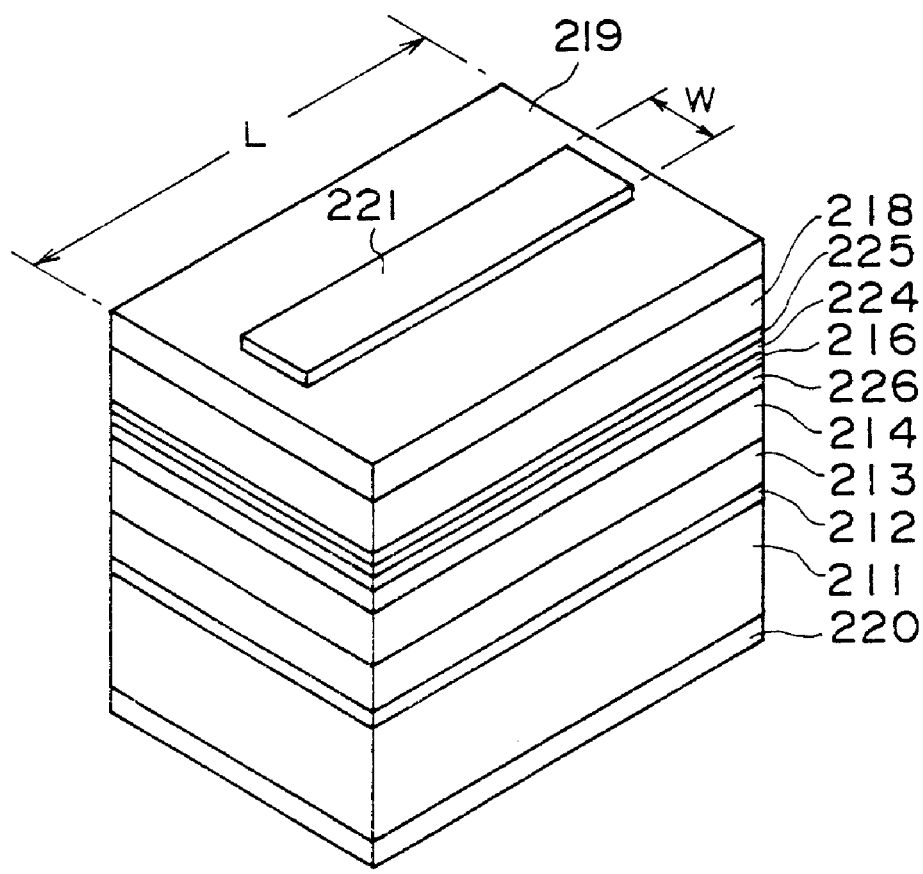
Figure 28B:
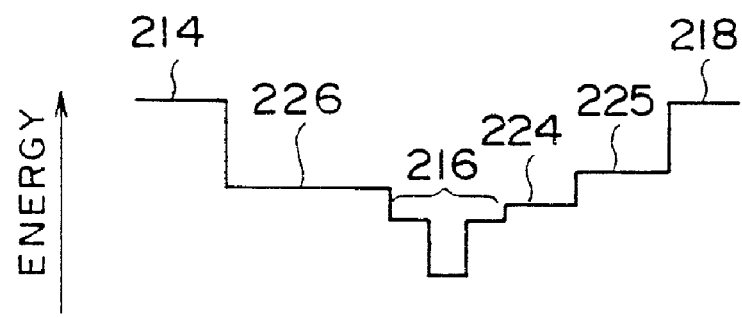
Figure 29A:
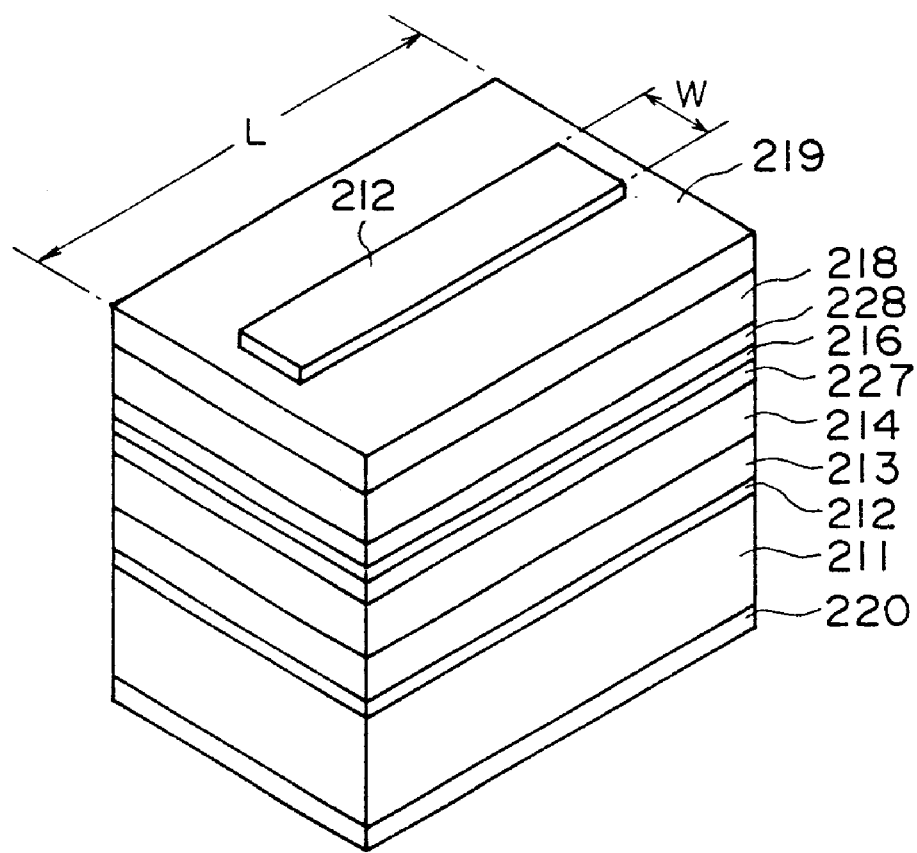
Figure 29B:
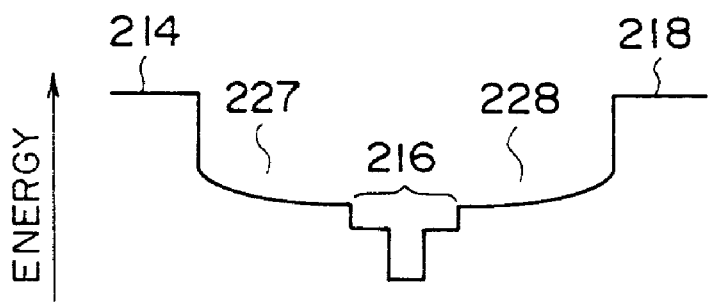
Figure 30A:
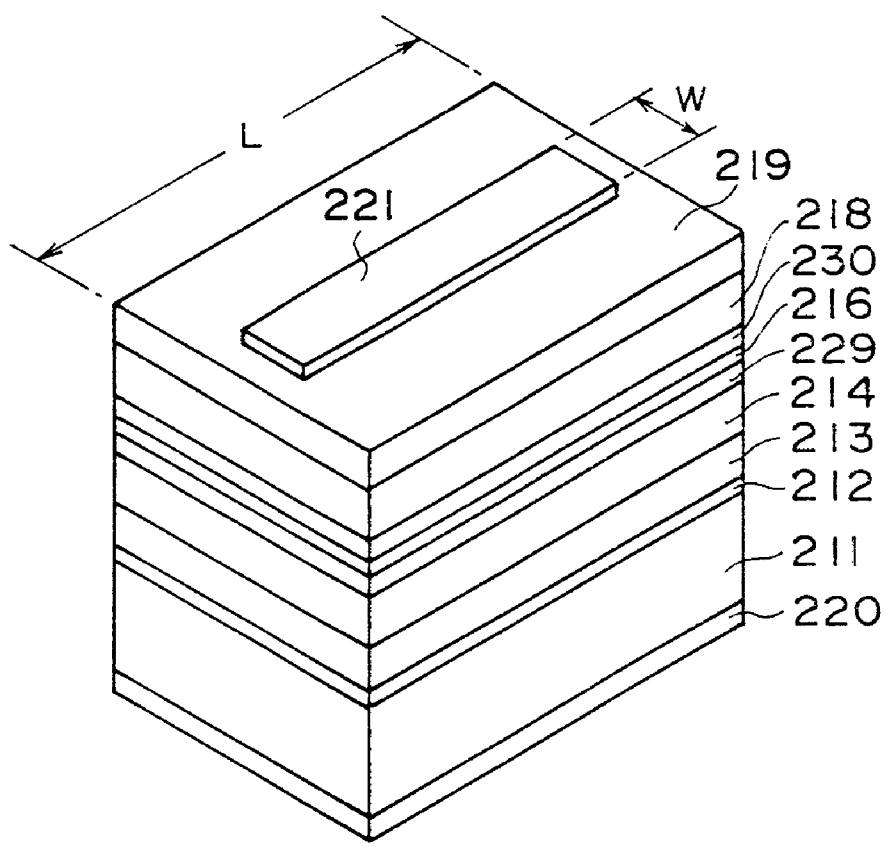
Figure 30B:
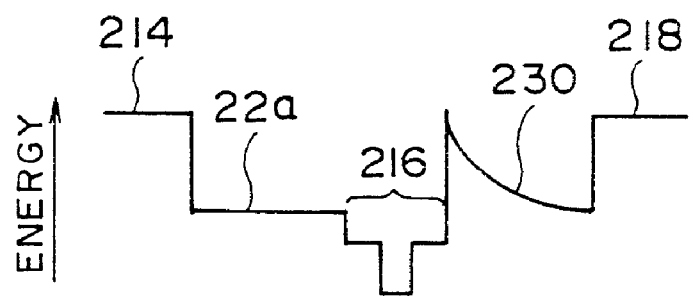
Figure 31:
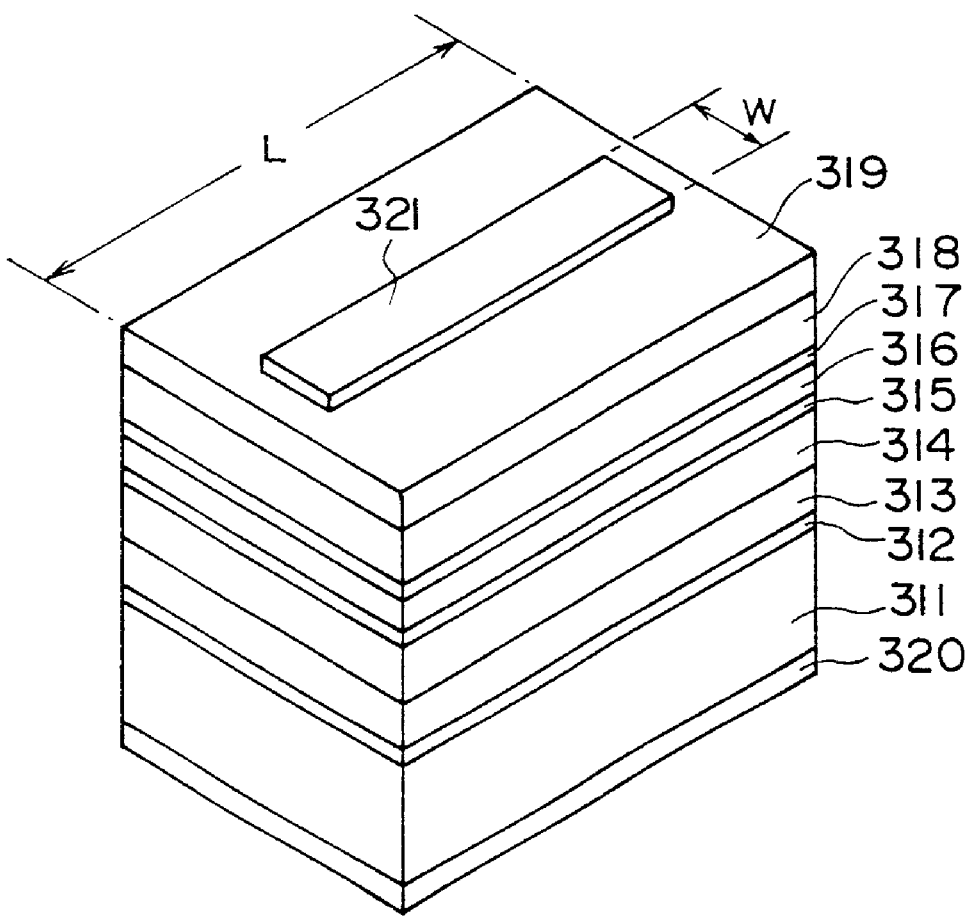
Figure 32A:
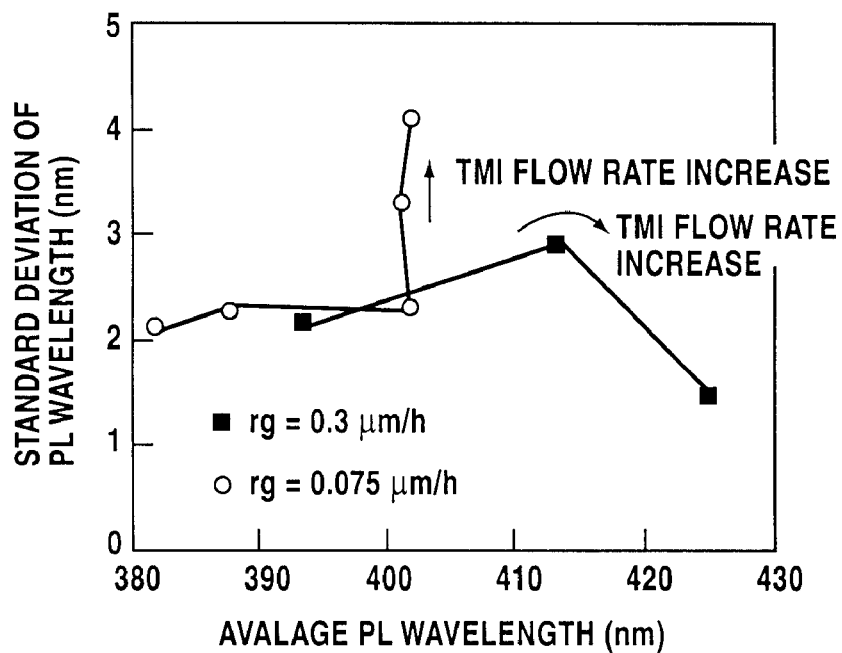
Figure 32B:
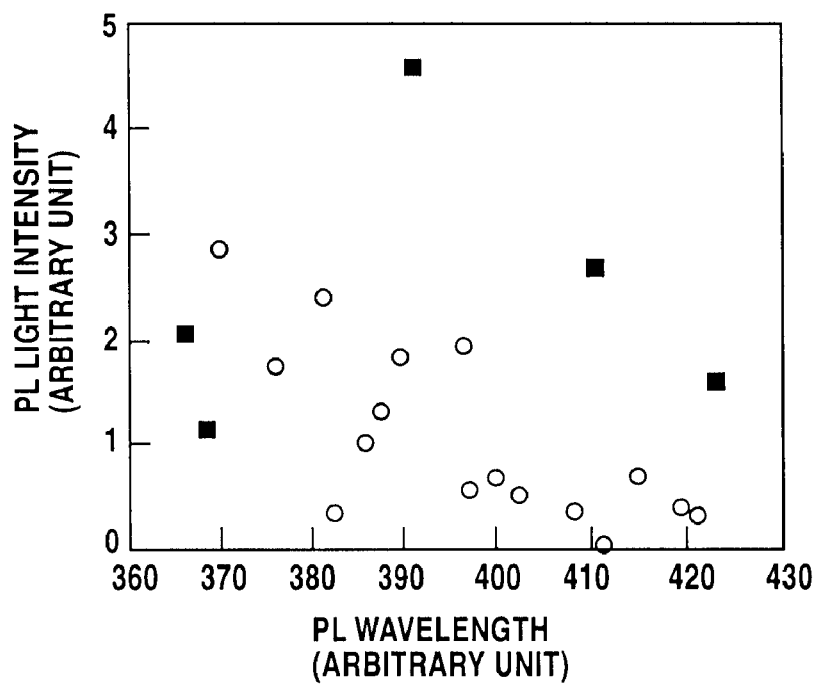
Figure 33A:
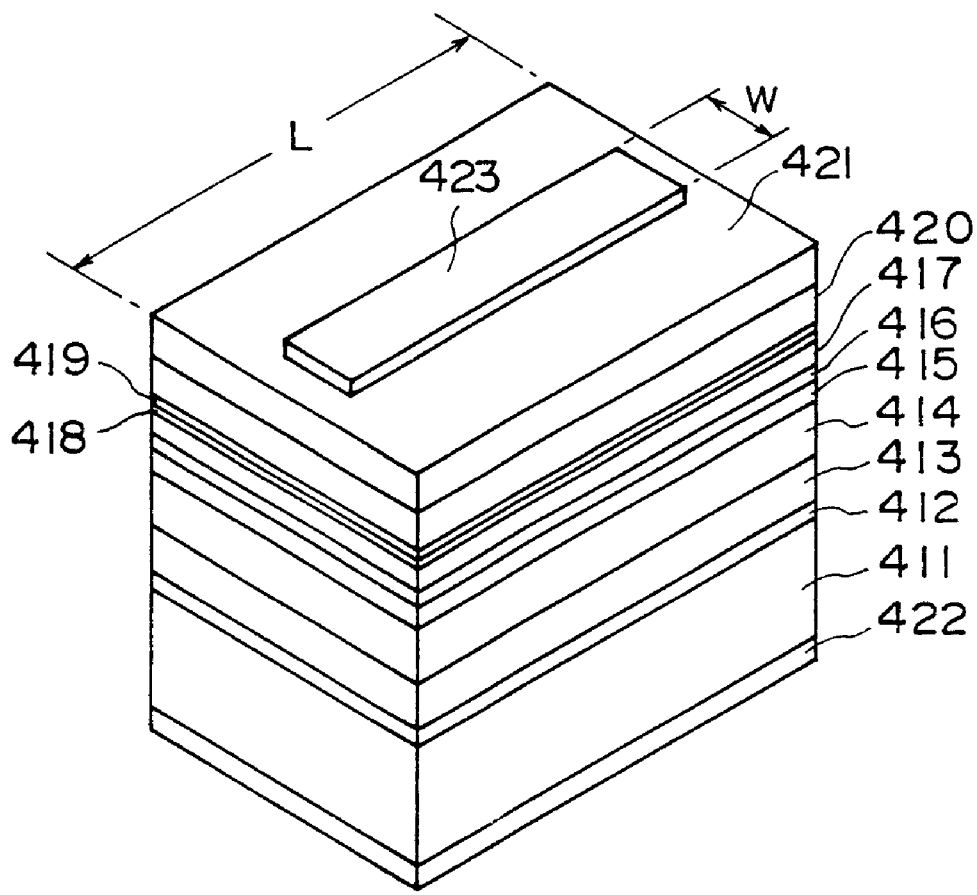
Figure 33B:
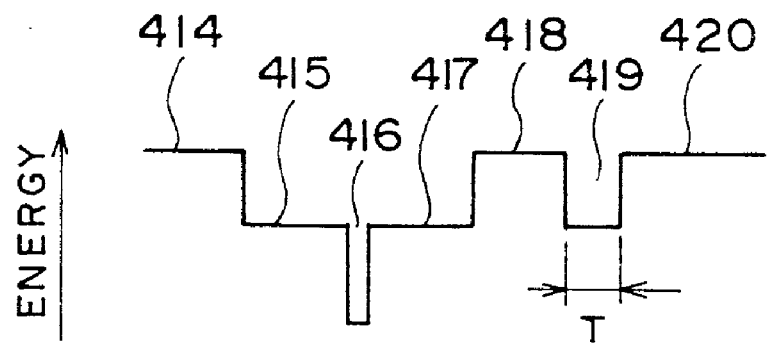
Figure 34A:
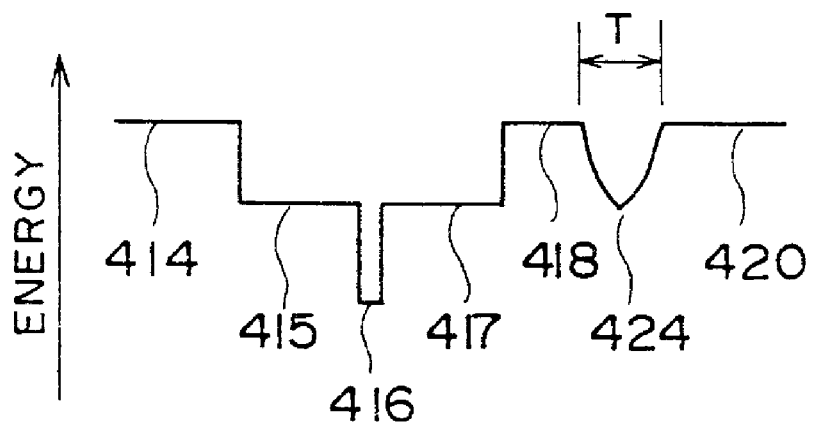
Figure 34B:
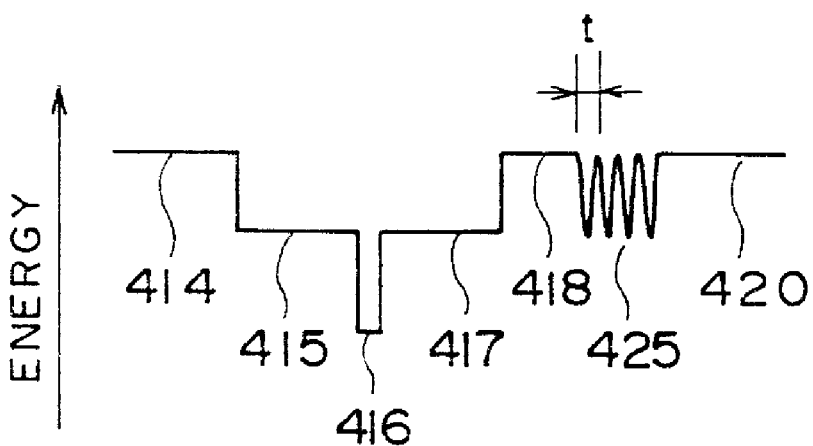
Figure 35A:
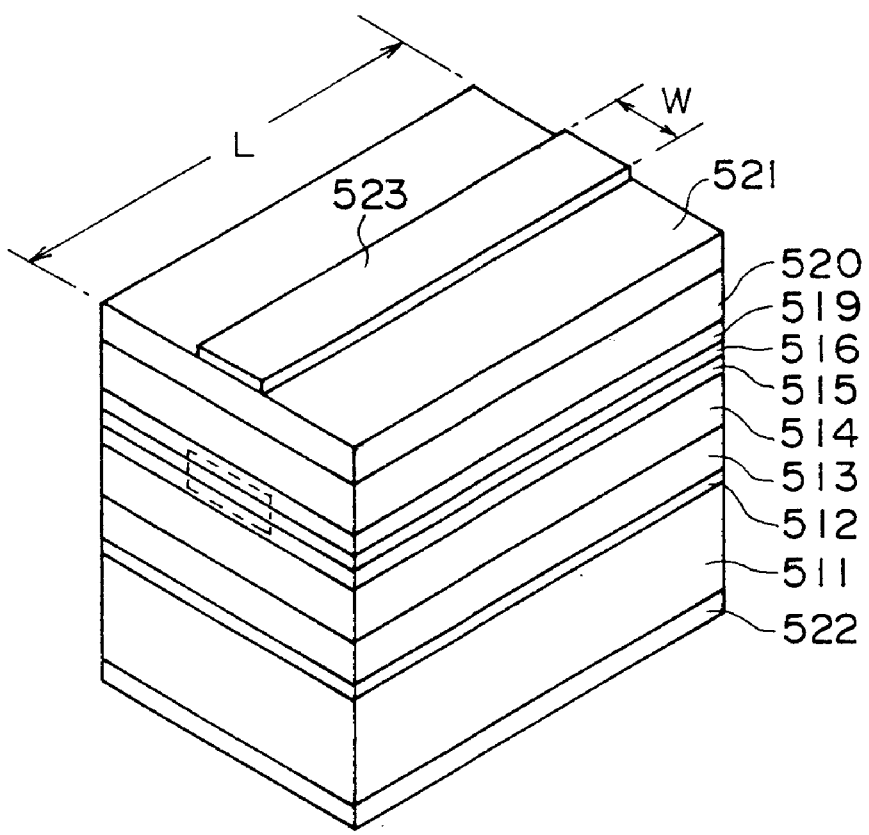
Figure 35B:
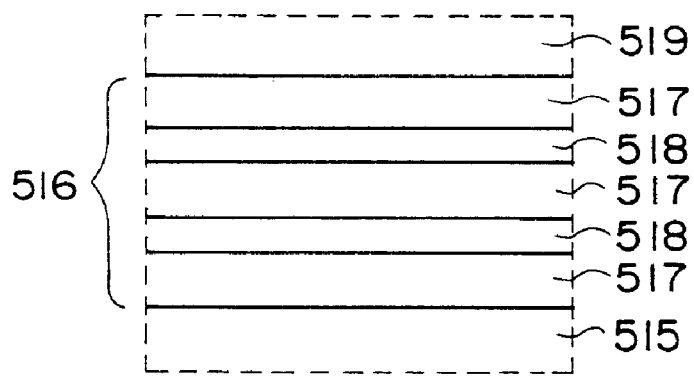
Figure 36:
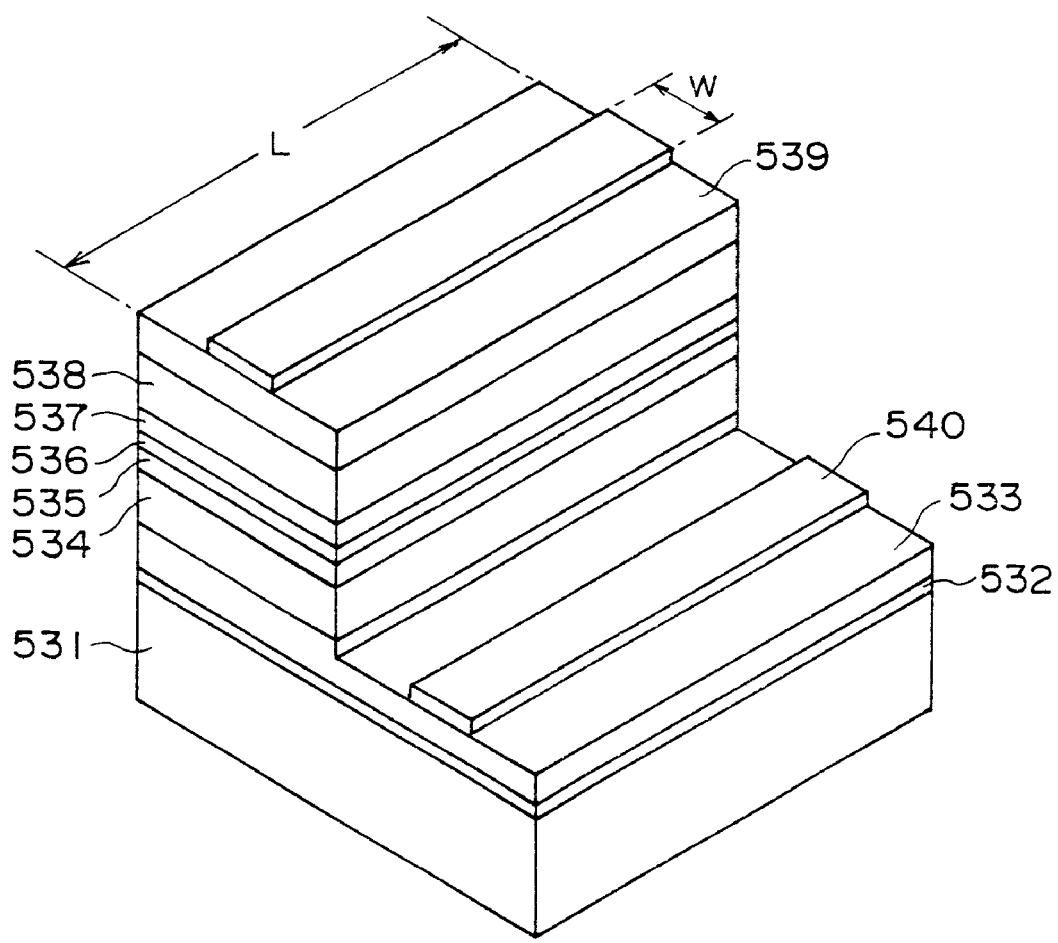
Figure 37:
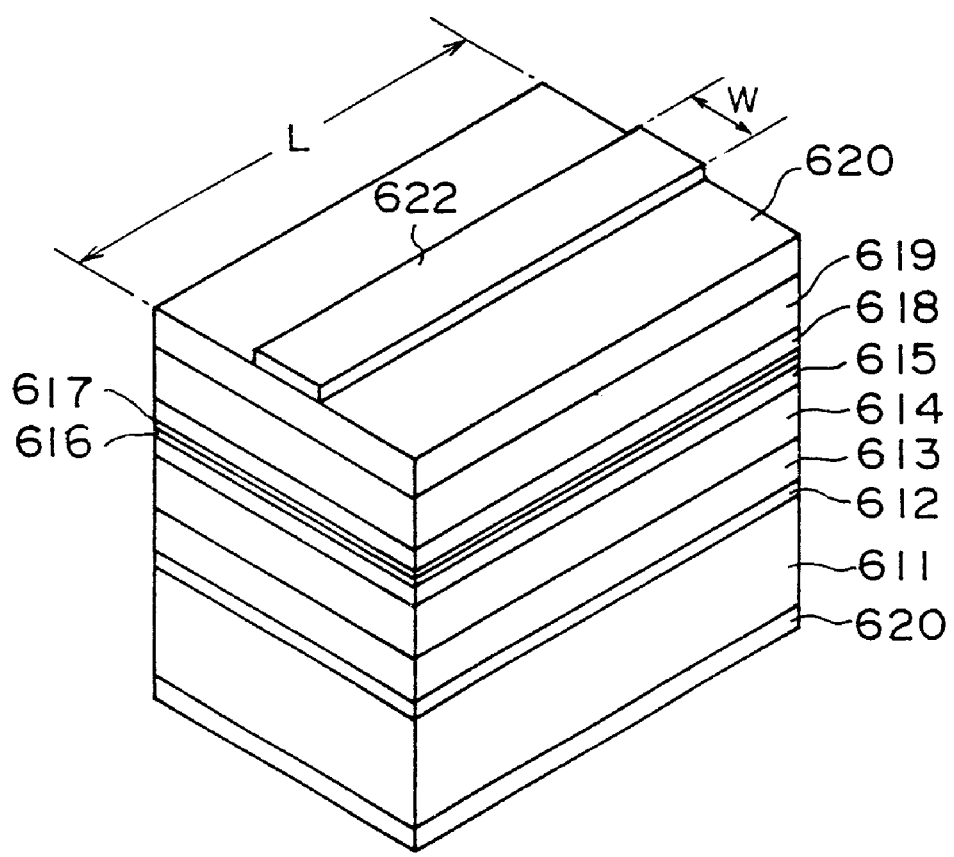
Figure 38A:
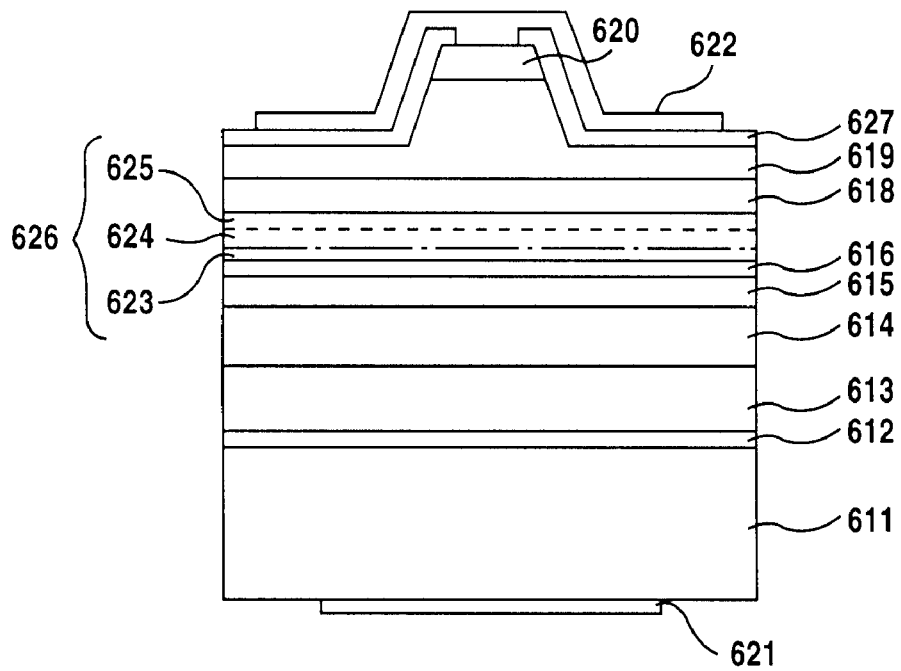
Figure 38B:
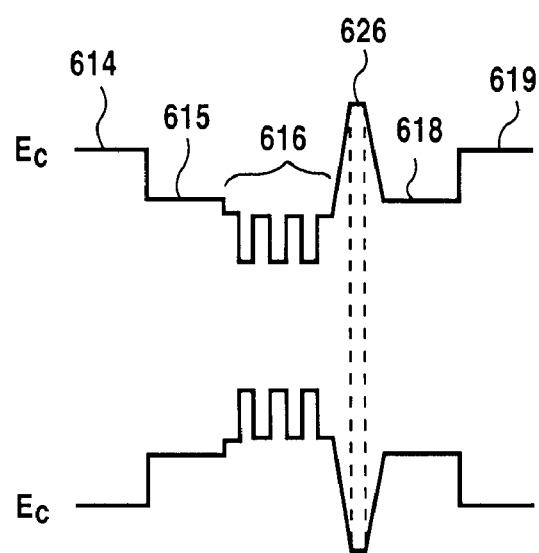
Figure 39:
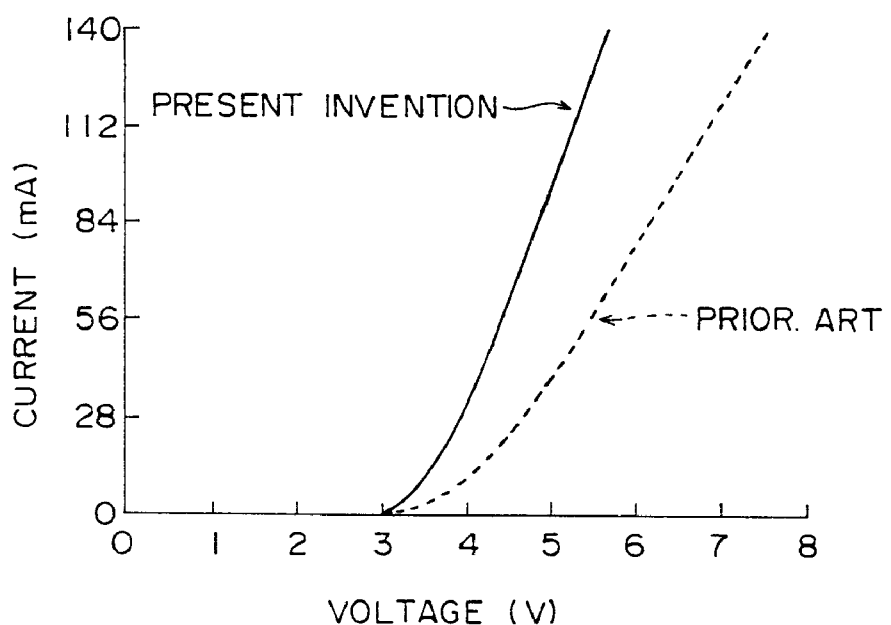
Figure 40:
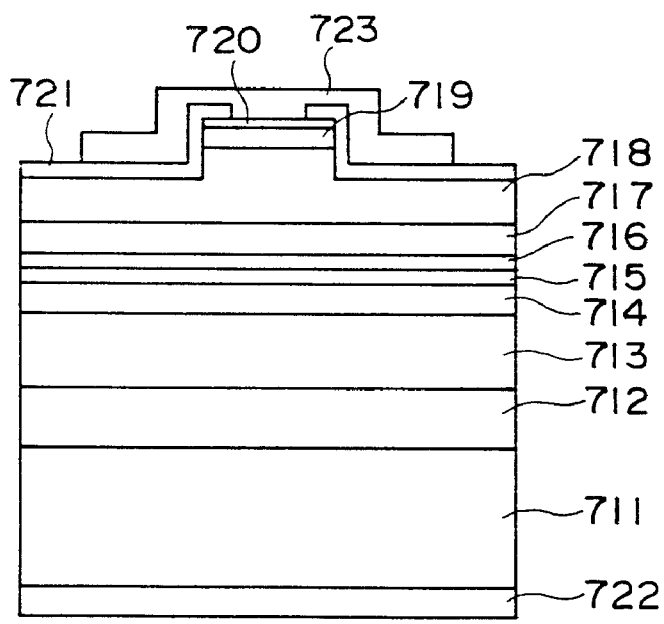
Figure 41:
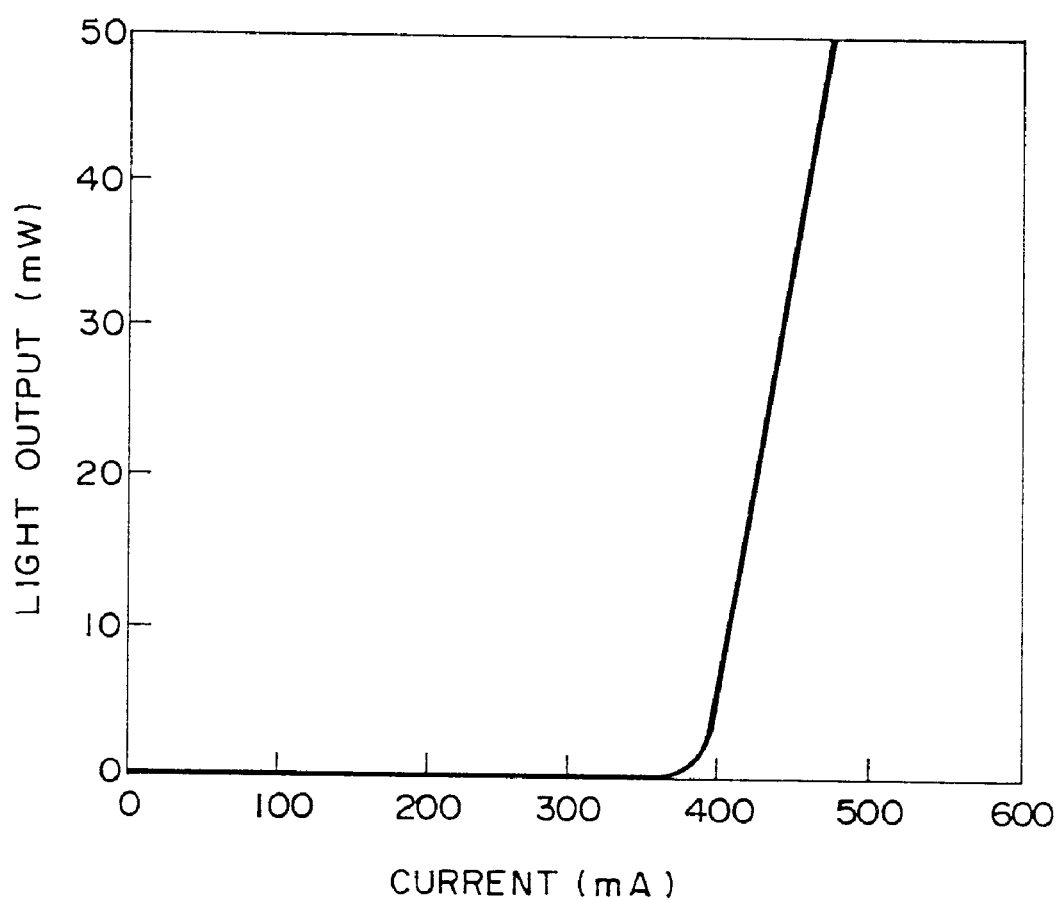
Figure 42A:
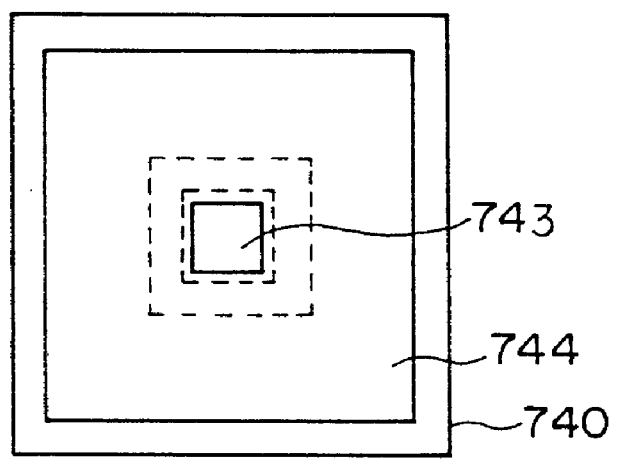
Figure 42B:
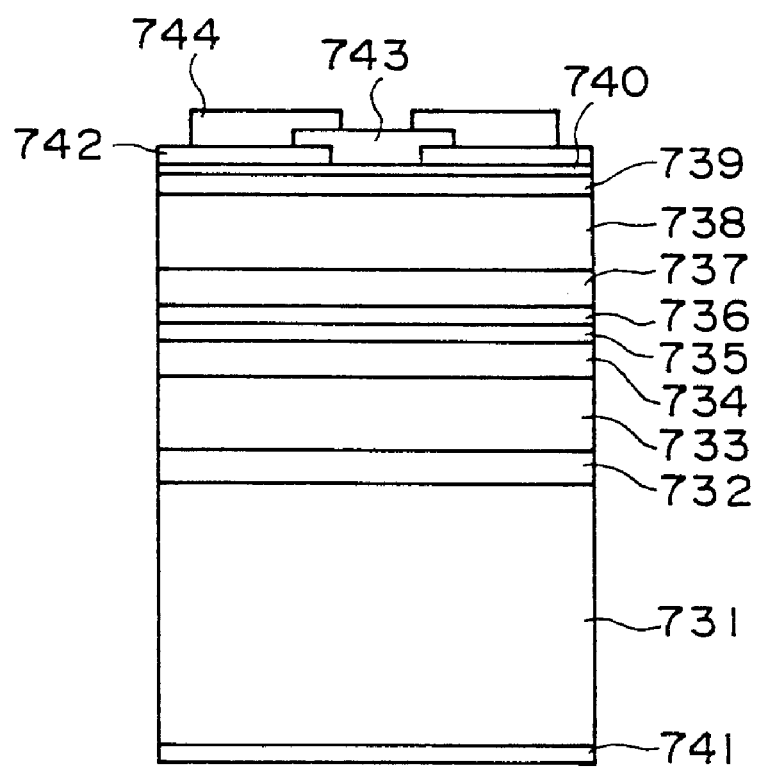
Figure 43:
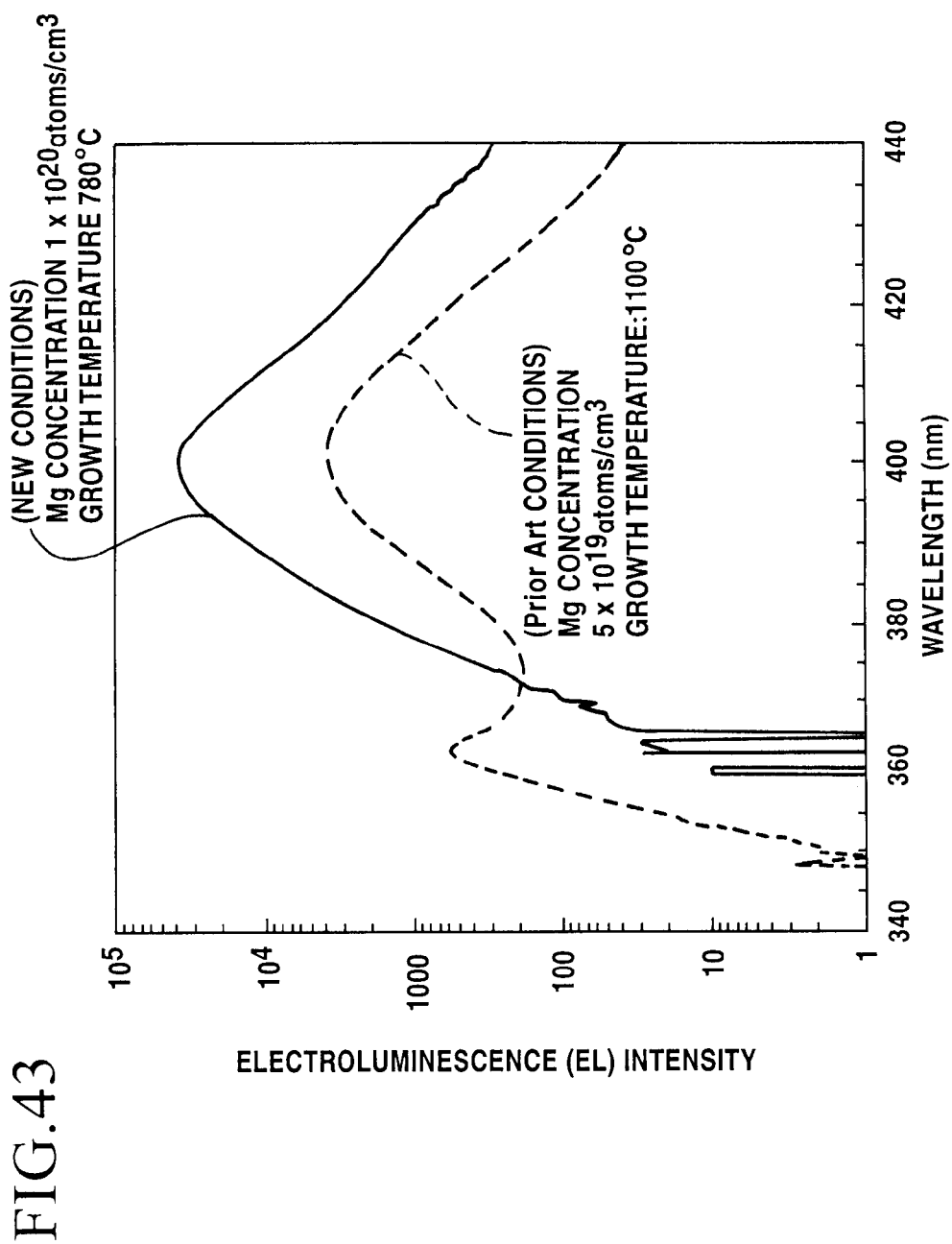
Figure 44A:
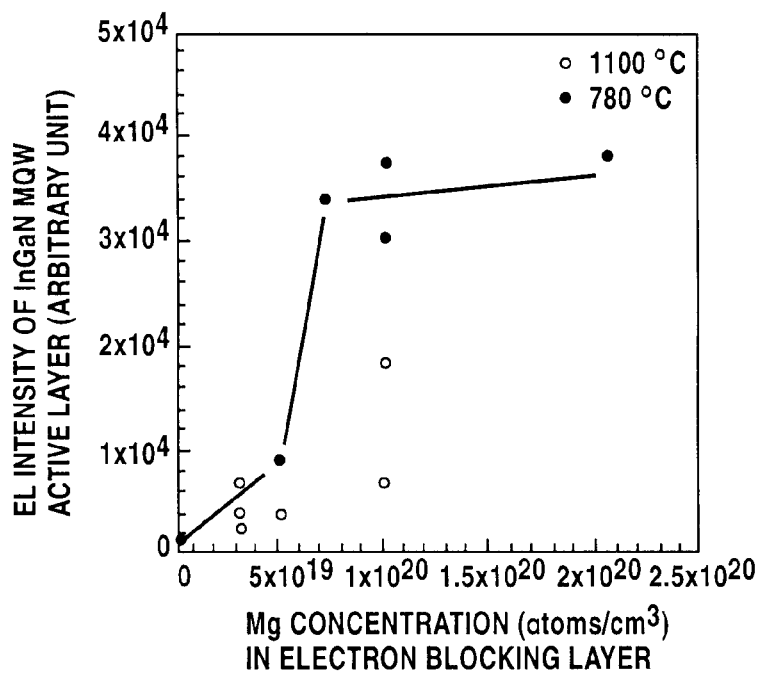
Figure 44B:
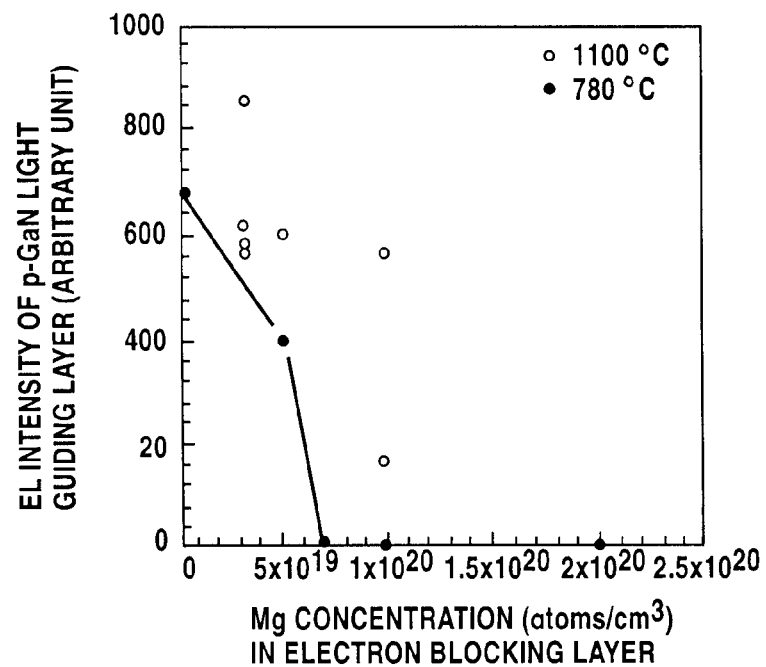
Figure 45:
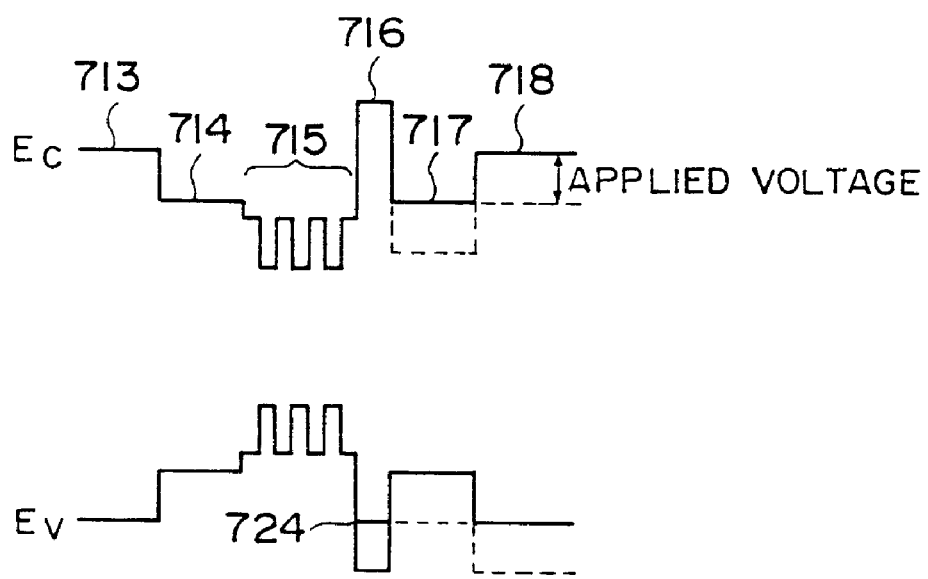
Figure 46A:
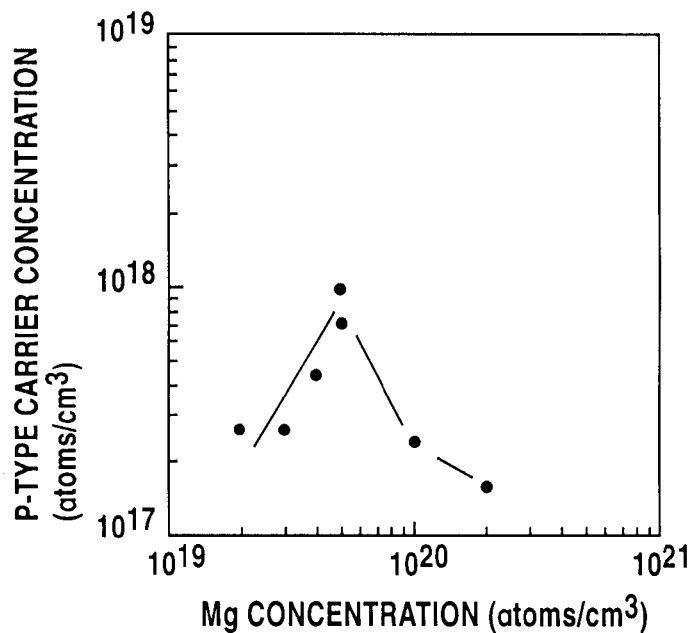
Figure 46B:
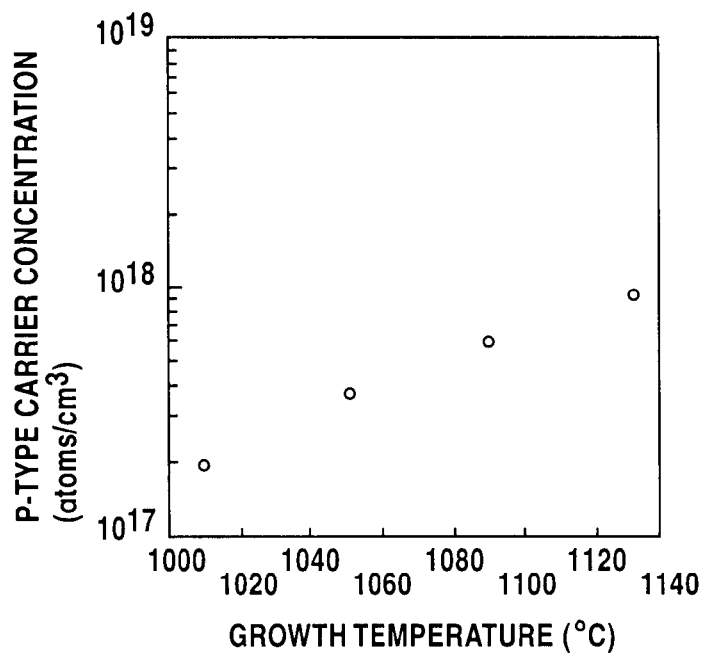

FIG. 27A in a perspective view showing an SQW semiconductor laser according to an eighth embodiment of the present invention, and FIG. 27B is a view showing an energy level on the conduction band edge of the SQW semiconductor laser in FIG. 27A;

FIG. 28A is a perspective view showing an SQW semiconductor laser according to a ninth embodiment of the present invention, and FIG. 28B is a view showing an energy level on the conduction band edge of the SQW semiconductor laser in FIG. 28A;

FIG. 29A is a perspective view showing an SQW semiconductor laser according to a tenth embodiment of the present invention, and FIG. 29B is a view showing an energy level on the conduction band edge of the SQW semiconductor laser in FIG. 29A;

FIG. 30A is a perspective view showing an SQW semiconductor laser according to an eleventh embodiment of the present invention, and FIG. 30B is a view showing an energy level on the conduction band edge of the SQW semiconductor laser in FIG. 30A;

FIG. 31 is a perspective view showing a short wavelength semiconductor laser according to a twelfth embodiment of the present invention;

FIGS. 32A and 32B are views illustrating dependence of a PL peak wavelength distribution and a PL light intensity on a growth rate in the twelfth embodiment of the present invention respectively;

FIG. 33A is a perspective view showing an SQW semiconductor laser according to a thirteenth embodiment of the present invention, and FIG. 33B is a view showing an energy level on the conduction band edge or the SQW semiconductor laser in FIG. 33A;

FIGS. 34A and 34B are views showing an energy level on the conduction band edge of an SQW semiconductor laser according to fourteenth and fifteenth embodiments of the present invention respectively;

FIG. 35A is a perspective view showing an MQW semiconductor laser according to a sixteenth embodiment of the present invention, and FIG. 35B is an enlarged view showing a layer structure of the MQW semiconductor laser in FIG. 35A;

FIG. 36 is a perspective view showing an MQW semiconductor laser according to a seventeenth embodiment of the present invention;

FIG. 37 is a perspective view showing an MQW semiconductor laser according to an eighteenth Embodiment of the present invention;

FIG. 38A is a sectional view showing an MQW semiconductor laser according to a nineteenth embodiment of the present invention, and FIG. 38B is a view showing a band diagram of the SQW semiconductor laser in FIG. 38A;

FIG. 39 is a view illustrating an advantageous effect achieved by the MQW semiconductor laser according to the nineteenth embodiment of the present invention;

FIG. 40 is a sectional view showing an MQW semiconductor laser according to a twentieth embodiment of the present invention;

FIG. 41 is a view of showing an optical output-current characteristic of the MQW semiconductor laser according to the twentieth embodiment of the present invention;

FIGS. 42A and 42B are a top view and a schematic sectional view showing a surface light emitting type LED to confirm an advantageous effect achieved by the MQW semiconductor laser according to the twentieth embodiment of the present invention respectively;

FIG. 43 is a view illustrating PL spectra of the two LEDs having different growth conditions of the electron-blocking layer;

FIGS. 44A and 44B are views illustrating PL intensities as functions of Mg concentrations in the electron blocking layer. FIG. 44A is for the lumenescence of the MQW active layer and FIG. 44B is for the p-GaN optical guiding layer;

FIG. 45 is a view showing a band diagram in the neighborhood of an MQW active layer of the MQW semiconductor laser according to the twentieth embodiment of the present invention; and FIGS. 46A and 46B are views illustrating dependences of p-type carrier (hole) concentration on Mg concentration and growth temperature, respectively.

DESCRIPTION OF THE PREFERRED EMBODIMENTS

First, fundamental experiments and simulations performed by the inventors of the present invention as with an optical device made of nitride compound semiconductor will be explained with reference to FIGS. 6 to 18. Then, embodiments of the present invention will be explained with reference to FIGS. 19 to 46B hereinafter.

The nitride compound semiconductor has three key features in physical property: wurtzite-type hexagonal crystal having an anisotropy in its crystal structure, very large band gap and effective masses, and three valance bands in the vicinity of the valance band edge, which is caused by the small spin-orbit interaction, or HH (Heavy Hole), LH (Light Hole), and CH (crystal-field spliting hole).

① In more detail, first, as the features due to the fact that the effective mass of the hole is large, there are ② Since the effective mass of the hole is large, a quasi-Fermi level EFp in the valence band is difficult to rise.

A Since the effective mass of the hole is large and LO (longitudinal optical) phonon scattering, etc. are large, hole mobility is small.

③ At Since the effective mass of the hole is large, a hole average velocity, i.e., a hole thermal velocity $v_p$ at a temperature T is $$(m/2)v_p^2=(3/2)kT,$$

then $$v_p \propto m^{-\frac{1}{2}}$$

Therefore, the hole thermal velocity $v_p$ is small.

Second, according to the causes such that three bands of HH, LH, and CH exist closely in the valence band and the quasi Fermi level $E_{Fp}$ is difficult to rise because of large effective mass of two of three bands, ④ Rise of the quasi-Fermi level $E_{Fn}$ the conduction band, which is required to attain the population inversion, is enhanced rather than the conventional material.

⑤ A ratio of energy discontinuity ΔEv to difference in the forbidden bandwidth ΔEg, i.e., ΔEv/ΔEg in the valence band of the heterojunction of GaN/InGaN or $In_xGa_{1-x}N/In_yGa_{1-y}N$, which constitute either the barrier layer and the well layer or the active layer and the optical guiding layer, is about 0.7 which is larger than about 0.4 in the conventional material. As a result, band offset on the interface is shifted to the valence band side by a rate of 3:7.

These have caused such situations that hole injection from the p-side layer side to the active layer is not carried out effectively, especially the low hole injection efficiency would cause unevenness of the hole density between the quantum well layers (well layers) if the active layer is composed of a multi-quantum well (MQW) structure, and that the electrons which are not consumed effectively in the active layer flow over to the p-side to thus generate the overflow current for the p-side guiding layer or the p-side cladding layer, which has been found by the inventions of thepresent invention byvirtue of simulation. Such circumstances will be explained with reference to FIGS. 6 and 10 hereinbelow.

The simulations as shown in FIGS. 6 to 10 are preformed on the condition which the electron blocking layer (overflow preventing layer) in a semiconductor laser is omitted.

Figure 6:
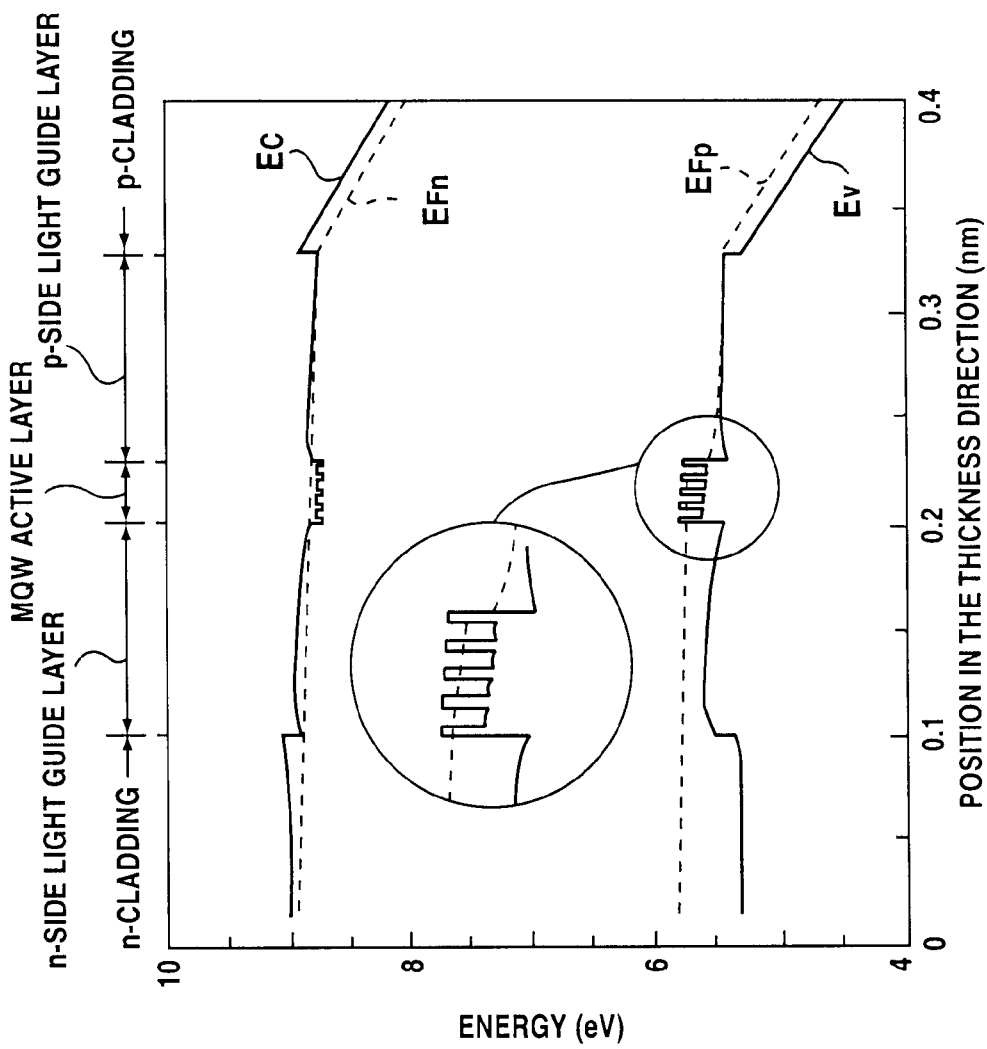
FIG. 6 is a view showing a typical band diagram of a MQW semiconductor laser when it is set in its nitride compound semiconductor laser oscillation state.

FIG. 6 is a view showing a change in the Fermi level in the neighborhood of the active layer. As shown in an enlarged circle, it can be seen that the quasi-Fermi level $E_{Fp}$ for the hole in the valence band is located at lower energy side than the p-side optical guiding layer in the active layer.

Figure 7:
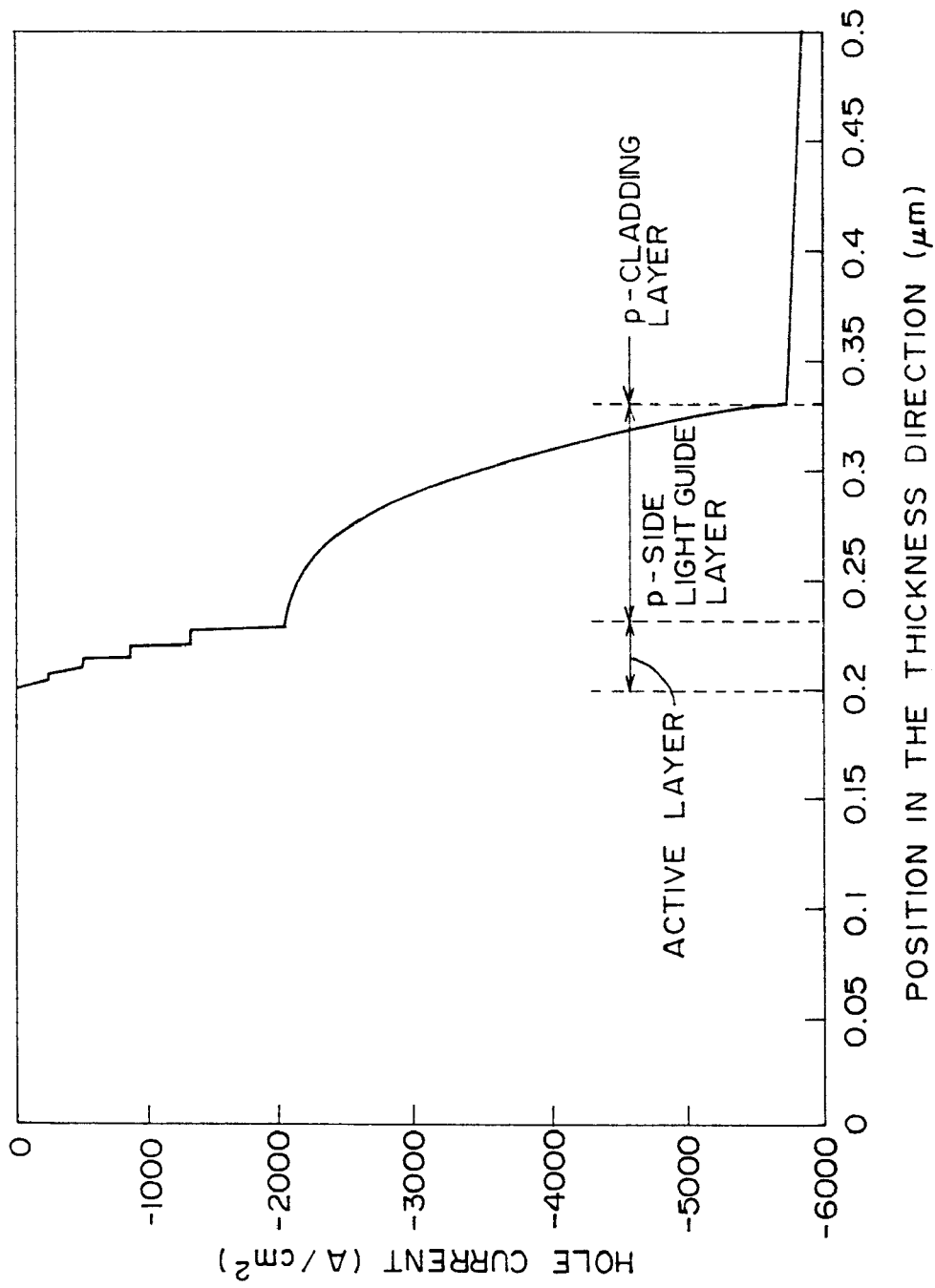
FIG. 7 is a view illustrating typical dependence of a hole current in the short wavelength light emitting MQW semiconductor laser using nitride compound semiconductor in the prior art on layer position.

In other words, in the usual material, thermal equilibrium state can be attained by injecting of the hole, so that the quasi-Fermi level $E_{Fp}$ in the active layer coincides with the quasi-Fermi level $E_{Fp}$ in the p-side optical guiding layer substantially. On the contrary, in the nitride semiconductor material, a difference in the quasi-Fermi level $E_{Fp}$ in the active layer and the quasi-Fermi level $E_{Fp}$ in the p-side optical guiding layer is very large, which yields that the holes are not injected effectively from the p-side optical guiding layer to the active layer FIG. 7 is a view illustrating dependence of the hole current in the MQW short wavelength semiconductor laser having five well layers on a layer position, i.e., simulation result showing where the injected holes are eliminated by recombination. As evident from FIG. 7, the hole current injected from the p-type cladding layer has been consumed in the p-side optical guiding layer by 4 kA/cm² before it reaches the active layer.

Such consumed current is the reactive current not to contribute the laser oscillation and it results in an increase in the threshold current density $J_{th}$. It may be supposed that the reason why the recombination is enhanced in the p-side optical guiding layer like the above is due to the poor hole injection efficiency from the p-type cladding layer to the active layer.

In addition, in case the active layer is formed of the MQW structure, such poor hole injection efficiency would cause unevenness of the hole density between the quantum well layers (well layers), which makes the laser oscillation ineffective. It can be seen that the quasi-Fermi level Efp for the hole in the valance band has a large discontinuity between the active layer and p-side optical guiding layer.

Figure 8:
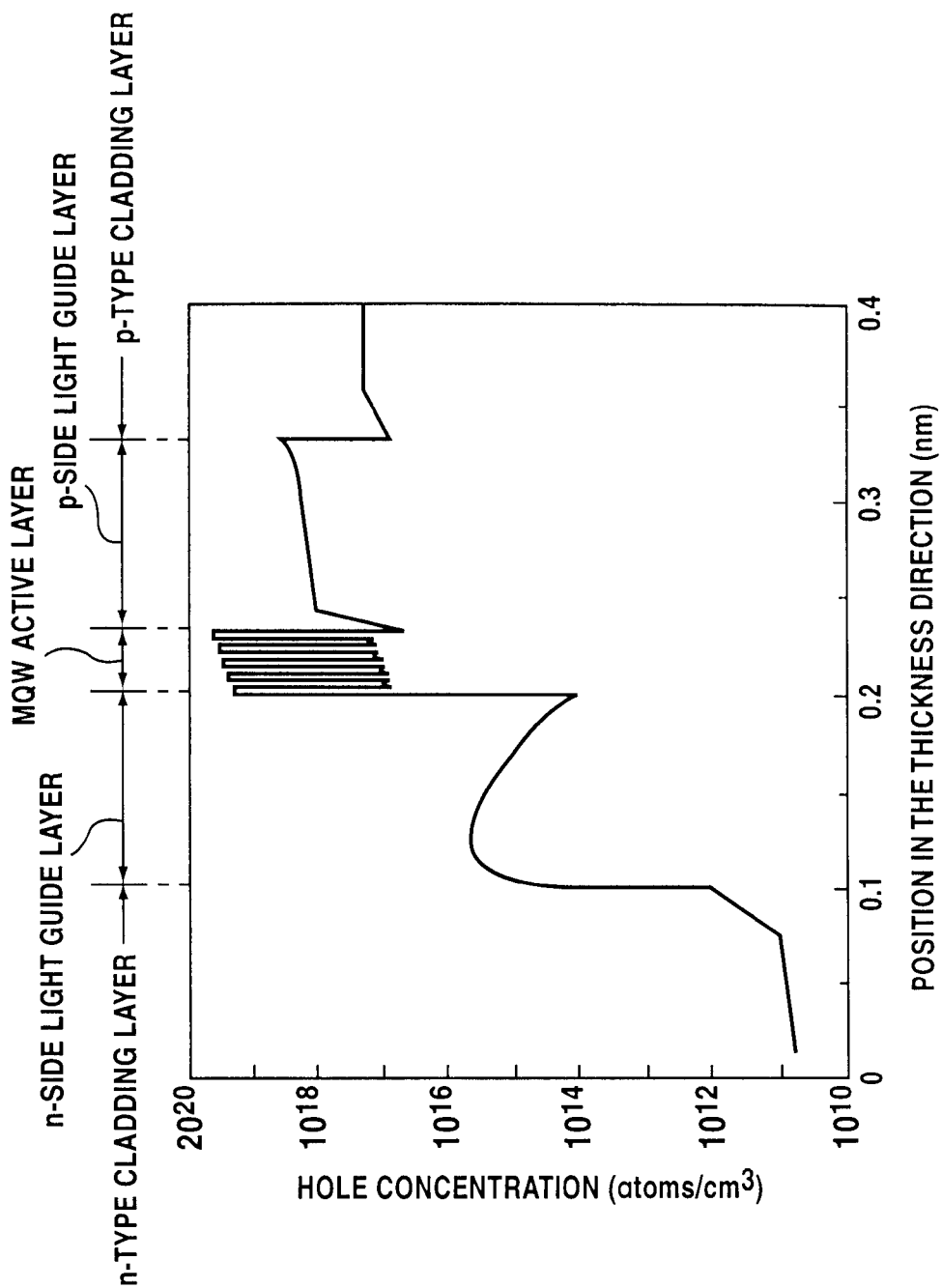
FIG. 8 is a view showing a typical hole density distribution in the MQW semiconductor laser using nitride compound semiconductor when it is set in its oscillation state.

FIG. 8 is a view showing a simulation result of ahole density distribution in the device film thickness direction in the state shown in FIG. 6. As apparent from FIG. 9, it can be understood that the hole density in the MQW active layer is enhanced and becomes uneven as it comes closer to the p-side optical guiding layer.

Figure 9:
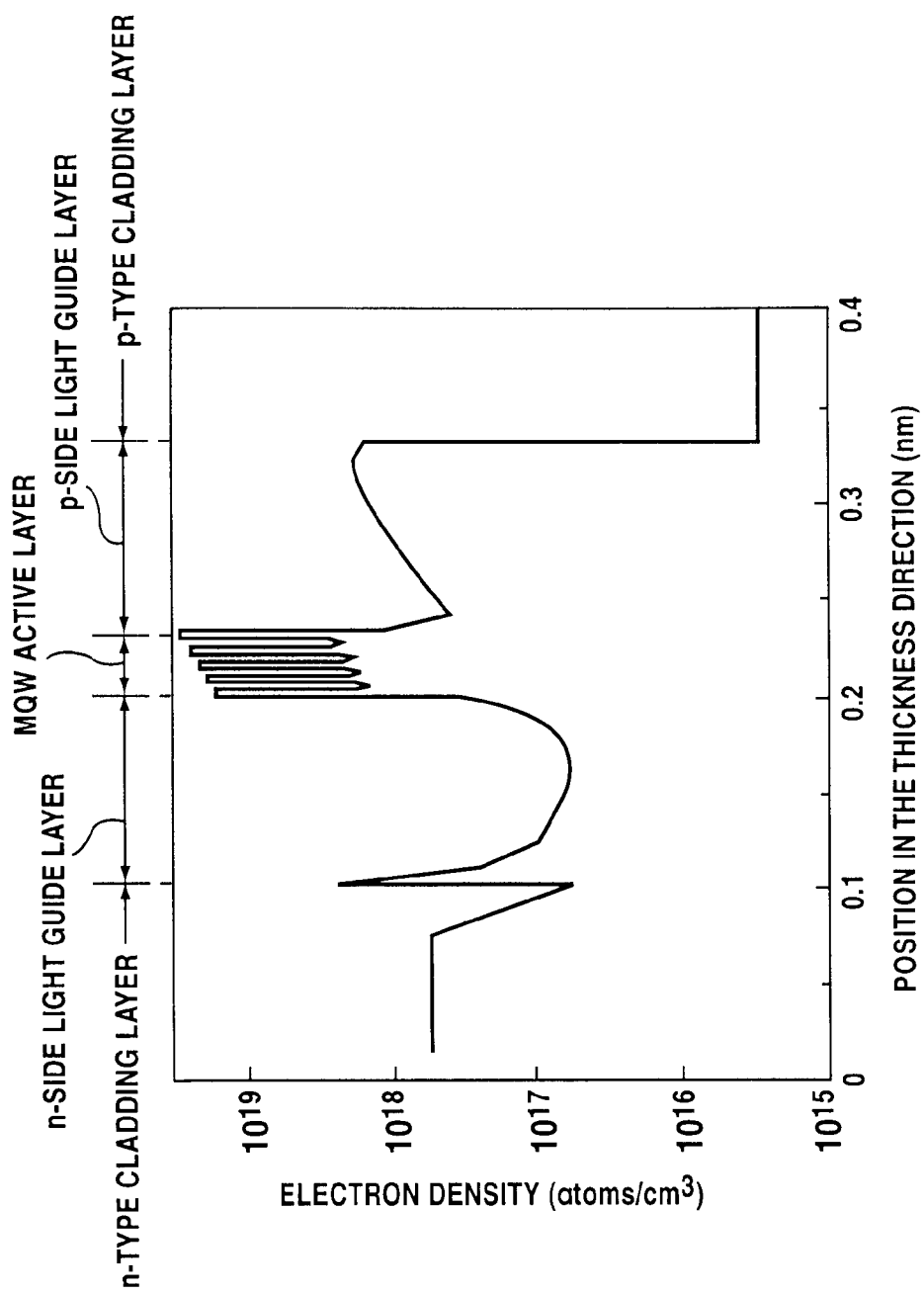
FIG. 9 is a view showing a typical electron density. distribution in the MQW semiconductor laser using nitride compound semiconductor when it is set in its oscillation state.

FIG. 9 is a view showing similarly a simulation result of an electron density distribution in the device film thickness direction in the state shown in FIG. 6. As apparent from FIG. 8, it can be understood that the electron density injected from the n-side optical guiding layer into the MQW active layer is enhanced and becomes uneven as it comes closer to the p-side optical guiding layer. This is caused by the above uneven hole injection, whereby the electrons are attracted by the holes in order to satisfy the charge neutrality condition.

In this manner, it is predicted that, because similar unevenness of both the hole and the electron is caused, generation of the optical gain in the multi-quantum well structure is made extremely uneven. Therefore, such circumstances will be explained with reference to FIG. 10 hereinbelow.

Figure 10:
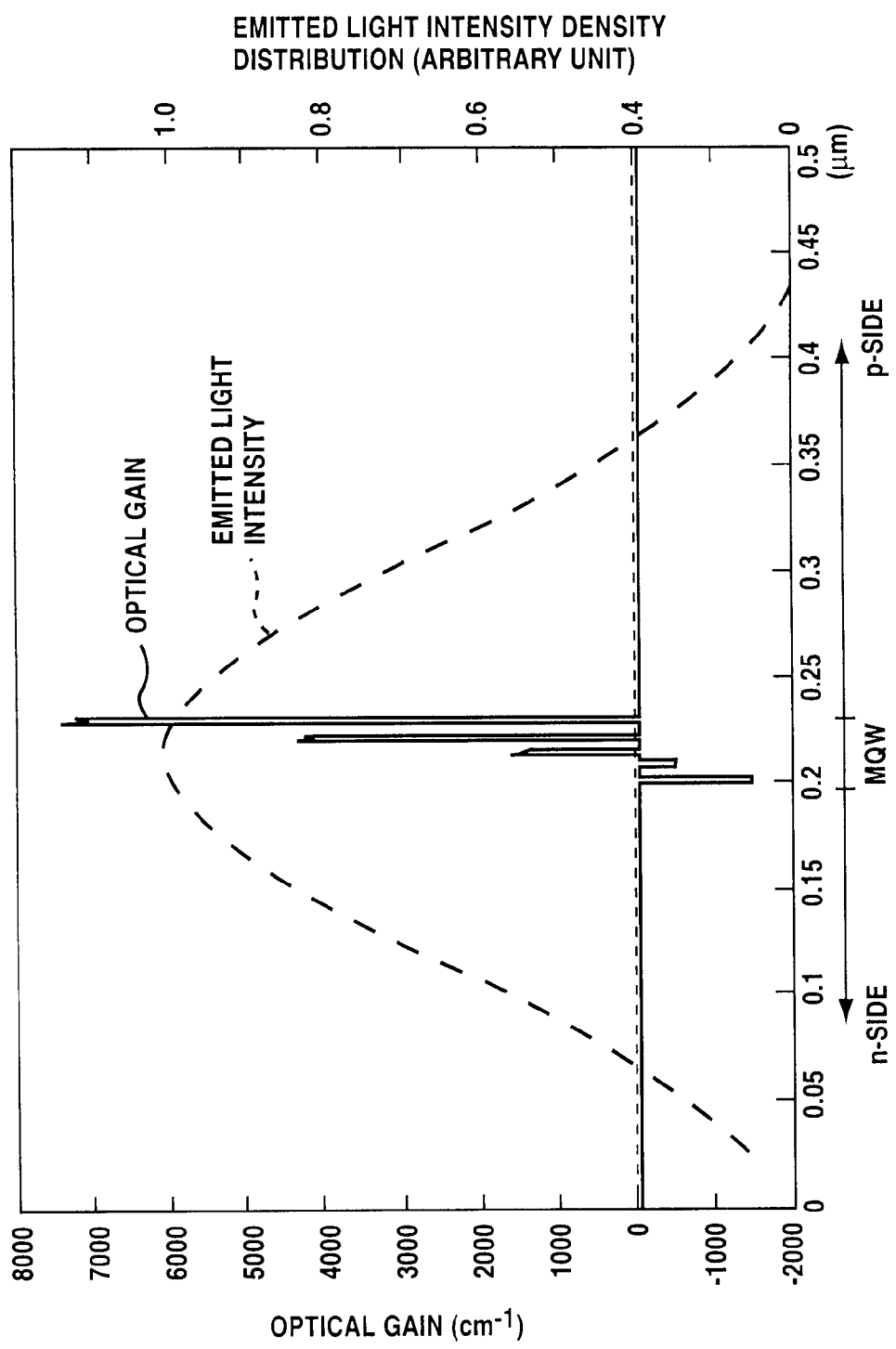
FIG. 10 is a view showing a typical optical gain and an emitted light intensity distribution in the MQW short wavelength light emitting semiconductor laser using nitride compound semiconductor.

FIG. 10 is a view showing an optical gain distribution in the multi-quantum well in the MOW short wavelength semiconductor laser using the above nitride compound semiconductor. Since a large quantity of holes are supplied from the p-side optical guiding layer to the first well layer in MQW, the high optical gain can be achieved in the p-side first well. On the other hand, the magnitude of the optical gain reduces toward the n-side and no gain generation is observed in the n-side two wells. Then, as the electrons come closer to the n-type cladding layer, the optical gain is reduced. Then, not only is the optical gain not generated in two quantum wells on the n-type cladding layer side, but also optical loss is generated, whereby a characteristic which is different from that of the conventional semiconductor laser using the zincblende crystal structure semiconductor can be yielded.

In other words, in the conventional semiconductor laser using the zincblende crystal structure semiconductor, if the MQW structure is composed of the quantum well layer consisting of five layers, what the carrier is injected uniformly is a common sense. Five to ten layers of the quantum well layer is employed in the long-wavelength laser for use in optical communication, and about five layers of the quantum well layer is employed in the MDT red-light laser. In both cases, the optical gain in generated uniformly.

Generation of a light absorption layer because of unevenness of the optical gain between the quantum well layers have two harmful influences. First, as apparent from FIGS. 8 and 9, the carriers exist at high density in two n-side quantum well layers acting as the light absorption layers. This means that a recombination current is large therein. Hence, two n-side quantum well layers results in the increase of the current quantity which enables three p-side quantum well layers to the threshold Fermi level for laser oscillation.

Second, since two n-side quantum well layers act as the light absorption layer, an internal loss to be overcome for laser oscillation is increased. Thus, a harmful influence is caused such that the threshold Fermi level $E^F_{th}$ itself is risen.

Figure 11:
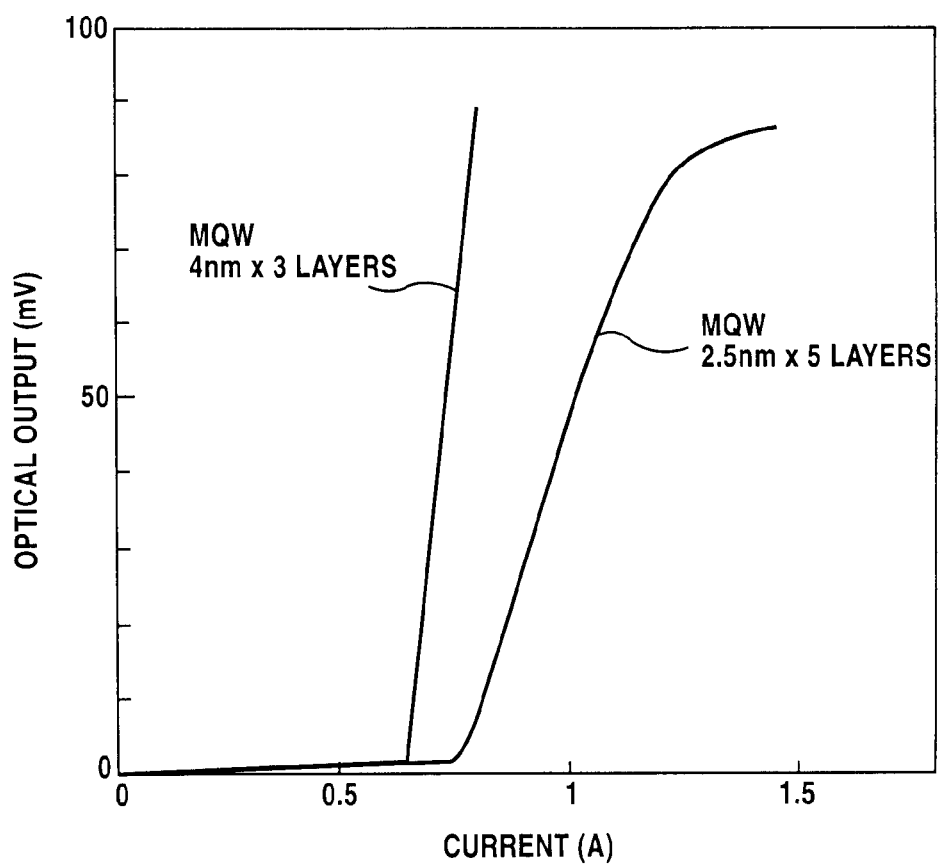
FIG. 11 is a view showing an light output-current characteristic of the MQW semiconductor laser using nitride compound semiconductor.

FIG. 11 is a view showing an optical output-current characteristic of the MQW semiconductor laser which is actually fabricated while changing the number of the quantum well layers in the multi-quantum well active layer. In this case, the film thickness is changed to keep the overall optical confinement constant. It can be seen that the threshold current density Jth is high in the MQW semiconductor laser in which the active layer consisting of five layers of quantum well layer is provided rather than the case where the MQW semiconductor laser in which the active layer consisting of three layers of quantum well layer is provided and that an efficiency of the semiconductor laser is poor after the laser oscillation.

The reason for the above may be supposed as follows. That is, such efficiency of the semiconductor laser is decided by the internal quantum efficiency and the internal loaa. Since two n-side quantum well layers can act as the light absorption layer and carriers in the two n-side wells are wasted, both the internal quantum efficiency and the internal loss are deteriorated.

As shown in FIG. 10, in the MQW semiconductor laser in the prior art, an emitted light electromagnetic field intensity distribution (emitted light intensity distribution) is formed as a symmetric structure such that a maximum intensity position is placed on a center position of the active layer. For this reason, since the first quantum well layer for generating the optical gain does not coincide with the maximum intensity position, there has been a problem that the optical confinement cannot be performed effectively.

In other words, the substantial gain to contribute the laser oscillation can be derived by multiplying the optical gain by the emitted light intensity distribution. Therefore, the optical gain, even though it is high, cannot contribute the laser oscillation unless the emitted light intensity distribution cannot be positioned at the position to produce the optical gain.

In practice, the emitted light distribution in the active layer is about 3% of the overall light intensity if all layers are summed up, as shown in FIG. 10. The event that the light distribution, as though it was not enough, cannot be enhanced in the layer to generate the maximum optical gain is the serious problem.

In the case of the MQW laser being reported at present, which has ten to twenty layers of quantum well layer, there has been the problem that the optical confinement is achieved satisfactorily in the overall quantum well structure, nevertheless the optical confinement in the range from the p-type cladding layer side to the first quantum well becomes rather small, in which the optical gain is substantially generated, whereby the threshold current density $J_{th}$ is increased.

In addition, according to the above reason (5), the influence of the difference in the forbidden bandwidth ΔEg appears on the valence band side by about 70% and the energy discontinuity ΔEc on the conduction band side becomes small, so that overflow of the electron becomes an issue. Therefore, the overflow preventing layer or the carrier stopper layer is provided in the conventional short wavelength light emitting semiconductor laser. Accordingly, this provides the asymmetric structure in which the emitted light intensity distribution is further shifted to the n-side. Thus, there has been the problem that the optical confinement is reduced still further in the range from the p-type cladding layer side to the first quantum well, which has the high optical gain, so that the threshold current density $J_{th}$ is increased.

For this reason, in order to improve the characteristic of the MQW semiconductor laser using the nitride compound semiconductor, the threshold current density $J_{th}$ must be reduced. Hence, to improve the above uneven carrier injection is effective for the reduction of the threshold current density $J_{th}$.

However, in the case of the MOW semiconductor laser using the nitride compound semiconductor, there exists the problem peculiar to the nitride compound semiconductor. An excellent solving means cannot be found only by applying the common sense of the zincblende crystal structure semiconductor in the prior art.

According to examination, in order to improve the hole injection efficiency, normally the hole density must be enhanced by providing the p-type layer as the p-side optical guiding layer. In this case, there has been the problem that conversely the hole injection efficiency is reduced.

More particularly, the major cause of the low hole injection efficiency is small hole mobility in the p-side optical guiding layer. In the above case, scattering is increased by p-type doping to thus reduce the hole mobility still further.

If the p-type impurity in the p-side optical guiding layer is doped in high concentration, the hole density is hard to quantum well layers cannot be ignored if the film thickness is made thin. Hence, since the density of states which is produced stepwise essentially is rounded to thus decrease generation of the optical gain per a certain carrier density. For this reason, the thickness of the barrier layer is set to more than 5 nm, and this configuration is adopted as it is in the MQW semiconductor laser using the nitride compound semiconductor.

However, in the MQW semiconductor laser using the nitride compound semiconductor, because the effective mass of the carrier is large, penetration of the wave function from the quantum well becomes small and the step-like optical gain distribution is slightly rounded originally because of unevenness of the band gap. As a result, the examination comes to the conclusion that the thickness of more than 5 nm is not an essential matter.

Like the above, the electrons which are not consumed effectively in the active layer flow over into the p-side to thus provide the overflow current to the p-side optical guiding layer or the p-side cladding layer. In addition, because of the poor hole injection efficiency from the p-side optical guiding layer to the active layer, the holes stored in the p-side optical guiding layer attract the electrons towards the p-side layer, so that the overflow current is also increased, Based on the above reason (5), offset of the band in the heterojunction interface is shifted to the valence band side at a rate of 3:7 and the energy discontinuity ΔEc on the conduction band side becomes small. Therefore, the overflow of the electron becomes an issue from this respect. The over flow preventing layer or the carrier stopper layer is provided in the short wavelength semiconductor laser in the prior art, nevertheless the overflow is readily caused since the threshold carrier density $N_{th}$ is high. increase because the impurity has a small active coefficient.

In general, thinning of the thickness of the well layer in the multi-quantum well structure, thinning of the thickness of the barrier layer, and reduction in the height of the barrier layer, i.e., to make the forbidden bandwidth small are effective for improvement of the uneven carrier injection in the MQW semiconductor laser.

Since the thickness of the well layer is a most important item of laser design to control largely the optical gain characteristic of the semiconductor laser, it is difficult to change the thickness of the well layer independently. In the nitride MQW blue-light semiconductor laser, to make the forbidden bandwidth of the barrier layer small correspond to the increase of In composition in the barrier. However, such increase of In composition is not preferable since it results in an increase of strain to thus deteriorate the crystal quality. Such circumstances will be explained with reference to FIG. 12 hereinbelow.

Figure 12:
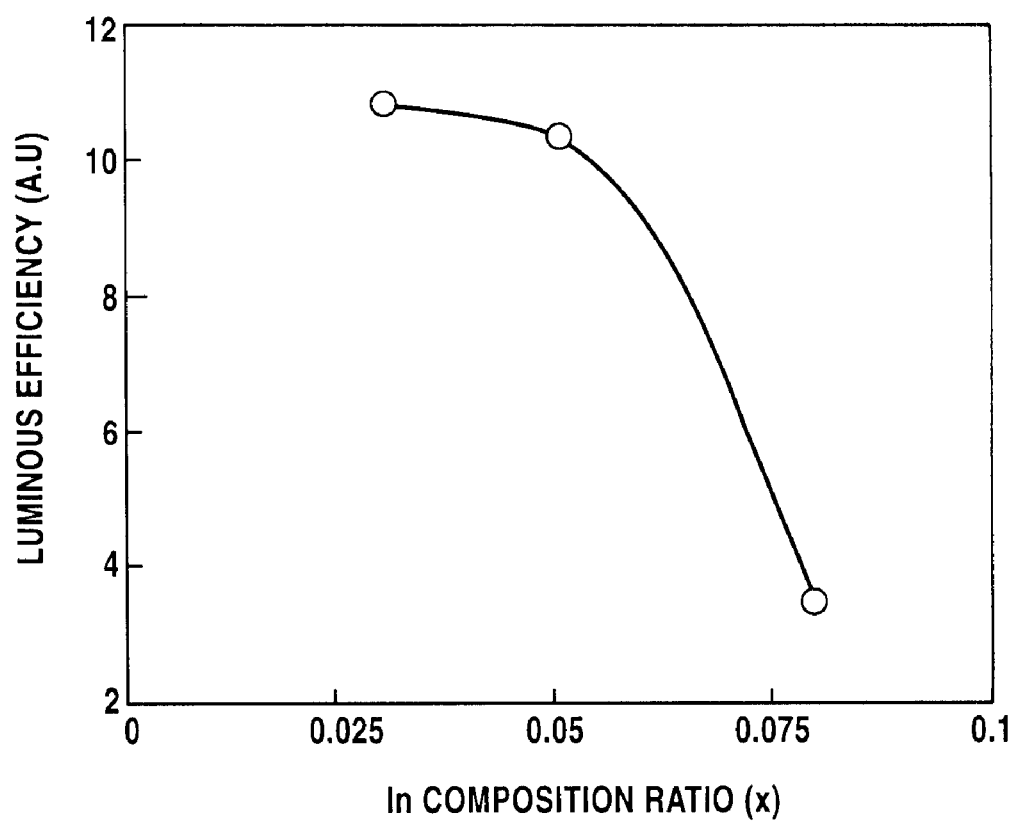
FIG. 12 is a view illustrating dependence of a radiative efficiency of a quantum well structure active layer on In composition ratio x of an $In_xGa_{1-x}N$ barrier layer.

FIG. 12 is a view illustrating an experimental result of dependence of a luminous efficiency of a quantum well structure active layer on In composition ratio x in case $In_xGa_{1-x}N$ is employed as the barrier layer. The higher the In composition ratio x the larger the strain applied to the active layer, so that the luminous efficiency becomes small. As a result, the In composition ratio x of the barrier layer cannot be increased and therefore the injection efficiency cannot be enhanced by reducing the barrier of the quantum well structure.

As for the thickness of the barrier layer, in the laser using the zincblende crystal structure semiconductor in the prior art, a mutual action due to exude of the wave function between the Like the above, in contrast to other semiconductor, the overflow of the electrons is the essential matter in the nitride semiconductor.

That is, the threshold current density $J_{th}$ of the semiconductor laser can be expressed by $$J_{th} \pm N_{th} \cdot d \cdot e / \tau_s$$

where $\tau_s$ is a lifetime of the electron, d is a thickness of the active layer, e is an elementary charge, and $N_{th}$ is the threshold carrier density. Then, a threshold Fermi level $E^F_{th}$ denotes a value of the Fermi level $E_F$ which determined by the carrier density N at the threshold carrier density $N_{th}$, i.e., $$E_{Fth} = E_F(N_{th})$$

This threshold carrier density $N_{th}$ is a carrier density at which Gm (modal gain) exceeds a cavity loss to commence the laser oscillation. This Gm must be increased to reduce the threshold carrier density $N_{th}$.

This Gm can be expressed by $$Gm = \Gamma \cdot G$$

where $\Gamma$ is an optical confinement factor, and G is a gain which is determined by composition of the active layer, the carrier density, etc. Therefore, if the active layer is formed thin and the optical confinement is carried out insufficiently, the Gm is reduced and accordingly the threshold carrier density $N_{th}$ is increased. As a result, the threshold Fermi level $E^F_{th}$ is easy to rise.

If this threshold Fermi level $E^F_{th}$ is increased, the nuirber of high energy electrons is increased. The overflow of the electrons becomes also an issue from this respect.

The inventors of the present invention have found by simulation the fact that, if the overflow preventing layer is not provided a leakage current into the p-type cladding layer due to the overflow of the electrons are extremely increased. Such circumstances will be explained with reference to FIG. 13 hereinbelow.

Figure 13:
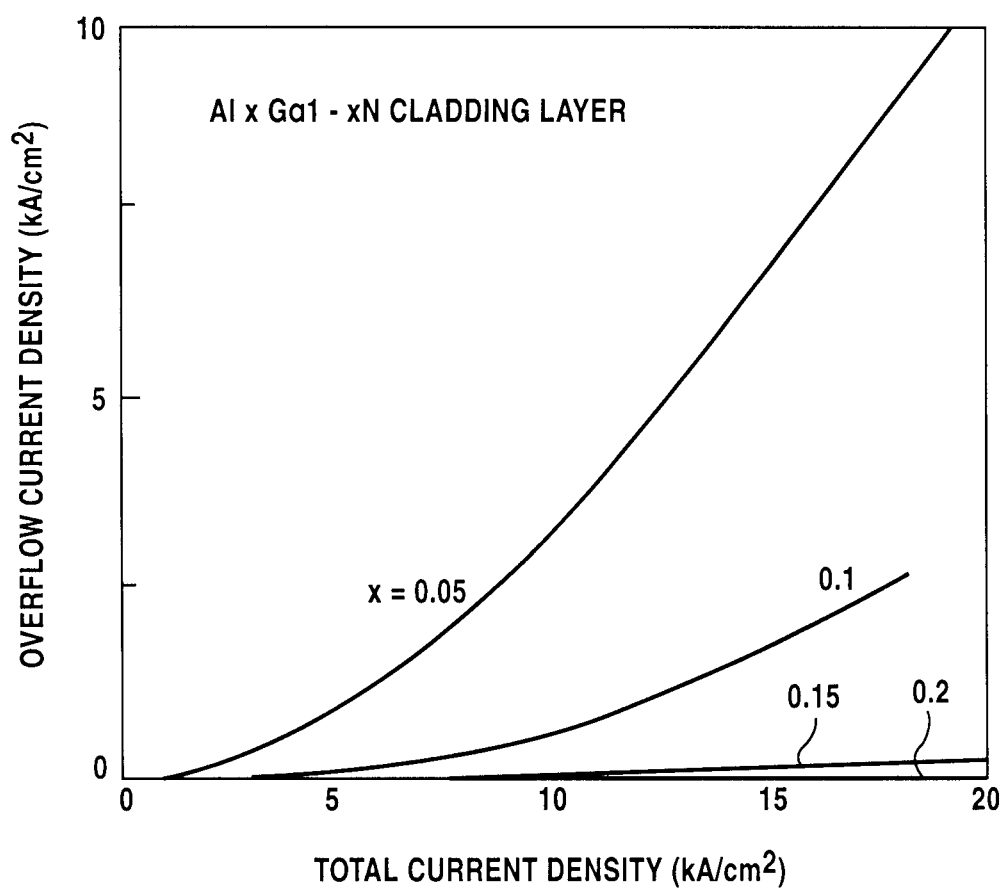
FIG. 13 is a view illustrating dependence of an overflow current on total current at various Al compositions.

FIG. 13 is a view illustrating a simulation result of dependence of an overflow current of the electrons on the total current amount while changing Al composition ratio of the AlGaN cladding layer, in the MQW short wavelength semiconductor laser in which five layers of well layers made of $In_{0.15}Ga_{0.85}N$ are sandwiched by $In_{0.05}Ga_{0.95}N$ barrier layers. In case the Al composition ratio of the AlGaN cladding layer is set to 0.05, i.e., the $Al_{0.05}Ga_{0.95}N$ layer is employed, the leakage current starts to increase from a low current region, and such leakage current has leaked at a total current density of 20 kA/cm$^2$ by half or more of the total current amount.

Such leakage current is a current which does not contribute the laser oscillation. This leakage current itself yields not only an increase in the threshold current density $J_{th}$ but also the cause of heat generation, which makes the laser oscillation much more difficult.

In the event that the $Al_{0.05}Ga_{0.95}N$ layer having the Al composition ratio of 0.05 is employed as the cladding layer, difference in bandgap between the active layer and the cladding layer is 500 mV. This difference is sufficient for the conventional material system. Butt in the nitride system, since the overflow current is very large, the $Al_{0.15}Ga_{0.85}N$ layer in which the Al composition ratio of the cladding layer is enhanced, etc. are employed to reduce the leakage current generated by the overflow.

Figure 14:
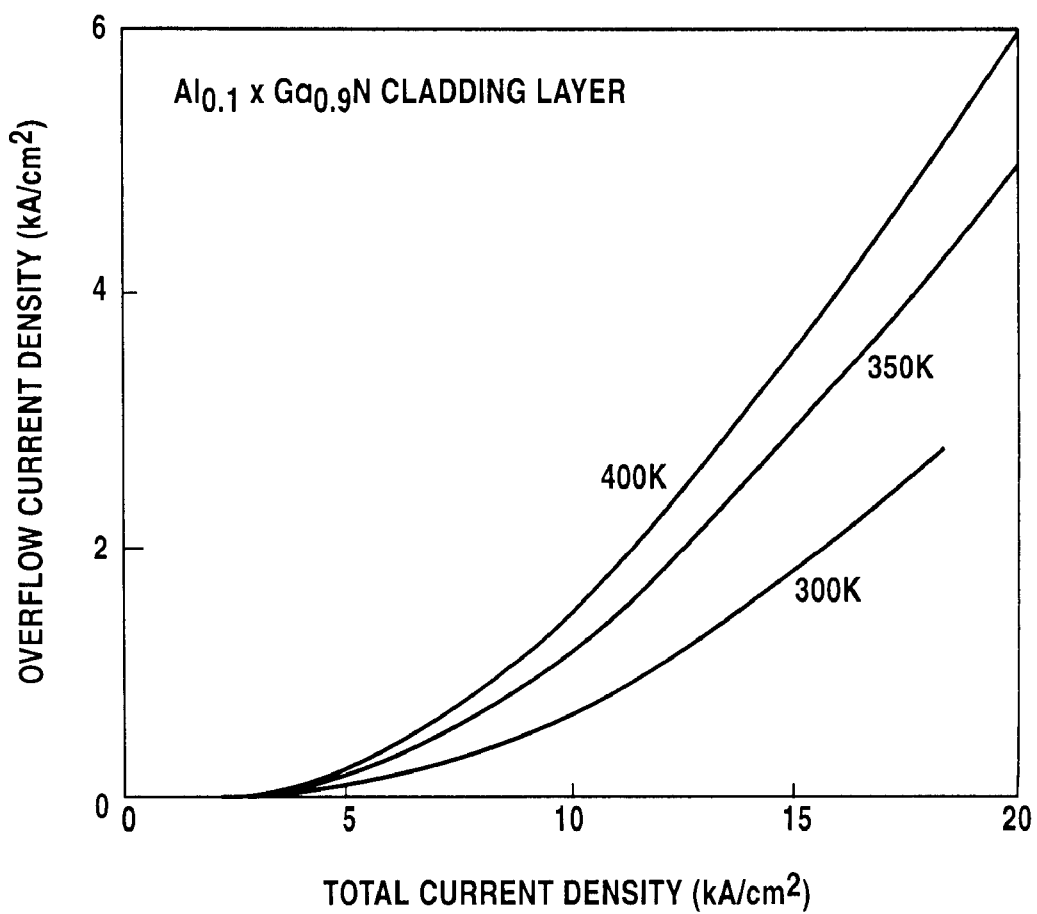
FIG. 14 is a view illustrating dependence of the overflow current on total current at various temperature.

Furthermore, the inventors of the present invention has found by simulation the fact that the overflow current also depends upon a device temperature. Such circumstances will be explained with reference to FIG. 14 hereinbelow, FIG. 14 is a view illustrating a simulation result of dependence of the overflow current of the electrons on the total current amount while changing the device temperature, when the $Al_{0.1}Ga_{0.9}N$ cladding layer is employed. As evident from FIG. 14, it can be understood that the overflow is increased in a high current region as the device temperature is increased.

In the actual device, such a vicious cycle occurs that the overflow current reaches the p-side electrode to generate heat, then the device temperature is increased, and then the overflow current is further increased according to the increase of the device temperature. It is supposed that this disturbs the laser oscillation.

In contrast, in case the overflow preventing layer made of the $Al_{0.15}Ga_{0.85}N$ layer, the $Al_{0.18}Ga_{0.82}N$ layer, or the like is provided to prevent the overflow of the electrons, the optical confinement necessary for the laser oscillation is reduced considerably because a refractive index of the $Al_{0.15}Ga_{0.85}N$ layer or the $Al_{0.18}Ga_{0.82}N$ layer is smaller than the p-side optical guiding layer, and also energy spike formed on the heterojunction interface serves as the barrier against the hole injection.

Figure 3:
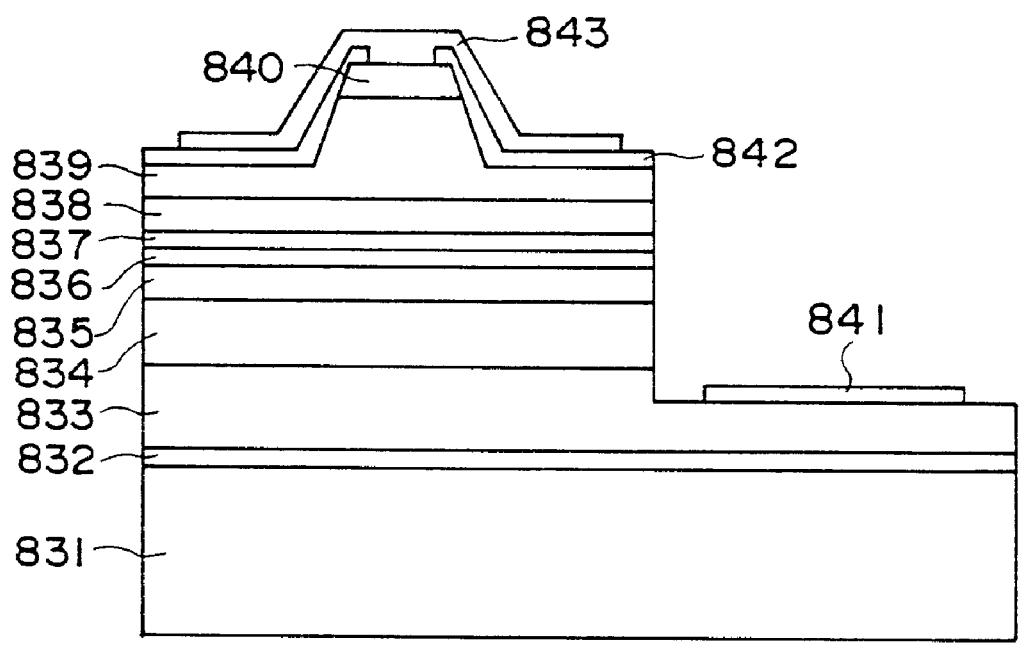
FIG. 3 is a schematic sectional view showing a short wavelengthlight emitting semiconductor laser in the prior art.
Figure 4:
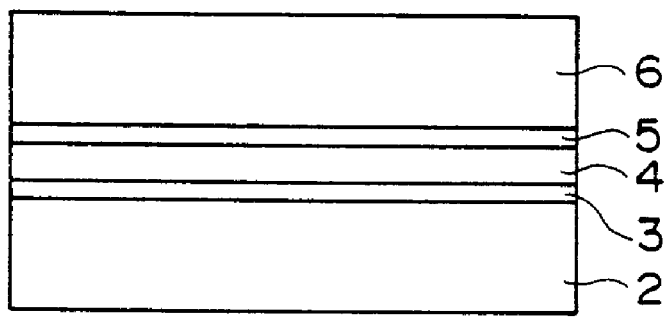
FIG. 4 is a schematic sectional view showing a fundamental configuration of the present invention.

As shown in FIG. 3 above, in the MQW semiconductor laser using the nitride compound semiconductor in the prior art, if the p-type $Al_{0.18}Ga_{0.82}N$ overflow preventing layer having the wide forbidden bandwidth is provided between the MQW active layer 836 and the p-type GaN optical guiding layer 838, the driving voltage is increased because potential barrier against the hole is enhanced, and also the driving voltage is increased by the potential barrier due to the difference in electron affinity. Such circumstances will be explained with reference to FIGS. 15A and 15B hereinbelow.

Figure 15A:
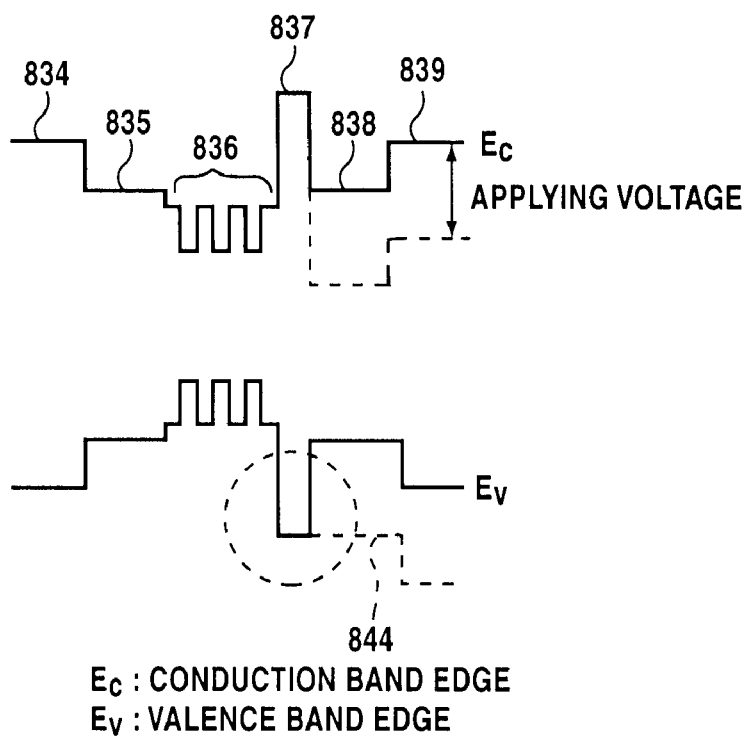
FIG. 15A is a view showing a band diagram of the short wavelength light emitting semiconductor laser using nitride compound semiconductor.

FIG. 15A is a band diagram of the nitride laser in the prior art. As is clear from FIG. 15A, since the forbidden bandwidth of the p-type $Al_{0.18}Ga_{0.82}N$ overflow preventing layer 837 is wide, the barrier formed between the p-type $Al_{0.18}Ga_{0.82}N$ overflow preventing layer 837 and the p-type CaN optical guiding layer 838 is enhanced, i. e., energy difference between a band end (indicated by a solid line) of the valence band at the time the voltage is not applied and a band end 844 (indicated by a broken line) of the valence band at the time the voltage is applied is enhanced. Accordingly, the applied voltage V to inject the hole into the MQW active layer 836 is enlarged.

Figure 15B:
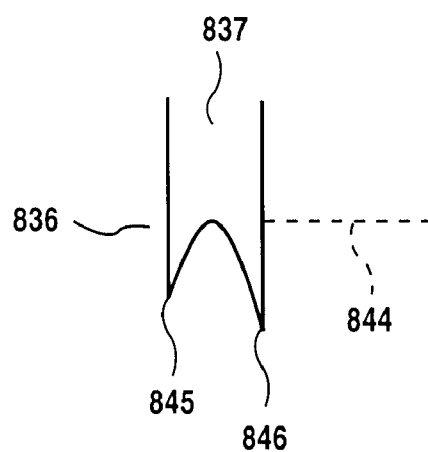
FIG. 15B is a view showing an energy level on the valance band edge of the semiconductor laser.

FIG. 15B is a view showing schematically a band diagram of the valence band side in the vicinity of the p-type $Al_{0.18}Ga_{0.82}N$ overflow preventing layer 837. As apparent from FIG. 15B, because of difference in the electron affinity, notches 845, 846 are formed on an interface between the MQW active layer 836 and the p-type $Al_{0.18}Ga_{0.82}N$ overflow preventing layer 837 and an interface the p-type $Al_{0.18}Ga_{0.82}N$ overflow preventing layer 837 and the p-type GaN optical guiding layer 838. The notches 845, 846 serve as the potential barrier against the hole injection, so that the hole injection efficiency is deteriorated.

As other factors to promote the overflow, there may be considered that resistivity of the p-type cladding layer is high and that non-radiative lifetime is short in the p-type cladding layer. Since these factors are not intrinsic, the overflow may be reduced by improving such factors.

However, the p-type cladding layer having sufficient crystal quality has not been obtained in the existing state. For exwaple, as to the resistivity, since the doping of the p-type cladding layer is difficult, sufficient resistivity cannot be obtained. Since the doping becomes more difficult with the increase of Al composition ratio, it is not easy to reduce the resistivity of the p-type cladding layer if the p-type cladding layer having the high Al composition ratio is employed to reduce the overflow.

As to the non-radiative lifetime, there has been the problem that, since non-radiative lifetime is short like 1 ns (nano second) even in undoped crystal which is smaller than the conventional material and such non-radiative lifetime comes to less than 0.1 ns in the p-type doping layer, improvement of the non-radiative lifetime is difficult in practice.

Moreover, according to the p-type impurity doping, crystal quality of the p-type optical guiding layer is deteriorated, the non-radiative lifetime becomes further short like 0.1 ns (=100 ps), an amount of the non-radiative recombination is enhanced, and the threshold current density $J_{th}$ necessary for the laser oscillation is increased much more.

In the nitride semiconductor in which enhancement of the hole density by doping Mg is not easily achieved, in view of an advantageous effect which can be achieved by increasing the hole density in the p-side optical guiding layer, rather reduction in the mobility and degradation of the crystal quality caused by p-type doping become issues.

Then, as to the dislocation density, the value of $10^{10}$ cm$^{-2}$ is about million times the zincblende crystal structure semiconductor whose dislocation density is less than 104 cm$^{-2}$ in the prior art. In the above nitride compound semiconductor, it has been said commonly that the device characteristic is not affected by dislocation since such dislocation does not for the non-radiative center. Accordinglyr there is no need of reducing the dislocation density to reduce the non-radiative center, the semiconductor laser in which the high dislocation density still remains as it is has been implemented.

An InGaN crystal, which is employed commonly as the active layer or the nitride semiconductor compound semiconductor laser, has a nature, which is totally different from the prior art material, in addition to physical features being common to the above nitride compound semiconductor.

In other words, such InGaN is a mixed crystal of InN and GaN. However, their physical properties are extremely different from each other. More particularly, the forbidden bandwidth of InN is 1.9 ev while the forbidden bandwidth of GaN is 3.4 eV, and the crystal growth temperature of InN is about 600° C. while the crystal growth temperature of GaN is about 1000° C.

It has been known that this InGaN mixed crystal is difficult to be mixed owing to above different properties. A non-mixed crystal region is large in the InGaN mixed crystal. Even in such a region that In composition ratio is small such as less than 0.2, en extent of phase separation is still increased with the increase of the In composition ratio.

As a result, in the InGaN layer in which the In composition ratio is set to about 0.15, a half-width of photoluminescence (PL) spectrum detected in a macro region such as 200 μm is very large owing to unevenness in the crystal caused by composition isolation. Such half-width is 150 meV in the excellent crystal.

More particularly, the half-width of PL spectrum, which can be increased if the thickness is made thinner in the zincblende crystal structure semiconductor, becomes smaller inversely in the InGaN mixed crystal. This phenomenon indicates that the InGaN mixed crystal has properties which are totally different from the conventional material. It is also evidenced by the fact that the half-width of PL spectrum is hardly changed even when the InGaN mixed crystal is cooled down to a ultra low temperature.

These features of InGaN appear irrespective of the type of the substrate used as the growth substrate such as the sapphire substrate, the SiC substrate, the spinel substrate, etc. and irrespective of the growth method such as the low pressure MOVPE (low pressure metal organic vapor-phase epitaxy) method, the atmospheric pressure MOVPE method, the MBE (molecular beam epitaxial growth) method, etc., and irrespective of crystal structure such as the hexagonal crystal, the cubic crystal, etc. Therefore, such basic features may be considered as inevitable characteristics which we should accept to some extent.

In this manner, in the prior art, the short wavelength semiconductor or light emitting diode (LED) having the conventional InGaN as the active layer has been developed while leaving the composition unevenness of the crystal as it is, and actually the LEDs with such high composition unevenness have been fabricated as products.

As stated above, the laser oscillation has been performed successfully by the short wavelength semiconductor laser.

But, since no appropriate evaluating means is provided up to now, it has not been found to what degree composition unevenness is caused in the whole laser resonator of the practical short wavelength semiconductor laser, and it has not been understood what influence upon the device characteristics is exerted by such composition unevenness. Hence, it has not been known totally what level of the crystal quality is requested for the laser oscillation and also under what conditions the crystal with the above quality must be grown to generate the laser oscillation with reproducibility.

Therefore, recently the inventors of the present invention have developed an approach in which photoluminescence (PL) measurement of the InGaN mixed crystal acting as the active layer of the short wavelength semiconductor laser is performed by using an spot diameter of 1 μm to thus quantitatively evaluate a level of composition unevenness in the InGaN mixed crystal.

As a result of such evaluation, it has become clear that the PL peak wavelength in the InGaNMQW (multi-quantum well) active layer has a very wide distribution in the crystal. Therefore, results will be explained with reference to FIGS. 16A, 16B and FIGS. 17A, 17B hereinbelow.

Details of the short wavelength semiconductor laser in the prior art used in the above measurement has not been announced.

Figure 16A:
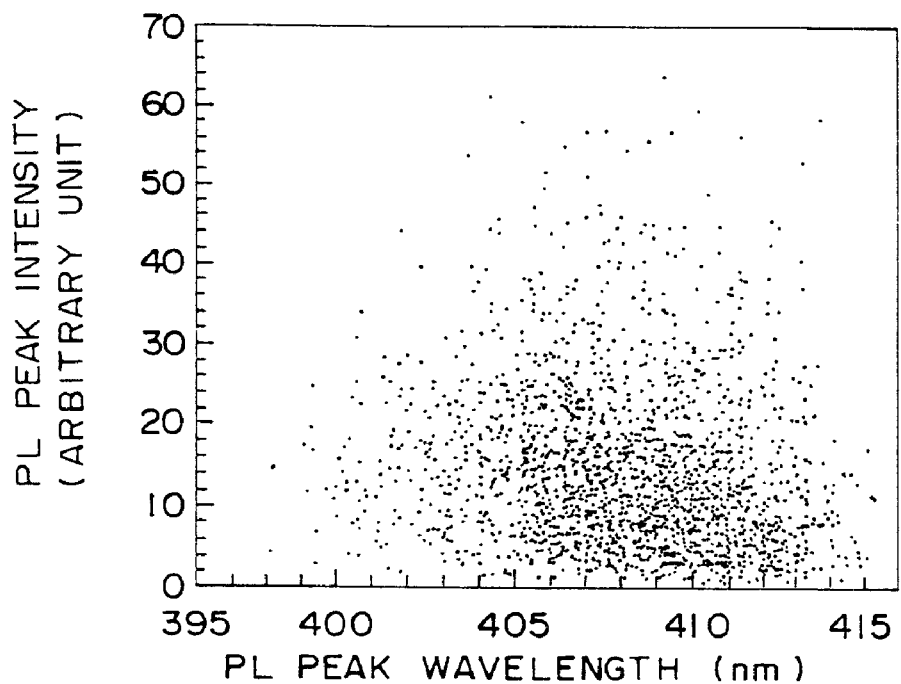
FIGS. 16A and 16B are views showing PL peak wavelength and peak intensity distributions.

FIG. 16A shows correlation between the PL peak wavelength and the PL light intensity at respective measuring points if the PL spectrum is measured at intervals of 2 μm on 2500 points in an area of 10000 μm$^2$ in the device in which the laser oscillation does not occur. Both the PL peak wavelength and the PL light intensity have been distributed widely over the range from 396 nm (≈3.131 eV) to 416 nm (≈2.960 eV), and the distribution range of the PL peak wavelength is 151 meV, i,e., about 150 meV.

On the other hand, as a result of the similar evaluation of an InGaAs active layer which is the conventional zinc-blend material used as an optical communication semiconductor laser, it has become clear that the PL peak wavelength distribution is almost 5 meV, i.e., the InGaAa material has only the PL peak wavelength distribution of about ⅟30 of the InGaN mixed crystal. It can be understood from this result that the InGaN material is very unusual material and the conventional common sense is not available for the InGaN material.

In this InGaN semiconductor laser, the threshold current density $J_{th}$ is intrinsically high for the reason in physical property and in addition such high level of composition unevenness of the active layer is a fatal defect to generate the laser oscillation. From the above evaluation, such a result has been derived that the laser oscillation cannot be generated if the PL peak wavelength distribution is more than 150 meV.

Figure 16B:
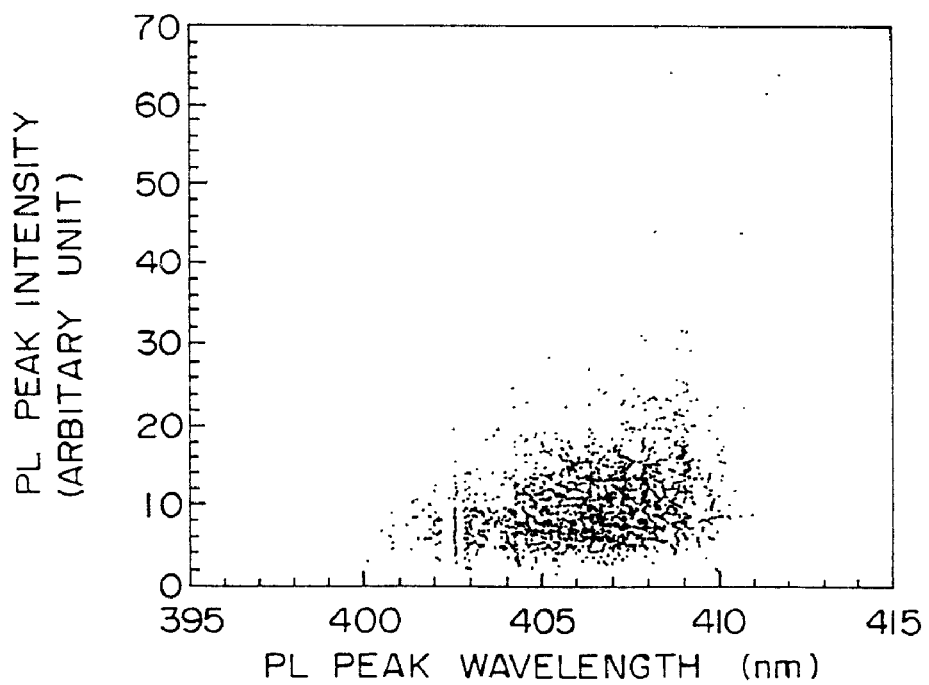

FIG. 16B correlation between the PL peak wavelength and the PL light intensity at respective measuring points if the PL spectrum is measured at intervals of 2 μm on 2500 points in an area of 10000 μm$^2$ in the device in which the laser oscillation occurs. The PL peak wavelength distribution range has been 91 meV, i.e., about 90 meV over the range from 400 nm (≈3.100 eV) to 412 nm (≈3.009 eV), and the PL light intensity distribution has also been small.

Figure 17A:
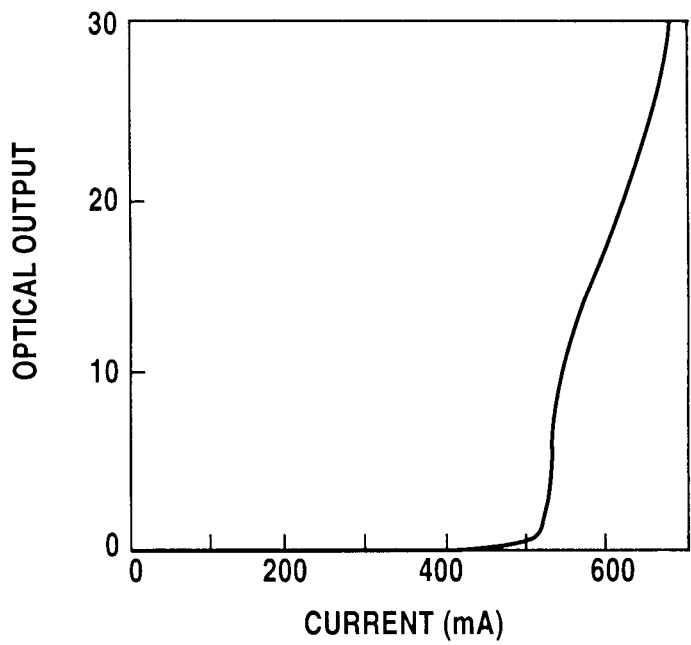
FIGS. 17A and 17B are views showing light-output current characteristic and lasing at various current densities, respectively.

FIG. 17A is a view showing a current-optical output characteristic (I-L characteristic) of the InGaN semiconductor laser having the above PL peak wavelength distribution. The room-temperature pulse oscillation has been able to be attained at the wavelength of 414.3 nm, but kink has clearly appeared as the current is increased.

In this case, normally the PL wavelength is slightly different from the laser oscillation wavelength mutually.

Figure 17B:
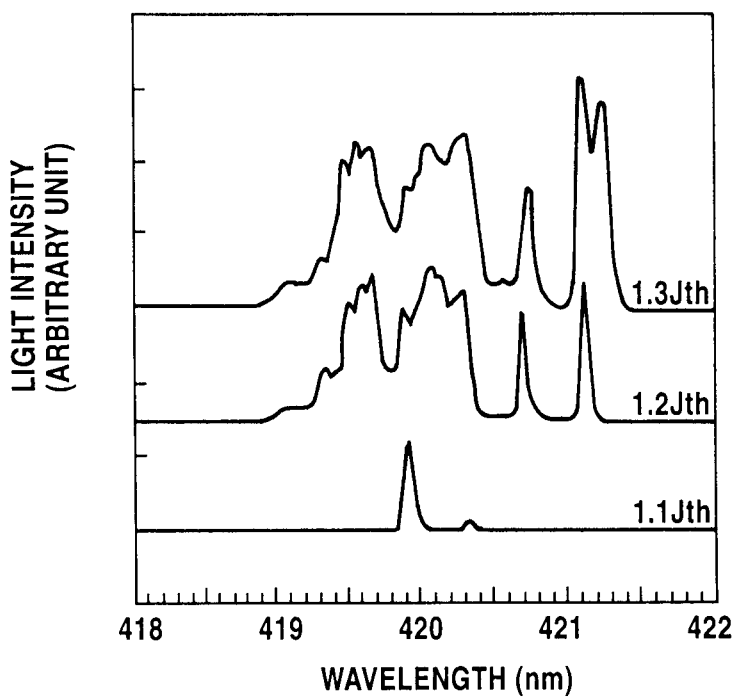

FIG. 17B is a view showing oscillation wavelengths when currents which are 1.1, 1.2, and 1.3 times the threshold current density $J_{th}$ are flown respectively through the InGaN semiconductor laser which is the same as that used in FIG. 17A. It is apparent that multi-wavelength oscillation is generated as the current is increased and the kink in the I-L characteristic in FIG. 17A is caused by such multi-wavelength oscillation.

In the prior art, it has been known in the InGaN semiconductor laser that the oscillation wavelength is multi-wavelength or is changed largely by the injection current. The cause has been concluded such that quantum dots (quantum boxes) in the active layer are reflected on such phenomenon.

In other words, in Japanese Journal of Applied Physics, vol.35, 1996, p.217, it has been believed that the multi-wavelength oscillation is due to the quantum effect. Actually, it has been reported that the quantum dots are generated in the InGaN layer. If necessary Applied Physics Letters, vol.70, 1997, p.981).

However, as a research of the inventors of the present invention, the inventions have come to such conclusion that the multi-wavelength oscillation is caused by a spatial distribution of the PL peak wavelength due to composition unevenness in the active layer, as mentioned above. Such circumstances will be explained with reference to FIG. 18 hereinbelow.

Figure 18:
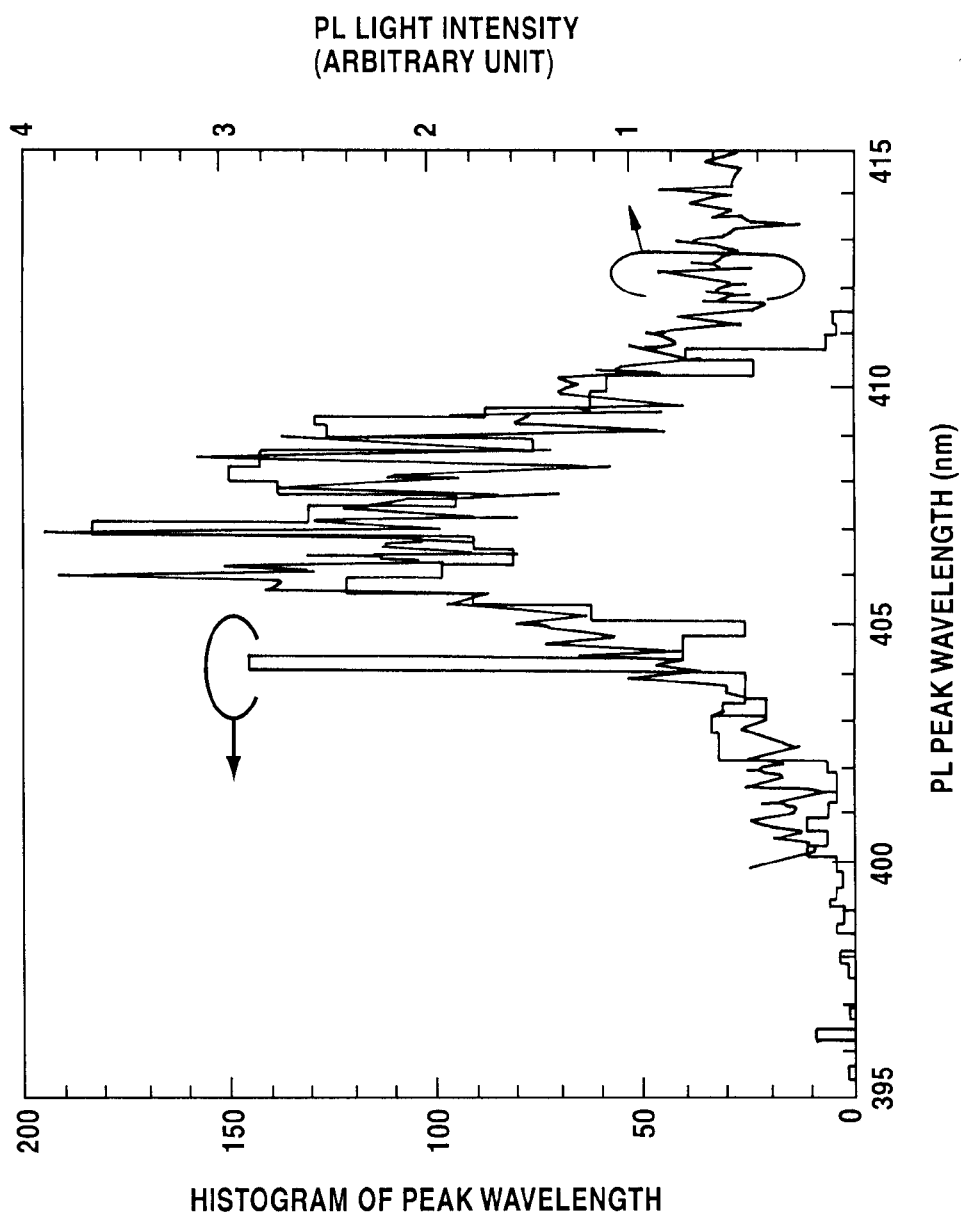
FIG. 18 is a view showing correlation between a histogram of PL peak wavelength and lasing spectrum by optical pumping.

A bar graph shown in FIG. 18 is a histogram of PL peak Awavelength in the measurement result shown in FIG. 16B A graph of broken line shown in FIG. 18 shows an oscillation spectrum intensity distribution caused by optical excitation in the semiconductor laser in which the laser oscillation is generated actually. Both graphs can exhibit precise coincidence if they are overlapped with each other. Hence, it may be supposed that the multi-wavelength oscillation is due to the PL wavelength distribution, i.e., uneven composition in the active layer.

Since not only the increase in the threshold current density $J_{th}$ but also deterioration of the optical characteristics, e.g., kink in the I-L characteristic, degradation of near field pattern and far field pattern, etc., are caused by such multi-wavelength oscillation, it becomes important as the optical device light source to suppress composition distribution in the active layer in the InGaN semiconductor laser.

As mentioned above, as a result of the experiment carried out by the inventors of the present invention, it has become clear that, in order to generate the laser oscillation, the PL peak wavelength distribution must be set to less than 150 meV, i.e., within ±0.03 in the In composition ratio. Also, it has become clear that, in order to suppress the multi-wavelength oscillation, the PL peak wavelength distribution must be set to less than 90 meV, i.e., less than ±0.018 in the In composition ratio. Preferably the PL peak wavelength distribution is desired to be set less than 50 meV, and more preferably it should be set less than 20 meV.

Figure 2:
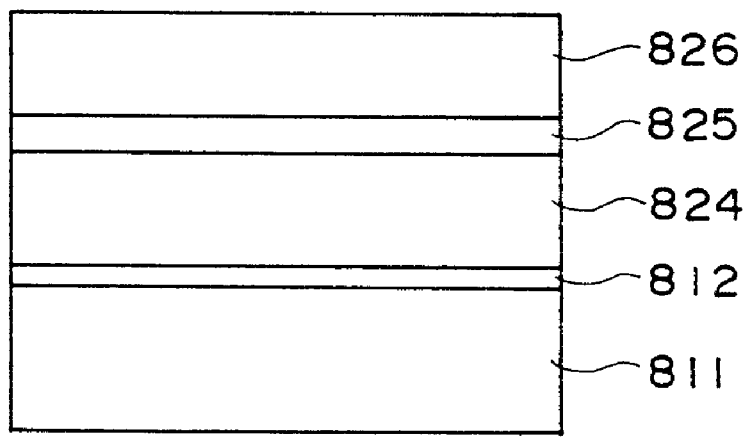
FIG. 2 is a schematic sectional view showing a short wavelength light emitting diode in the prior art.

Furthermore, since the above short wavelength semiconductor light emitting device shown in FIG. 2 is essentially a light emitting diode, the impurity concentration or the thickness as the diode has been set forth. However, there has been no suggestion under what conditions the effective laser oscillation can be generated at the low threshold current density if the above device is employed as the semiconductor laser.

Therefore, embodiments of the present invention will be explained hereinafter.

With reference to FIGS. 9 to 21, first and second embodiments of the present invention which are capable of reducing a threshold current density $J_{th}$ by selecting a thickness of an active layer or a well layer will be explained hereinafter.

At first, dependence of a threshold current density $J_{th}$ on a thickness of the active layer in the first embodiment of the present invention will be explained with reference to FIG. 19 hereinafter before a configuration of a short wavelength semiconductor laser according to a first embodiment of the present invention will be explained in detail with reference to FIG. 20.

Figure 19:
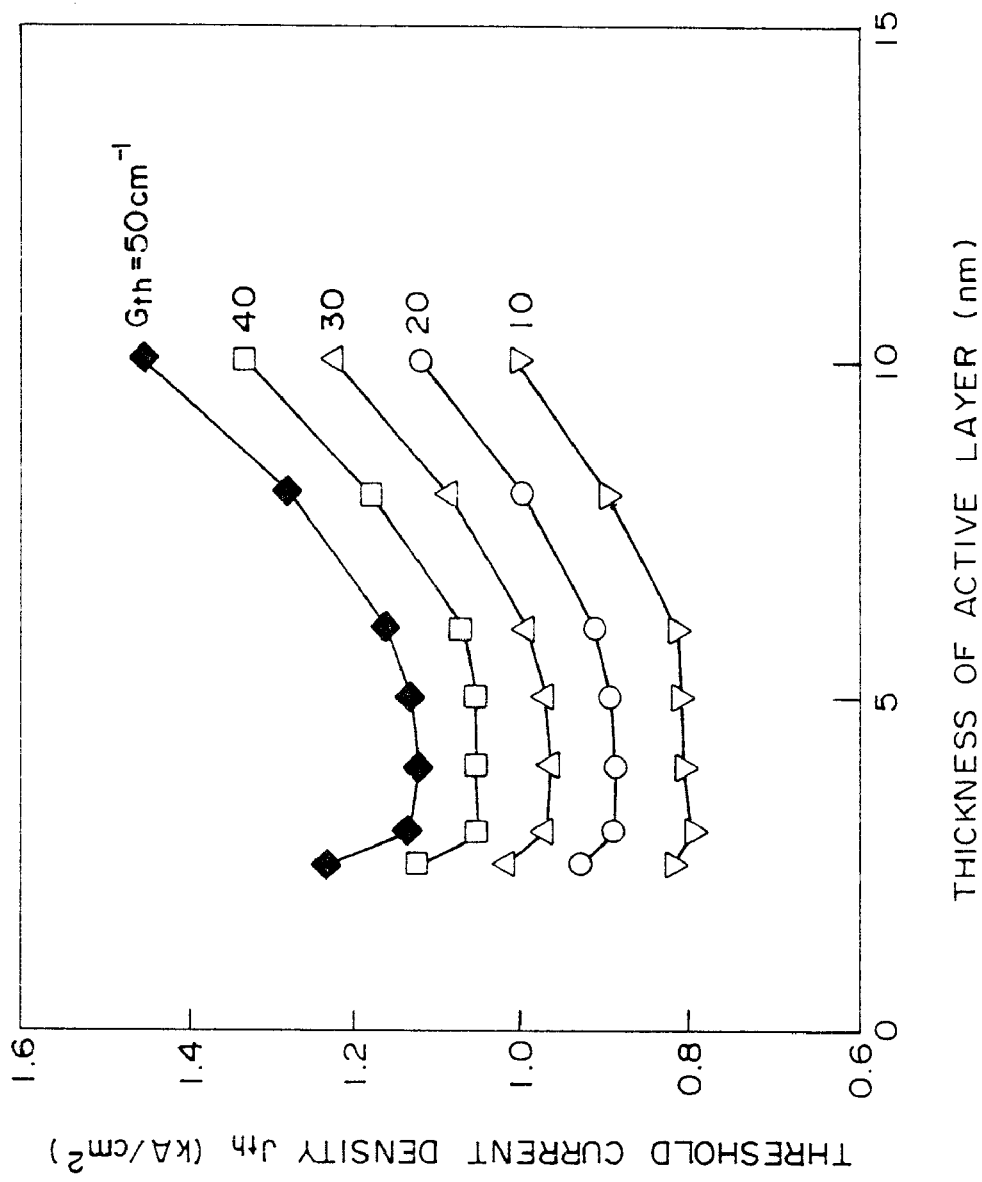
FIG. 19 is a view illustrating dependence of a threshold current density Tth on a thickness of an active layer in a first embodiment of the present invention.
Figure 20:
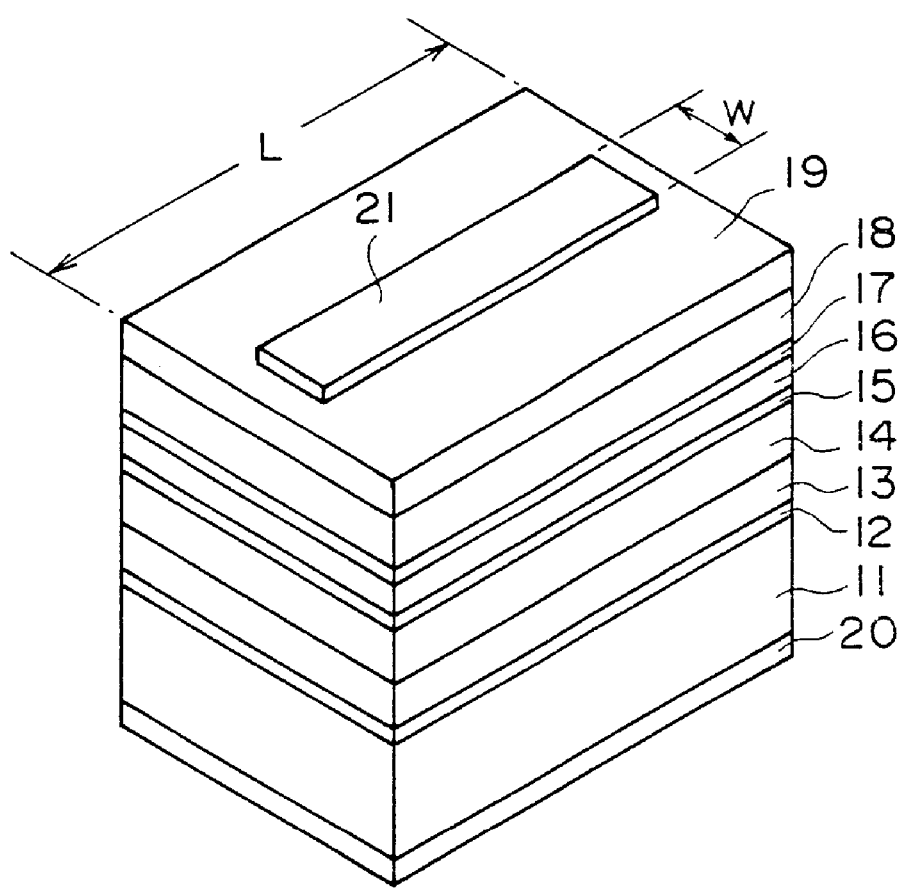
FIG. 20 is a perspective view showing a semiconductor laser according to the first embodiment of the present invention.

FIG. 19 shows calculation results as to dependence of the threshold current density $J_{th}$ on the thickness of the active layer in the case where an $In_{0.15}Ga_{0.85}N$ layer is erployed as the active layer, then GaN optical guiding layers of 0.1 $\mu$m thickness are provided on both sides of the active layer, and then $Al_{0.15}Ga_{0.85}N$ cladding layer are provided on both out sides of the GaN optical guiding layers. These calculation results correspond to an ideal case where there is caused no overflow of electron.

As apparent from FIG. 19, if a thickness of the active layer is less than 3 nm, optical confinement is made insufficiently and thus an optical confinement factor Γ becomes small. Therefore, a threshold Fermi level $E^F_{th}$ is increased and thus a threshold current density $J_{th}$ is also increased.

Where, in FIG. 19, $G_{th}$ denotes a threshold gain.

In contrast, if a thickness of the active layer is more than a 6 nm, the threshold current density $J_{th}$ is increased according to the expression of $J_{th}=N_{th}\cdot d\cdot e/\tau_s$. However, since heavy overflow of electron is caused in this it is important that, the threshold Fermi level $E^F_{th}$ can be reduced if optical confinement is enhanced by increasing the film thickness. As a result, such overflow of electron can be reduced and then the threshold current density $J_{th}$ can be reduced, so that an injection current can be utilized effectively until the thickness of less than 30 nm. In addition, it is preferable that the thickness of the active layer should be set below 10 nm.

Then, manufacturing steps of the semiconductor laser according to the first embodiment of the present invention will be simply explained with reference to FIG. 20. To begin with, an AlGaN buffer layer 12 of 50 to 300 nm, e.g., 100 nm thickness is grown on an n-type SiC substrate 11 made of hexagonal crystal 6H-SiC which has a (0001) plane, i.e., c plane as a principal plane by a MOVPE method, under the condition that a growth pressure is set to 70 to 760 Torr, e.g., 100 Torr and a growth temperature is set to 800 to 1200° C., e.g., 950° C. The MOVPE method employs TMGa (trimethylgallium), TMAl (trimethylaluminum), ammonia, and hydrogen (carrier gas) as a growth gas.

Then, a GaN intermediate layer 13 of 0.1 to 2.0 $\mu$m, e.g., 0.5. $\mu$m thickness is grown by using TMGa, aimonia and the carrier gas, under the condition that the growth pressure is set to 70 to 760 Torr, e.g., 100 Torr and the growth temperature is set to 800 to 1200° C., e.g., 920° C.

Then, an n-type $Al_{0.15}Ga_{0.85}N$ cladding layer 14 of 0.1 to 2.0 $\mu$m, e.g., 0.5 $\mu$m thickness, whose impurity concentration is set to $1.0\times10^{17}$ to $1.0\times10^{20}$ atoms/cm$^3$, e.g., $1.0\times10^{18}$ atoms/cm$^3$, is grown by using TMAl, TMGat ammonia, SiH$_4$ as a dopant, and hydrogen as the carrier gas, under the condition that the growth pressure is set to 70 to 760 Torr, e.g., 100 Torr and the growth temperature is set to 800 to 1200° C., e.g., 950° C.

Then, an undoped GaN optical guiding layer 15 of 10 to 300 nm, e.g., 100 nm thickness is grown by using TMGa, ammonia, and hydrogen as the carrier gas, under the condition that the growth pressure is set to 70 to 760 Torr, e.g., 100 Torr and the growth temperature is set to 800 to 1200° C., e.g., 930° C.

Then, an SQW active layer 16 made of an undoped $In_{0.5}Ga_{0.85}N$ well layer of 3 to 30 nm, e.g., 8 nm thickness, which is sandwiched by undoped $In_{0.05}Ga_{0.95}N$ barrier layers of 1 to 10 nm, e. g., 5 nm thickness, is grown by using TEGa (triethylgalliun), TMAl (trimnethylaluminu), azmmonia and nitrogen as the carrier gas, under the condition that the growth pressure is set to 70 to 760 Torr, e.g., 100 Torr and the growth temperature is set to 550 to 900° C., e.g., 700° C.

Then, a p-type GaN optical guiding layer 17 of 10 to 300 nm, e.g., 100 nm thickness, whose impurity concentration is set to $1.0 \times 10^{17}$ to $1.0 \times 10^{19}$ atoms/cm³, e.g., $5.0 \times 10^{17}$ atoms/cm³, is grown by using TMGat ammonia, biscyclopentadienylmagnesium, and nitrogen as the carrier gas, under the condition that the growth pressure is set to 70 to 760 Torr, e.g., 100 Torr and the growth temperature is set to 800 to 1200° C., e.g., 930° C.

Then, a p-type $Al_{0.15}Ga_{0.85}N$ cladding layer 18 of 0.1 to 2.0 μm, e.g., 0.5 μm thickness, whose impurity concentration is set to $1.0 \times 10^{17}$ to $1.0 \times 10^{19}$ atoms/cm³, e.g., $5.0 \times 10^{17}$ atoms/cm³, is grown by using TMAl, TMGa, amnia, biscyclopentadienylmagnesium, and nitrogen as the carrier gas, under the condition that the growth pressure is set to 70 to 760 Torr, e.g., 100 Torr and the growth temperature is set to 800 to 1200° C., e.g., 950° C.

Then, a p-type GaN contact layer 19 of 0.1 to 2.0 μ, e.g., 0.5 μm thickness, whose impurity concentration is set to $1.0 \times 10^{17}$ to $1.0 \times 10^{19}$ atoms/cm³, e.g., $1.0 \times 10^{18}$ atoms/cm³, is grown by using TMGa, ammonia, biscyclopentadienylmagnesium, and nitrogen as the carrier gas, under the condition that the growth pressure is set to 70 to 760 Torr, e.g., 100 Torr and the growth temperature is set to 800 to 1200° C., e.g., 930° C.

Finally, a Ni electrode 20 of 100 nm thickness is provided as an n-side electrode on aback surface of the n-type SiC substrate 11 and a Ni electrode 21 which has a thickness of 100 nm and a width W of 10 μm is provided as a p-side electrode on the p-type GaN contact layer 19, and then a resultant structure is divided into respective devices to have a resonator length L of 700 μm. As a result, an SQW short wavelength semiconductor laser can be completed.

In this manner, according to the first embodiment of the present invention, the injection current can be employed effectively by forming the active layer as the single SQW structure in contrast to the common sense in the prior art. In addition, if a thickness of the well layer, i.e., the gain layer is set to 8 nm and also an optical confinement efficiency is enhanced by employing the optical guiding layer, the threshold current density $J_{th}$ can be reduced.

More particularly, if the thickness of the gain layer is set to 8 nm or a cavity loss is small, the SQW structure in which the well layer of 8 nm thickness is provided can reduce the threshold current density $J_{th}$ smaller than the MQW structure in which two well layers of 4 nm thickness are provided. Further, since the optical confinement factor Γ becomes small if no optical guiding layer is provided, a light penetration to the cladding layer side so that the threshold current density $J_{th}$ is increased too high.

In the above first embodiment, the thickness of the well layer, i.e., the gain layer has been set to 8 nm. However, es shown in FIG. 19, the thickness may be set more than 3 nm and preferably the thickness of more than 6 nm should be employed. On the contrary, in order to use effectively the injection current, preferably the thickness of less than 30 nm should be employed, and more preferably the thickness should be set below 10 nm.

Figure 21:
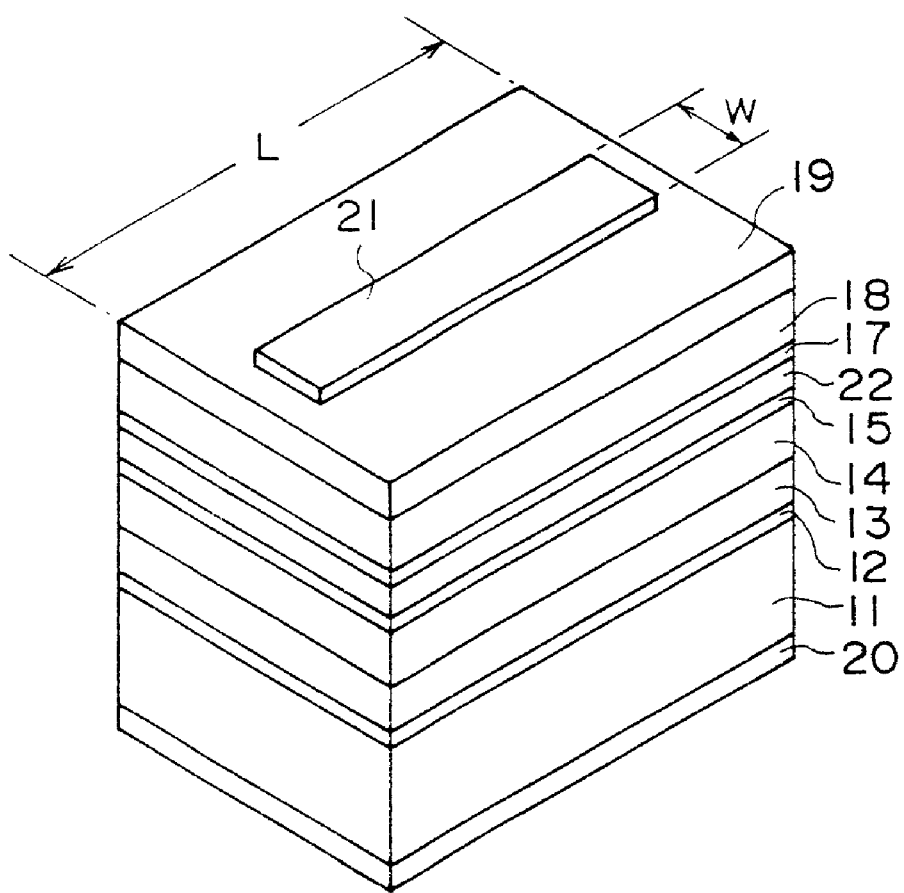
FIG. 21 is a perspective view showing a semiconductor laser according to a second embodiment of the present invention.

Then, an MQW semiconductor laser according to a second embodiment of the present invention will be explained with reference to FIG. 21 hereinbelow.

First of all, like the above first embodiment, the AlGaN buffer layer 12 of 50 to 300 nm, e.g., 100 nm thickness is grown on the n-type SiC substrate 11 made of hexagonal crystal 6H-SiC which has the (0001) plane, i.e., c plane as the principal plane by the MOVPE method, under the condition that the growth pressure is set to 70 to 760 Torr, e.g., 100 Torr and the growth temperature is set to 800 to 1200° C., e.g., 950° C. The MOVPE method employs TMGa, TMAl, ammonia, andhydrogen (carrier gas) as the growth gas.

Then, the GaN intermediate layer 13 of 0.1 to 2.0 μm, e.g. 0.5 μm thickness is grown by using TMGa, aimonia and the carrier gas, under the condition that the growth pressure is set to 70 to 760 Torr, e.g., 100 Torr and the growth temperature is set to 800 to 1200° C., e.g., 920° C.

Then, the n-type Al0.15Ga0.85N cladding layer 14 of 0.1 to 2.0 μm, e.g., 0.5 μm thickness, whose imurity concentration is set to $1.0 \times 10^{17}$ to $1.0 \times 10^{20}$ atoms/cm³, e.g., $1.0 \times 10^{18}$ atoms/cm³, is grown by using TMAl, TMGa, amonia, $SiH_4$ as the dopant, and H2 as the carrier gas, under the condition that the growth pressure is set to 70 to 760 Torr, e.g., 100 Torr and the growth temperature is set to 800 to 1200° C., e.g., 930° C.

Then, the undoped GaN optical guiding layer 15 of 10 to 300 nm, e.g., 100 nm thickness is grown by using TMGa, ammonia, and hydrogen as the carrier gas, under the condition that the growth pressure is set to 70 to 760 Torr, e.g., 100 Torr and the growth temperature is set to 800 to 1200° C., e.g., 930° C.

Then, an MQW active layer 22 is formed by growing undoped $In_{0.05}Ga_{0.95}N$ barrier layers each having a thickness of 1 to 10 nm, e.g., 5 nm and undoped $In_{0.85}Ga_{0.85}N$ well layers each having a thickness of 3 to 30 nm, e.g., 8 nm alternatively such that two or three layers, e.g., two layers, of the undoped $In_{0.15}Ga_{0.85}N$ well layers are deposited, by using TEGa, TMIn, ammonia and nitrogen as the carrier gas, under the condition that the growth pressure is set to 70 to 760 Torr, e.g., 100 Torr and the growth temperature is set to 550 to 900° C., e.g., 700° C.

Then, like the above first embodiment again, the p-type GaN optical guiding layer 17 of 10 to 300 nm, e.g., 100 nm thickness, whose impurity concentration is set to $1.0 \times 10^{17}$ to $1.0 \times 10^{19}$ atoms/cm³, e.g., $5.0 \times 10^{17}$ atoms/cm³, is grown by using TMGa, ammonia, biscyclopentadienylmagnesium, and nitrogen as the carrier gas, under the condition that the growth pressure is set to 70 to 760 Torr, e.g., 100 Torr and the growth temperature is set to 800 to 1200° C., e.g., 930° C.

Then, the p-type $Al_{0.15}Ga_{0.85}N$ cladding layer 18 of 0.1 to 2.0 μm, e.g., 0.5 μm thickness, whose impurity concentration is set to $1.0 \times^{17}$ to $1.0 \times 10^{19}$ atoms/cm³, e.g., $5.0 \times 10^{17}$ atoms/cm³, is grown by using THAl, TMGa, ammonia, biscyclopentadienylmagnesium, and nitrogen as the carrier gas, under the condition that the growth pressure is set to 70 to 760 Torr, e.g., 100 Torr and the growth temperature is set to 800 to 1200° C., e.g., 950° C.

Then, thep-type GaN contact layer 19 of 0.1 to 2.0 μm, e.g., 0.5 μm thickness, whose impurity concentration is set to $1.0 \times 10^{17}$ to $1.0 \times 10^{19}$ atoms/cm³, e.g., $1.0 \times 10^{18}$ atoms/cm³, is grown by using TMGa, ammonia, biscyclopentadienylmagnesium, and nitrogen as the carrier gas, under the condition that the growth pressure is set to 70 to 760 Torr, e.g., 100 Torr and the growth temperature is set to 800 to 1200° C., e.g., 930° C.

Finally, the Ni electrode 20 of 100 nm thickness is provided as the n-side electrode on the back surface of the n-type SiC substrate 11 and the Ni electrode 21 which has a thickness of 100 nm and a width W of 10 μm is provided as the p-side electrode on the p-type GaN contact layer 19, and then a resultant structure is divided into respective devices to have a resonator length L of 700 μm. As a result, an short wavelength light emitting semiconductor laser having SQW structure can be completed.

Figure 5:
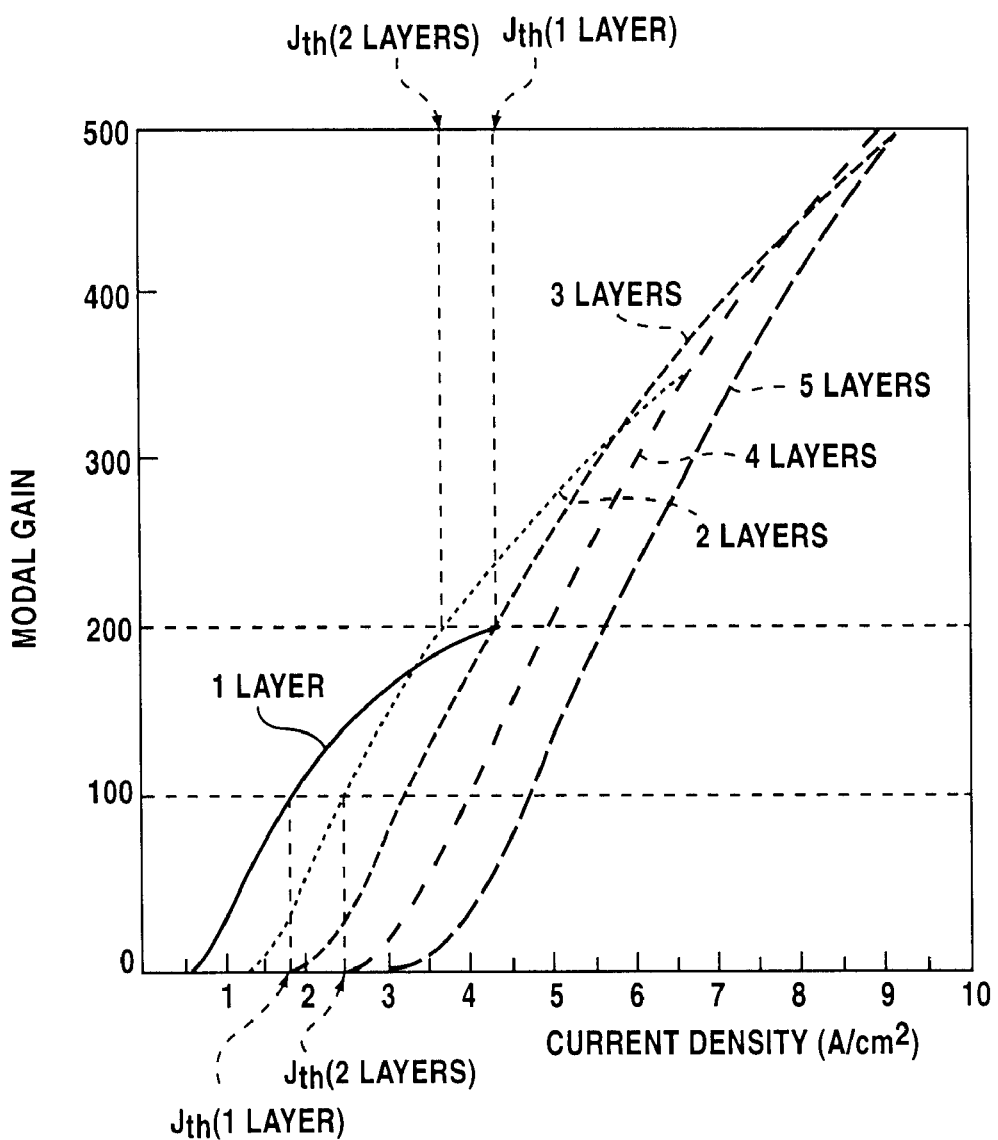
FIG. 5 is a view illustrating odal gain as a function of current density at various number of wells.

In this way, in the second embodiment or the present invention, the active layer has been composed of the MQW structure in which two well layers are employed. However, as evident from FIG. 5, in the case than the cavity loss is large, the threshold current density $J_{th}$ can be reduced by using a plurality of gain layers if a total layer thickness of the gain layer is set to be a fixed value. Also, as evident from FIG. 19, the injection current can be used effectively by employing two or three well layers, so that the threshold current density $J_{th}$ can also be reduced.

Figure 1:
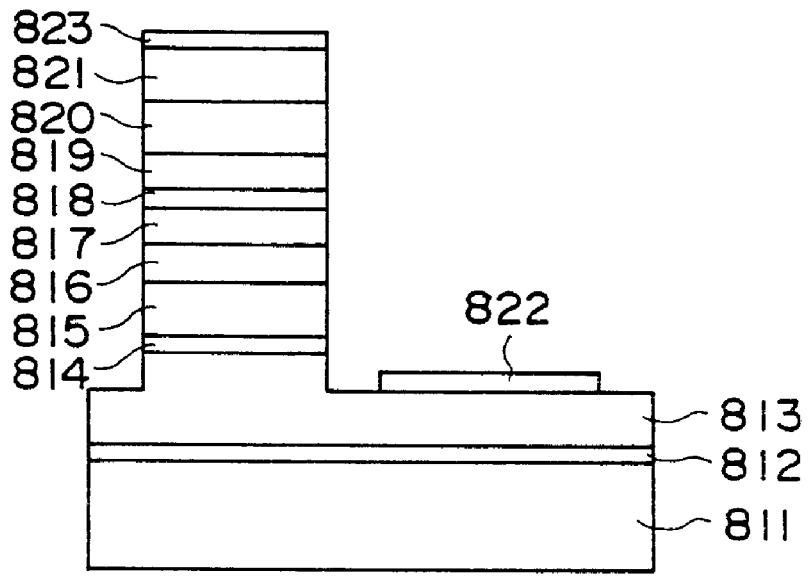
FIG. 1 is a schematic sectional view showing a short wavelength light emitting semiconductor device in the prior art.

For example, in the second embodiment of the present invention, the resonator plane can be easily formed since SiC is employed as the growth substrate. However, if the sapphire substrate is employed like the above prior art shown in FIGS. 1 to 3, the cavity loss becomes large because the resonator plane is formed by dry etching. In such case, it is effective to employ the MQW structure shown in the second embodiment.

In the above explanation of the second embodiment, the thickness of the well layer, i.e., the gain layer has been set to 8 nm. However, as explained in connection with FIG. 19, preferably the thickness should be set to more than 6 nm. Therefore, it is desired that the thickness should be set in the range of 6 to 10 nm.

The first and second embodiments of the present invention have been explained as above, but the present invention is not limited to the configuration set forth in the embodiments. The present invention may be modified or varied within the scope of the technical concept thereof. By way of example, $In_{0.15}Ga_{0.85}N$ has been employed as the gain layer in the above first and second embodiments, a mixed crystal ratio may be changed in the range of $Al_xGa_yIn_{1-x-y}N$ ($0 \leq x < 1$, $0 < y \leq 1$) according to the required wavelength, and correspondingly a mixed crystal ratio of the optical guiding layer and the cladding layer may be changed in the range of $Al_aGa_bIn_{1-a-b}N$ ($0 \leq a \leq 1$, $0 \leq b \leq 1$).

In the first and second ediments of the present invention, the undoped layer has been employed as the gain layer to enhance a hole mobility. Since sometimes impurity is auto-doped inevitably into the undoped layer, an impurity concentration below $1.0 \times 10^{17}$ atoms/cm$^3$ may be allowed as a resultant impurity concentration.

Although the SQW structure using the $In_{0.05}Ga_{0.95}N$ barrier layer has been employed in the above first embodiment, the optical guiding layer maybe employed commonly as the barrier layer without the barrier layer.

In the above first and second embodiments, the optical guiding layer has been formed as the single layer structure, but either the multi-layered structure using semiconductor layers with different composition or graded band gap layers may be employed.

Figure 22:
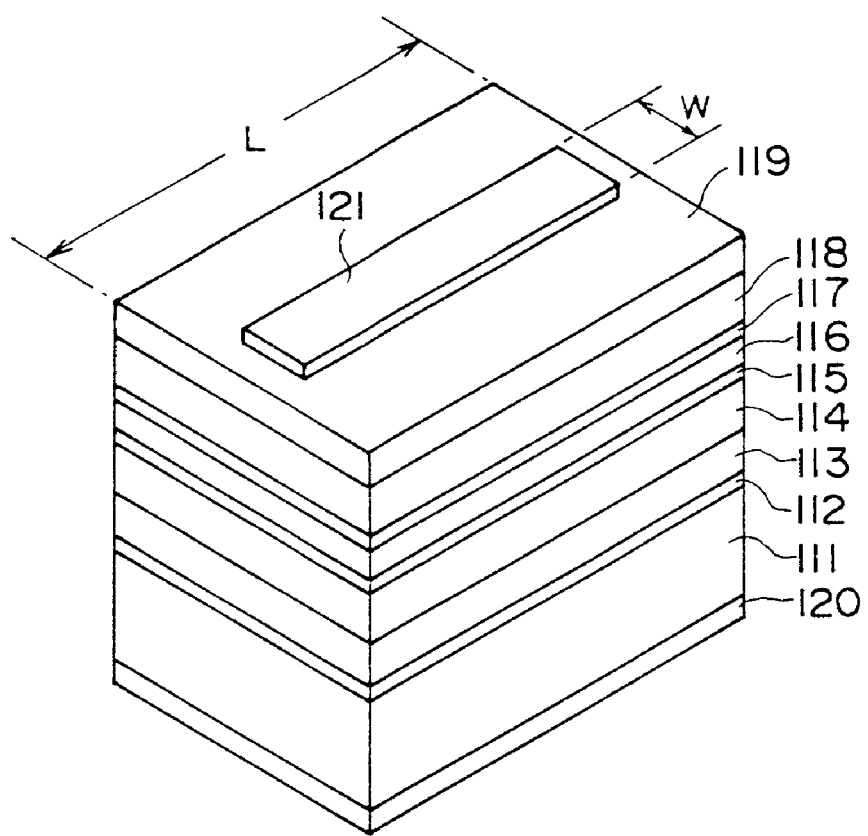
FIG. 22 is a perspective view showing an MQW semiconductor laser according to a third embodiment of the present invention.
Figure 23:
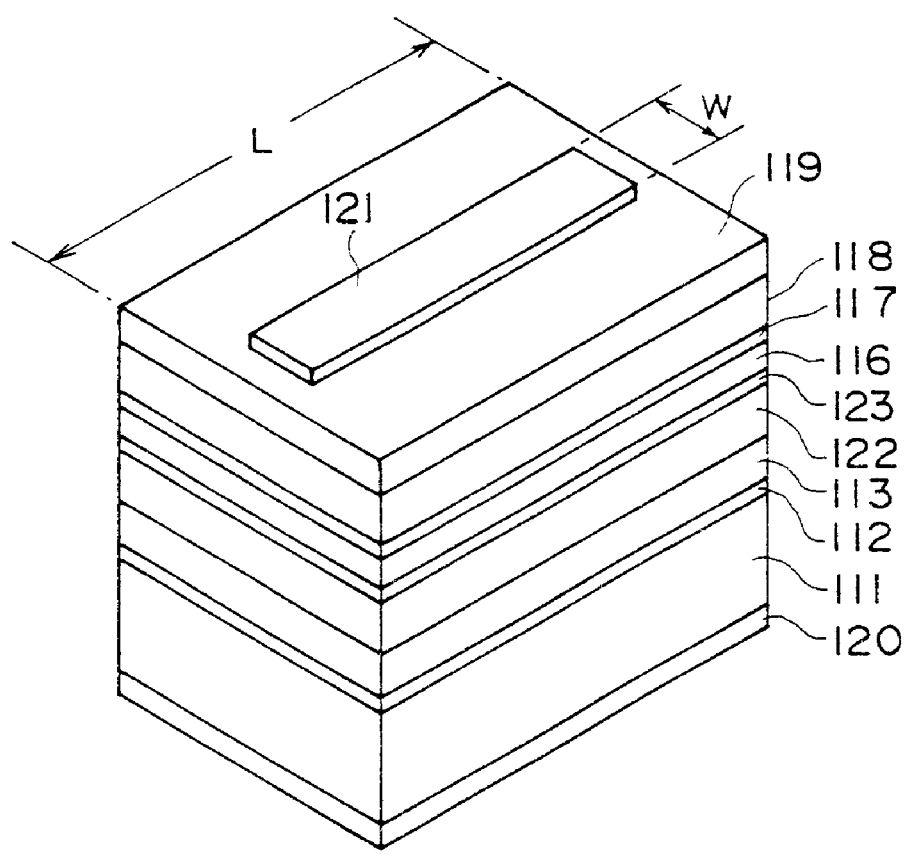
FIG. 23 is a perspective view showing an MQW semiconductor laser according to a fourth embodiment of the present invention.
Figure 24:
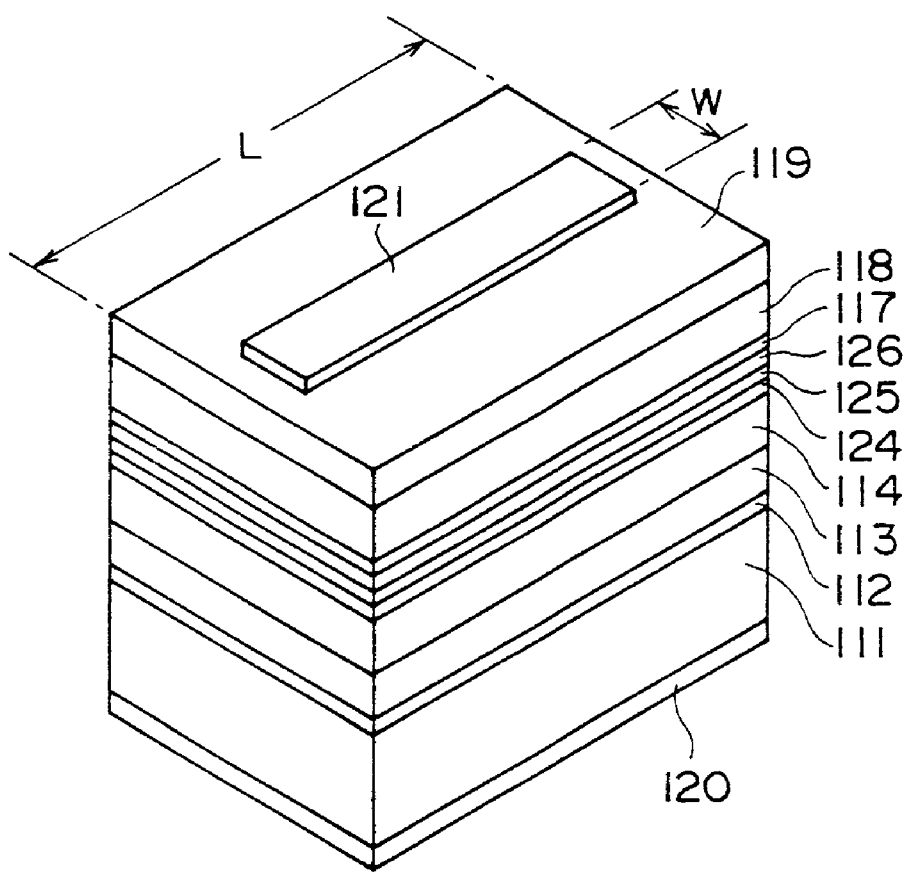
FIG. 24 is a perspective view showing an SQW semiconductor laser according to a fifth embodiment of the present invention.

With reference to FIGS. 22 to 24, third to fifth embodiments of the present invention which are capable of reducing the threshold current density $J_{th}$ by mating a maximum luminous gain position with a maximum position in an emitted light intensity distribution will be explained hereinafter.

First, an MQW short wavelength semiconductor laser according to a third embodiment of the present invention will be explained with reference to FIG. 22 hereinbelow.

At first, an AlGaN buffer layer 112 of 50 to 300 nm, e.g., 100 nm thickness is grown on an n-type SiC substrate 111 made of hexagonal crystal 6H-SiC which has the (0001) plane, i.e., c plane as the principal plane by the MOVPE method using TMGa, TMAl, and ammonia as the growth gas and hydrogen as the carrier gas, under the condition that the growth pressure is set to 70 to 760 Torr, e.g., 100 Torr and the growth temperature is set to 800 to 1200° C., e.g., 950° C.

Then, a GaN intermediate layer 113 of 0.1 to 2.0 μm, e.g., 0.5 μm thickness is grown by using TMGa, ammonia and the carrier gas, under the condition that the growth pressure is set to 70 to 760 Torr, e.g., 100 Torr and the growth temperature is set to 800 to 1200° C., e.g., 920° C.

Then, an n-type $Al_{0.15}Ga_{0.85}N$ cladding layer 114 of 0.1 to 2.0 μm, e.g., 0.5 μm thickness, whose impurity concentration is set to $1.0 \times 10^{17}$ to $1.0 \times 10^{20}$ atoms/cm$^3$, e.g., $1.0 \times 10^{18}$ atoms/cm$^3$, is grown by using TMAl, TMGa, ammonia, SiH$_4$ as the dopant, and H2 as the carrier gas, under the condition that the growth pressure is set to 70 to 760 Torr, e.g., 100 Torr and the growth temperature is set to 800 to 1200° C., e.g., to 950° C.

Then, an undoped $Al_{0.05}Ga_{0.95}N$ optical guiding layer 115 of 10 to 300 nm, e.g., 100 nm thickness is grown by using TMAl, TMGa, ammonia, and hydrogen as the carrier gas, under the condition that the growth pressure is set to 70 to 760 Torr, e.g., 100 Torr and the growth temperature is set to 800 to 1200° C., e.g., 930° C.

Then, an MQW active layer 116 is formed by growing undoped $In_{0.05}Ga_{0.95}N$ barrier layers each having a thickness of 1 to 10 nm, e.g., 5 nm and undoped $In_{0.5}Ga_{0.85}N$ well layers each having a thickness of 3 to 10 nm, e.g., 8 nm alternatively such that two to ten layers, e.g., five layers of the undoped $In_{0.15}Ga_{0.85}N$ well layers are deposited, by using TMGa, TMIn, amonia and N$_2$ as the carrier gas, under the condition that the growth pressure is set to 70 to 760 Torr, e.g., 100 Torr and the growth temperature is set to 550 to 900° C., e.g., 700° C.

Then, a p-type GaN optical guiding layer 117 of 10 to 300 nm, e.g., 100 nm thickness, whose impurity concentration is set to $1.0 \times 10^{17}$ to $1.0 \times 10^{19}$ atoms/cm$^3$, e.g., $5.0 \times 10^{17}$ atoms/cm$^3$, is grown by using TMGa, ammonia, biscyclopentadienylmagnesium, and N$_2$ as the carrier gas, under the condition that the growth pressure is set to 70 to 760 Torr, e.g., 100 Torr and the growth temperature is set to 800 to 1200° C., e.g., 930° C.

Then, a p-type $Al_{0.15}Ga_{0.85}N$ cladding layer 118 of 0.1 to 2.0 μm, e.g., 0.5 μm thickness, whose impurity concentration is set to $1.0 \times 10^{17}$ to $1.0 \times 10^{19}$ atoms/cm$^3$, e.g., $5.0 \times 10^{17}$ atoms/cm$^3$, is grown by using TMAl, TMGa, ammonia, biscyclopentadienylmagnesium, and N$_2$ as the carrier gas, under the condition that the growth pressure is set to 70 to 760 Torr, e.g., 100 Torr and the growth temperature is set to 800 to 1200° C., e.g., 950° C.

Then, a p-type GaN contact layer 119 of 0.1 to 2.0 μm, e.g., 0.5 μm thickness, whose impurity concentration is set to $1.0 \times 10^{17}$ to $1.0 \times 10^{19}$ atoms/cm$^3$, e.g., $1.0 \times 10^{18}$ atoms/cm$^3$, is grown by using TMGa, ammonia, biscyclopentadienylmagnesium, and N$_2$ as the carrier gas, under the condition that the growth pressure is set to 70 to 760 Torr, e.g., 100 Torr and the growth temperature is set to 800 to 1200° C., e.g., 930° C.

Finally, a Ni electrode 120 of 100 nm thickness is provided as the n-side electrode on a back surface of the n-type SiC substrate 111 and a Ni electrode 121 which has a thickness of 100 nm and a width W of 10 μm is provided as the p-side electrode on the p-type GaN contact layer 119, and then a resultant structure is divided into respective devices to have a resonator length L of 700 μm.

Consequently, an short wavelength light emitting semiconductor laser having MQW structure can be finished.

Like the above, according to the third embodiment of the present invention, since the undoped $Al_{0.05}Ga_{0.95}N$ optical guiding layer 115 which has the forbidden bandwidth wider than the p-type GaN optical guiding layer 117 has been employed as the n-side optical guiding layer, a refractive index is made small on the n side. As a result, since the emitted light intensity distribution is shifted to the p side, the maximum position of the emitted light intensity distribution coincides with the maximum gain position in the MQW active layer 116.

Accordingly, since the maximum position of the emitted light intensity distribution can be positioned at a position to generate the maximum optical gain, the optical confinement efficiency can be enhanced and thus the threshold current density $J_{th}$ can be reduced.

Although the undoped $Al_{0.05}Ga_{0.95}N$ optical guiding layer 115 has been employed as the n-side optical guiding layer in the above third embodiment, the present invention is not limited to such composition and composition of the optical guiding layer 115 maybe modified appropriately into any composition. In this case, according to such modification, the thickness may be adjusted appropriately such that the maximum position of the omitted light intensity distribution is placed at a position to generate the maximum optical gain.

Then, an MQW semiconductor laser according to a fourth embodiment of the present invention will be explained with reference to FIG. 23 hereinbelow. Compositions of layers other than an n-type cladding layer and an n-side optical guiding layer are similar to those in the above third embodiment.

To begin with, as in the third embodiment, the AlGaN buffer layer 112 of 50 to 300 nm, e.g., 100 nm thickness and then the GaN intermediate layer 113 of 0.1 to 2.0 μm, e.g., 0.5 μm thickness are grown on the n-type SiC substrate 111 made of hexagonal crystal 6H-SiC which has the (0001) plane, i.e., c plane as the principal plane.

Then, an n-type $Al_{0.2}Ga_{0.8}N$ cladding layer 122 of 0.1 to 2.0 μm, e.g., 0.5 μm thickness, whose impurity concentration is set to $1.0 \times 10^{17}$ to $1.0 \times 10^{20}$ atoms/cm$^3$ e,g. $1.0 \times 10^{18}$ atoms/cm$^3$, is grown under the condition that a flow rate ratio of TMAl is enhanced rather than the third embodiment. Then, supply of TMAl and SiH$_4$ is stopped and then an undoped GaN optical guiding layer 123 of 10 to 300 nm, e.g., 100 nm thickness is grown.

Then, like the above third embodiment, the MQW active layer 116 is foxedby growingundoped $In_{0.05}Ga_{0.95}N$ barrier layers each having a thickness of 1 to 10 nm, e.g., 5 nm and undoped $In_{0.15}Ga_{0.85}N$ well layers each having a thickness of 3 to 10 μm, e.g., 8 nm alternatively such that two to ten layers, e.g., five layers of the undoped $In_{0.15}Ga_{0.85}N$ well layers are deposited.

Then, the p-type an optical guiding layer 117 of 10 to 300 nm, e.g., 100 nm thickness, whose impurity concentration is set to $1.0 \times 10^{17}$ to $1.0 \times 10^{19}$ atoms/cm$^3$, e.g., $5.0 \times 10^{17}$ atoms/cm$^3$; the p-type $Al_{0.15}Ga_{0.85}N$ cladding layer 118 of 0.1 to 2.0 μm, e.g., 0.5 μm thickness, whose impurity concentration is set to $1.0 \times 10^{17}$ to $1.0 \times 10^{19}$ atoms/cm$^3$, e.g., $5.0 \times 10^{17}$ atoms/cm$^3$; and the p-type GaN contact layer 119 of 0.1 to 2.0 μm, e.g., 0.5 μm thickness, whose impurity concentration is set to $1.0 \times 10^{17}$ to $1.0 \times 10^{19}$ atoms/cm$^3$, e.g., $1.0 \times 10^{18}$ atoms/cm$^3$, are grown in order.

Finally, the Ni electrode 120 of 100 nm thickness is provided as the n-side electrode on the back surface of the n-type Sic substrate 111 and the Ni electrode 121 which has the thickness of 100 nm and the width w of 10 μm is provided as the p-side electrode on the p-type GaN contact layer 119, and then a resultant structure is divided into respective devices having the resonator length L of 700 μm. As a consequence, an short wavelength light emitting semiconductor laser having MQW structure can be completed.

In this fashion, according to the fourth embodiment of the present invention, since the optical guiding layers are formed as the symmetric structure but the n-type $Al_{0.2}Ga_{0.8}N$ cladding layer 122 which has the wider forbidden bandwidth than the p-type type $Al_{0.15}Ga_{0.85}N$ cladding layer 118 is employed as the n-type cladding layer, the refractive index becomes small on the n side. Therefore, the emitted light intensity distribution is shifted toward the p side, so that the maximum position of the emitted light intensity distribution coincides with the maximum gain position in the MQW active layer 116.

In this case, there is no need that both always coincide with each other.

Although the n-type $Al_{0.2}Ga_{0.8}N$ cladding layer 122 has been employed as the n-type cladding layer in the above fourth embodiment, the present invention is not limited to this embodiment and thus such composition may be modified or varied appropriately. In this case, according to the modification of composition, the layer thickness, etc. may be adjusted appropriately such that the maximum position of the emitted light intensity distribution can be placed at the position to generate the maximum optical gain.

There is no necessity that the optical guiding layer in this case should always be formed as the symmetric structure, the forbidden bandwidth of the n-side optical guiding layer may set wider than that of the p-side optical guiding layer like the above third embodiment, otherwise the maximum position of the emitted light intensity distribution may be shifted to the p side because of a synergetic effect of the n-side optical guiding layer and the n-type cladding layer.

Then, an SQW semiconductor laser according to a fifth embodiment of the present invention will be explained with reference to FIG. 24 hereinbelow. Remainings except composition of an n-side optical guiding layer, a configuration of an active layer, and an overflow preventing layer are similar to those in the above third embodiment.

First, like the above third embodiment, the AlGaN buffer layer 112 of 50 to 300 nm, e.g., 100 nm thickness, the GaN intermediate layer 113 of 0.1 to 2.0 μm, e.g., 0.5 μm thickness, and the n-type $Al_{0.15}Ga_{0.85}N$ cladding layer 114 of 0.1 to 2.0 μm, e.g., 0.5 μm thickness, whose impurity concentration is set to $1.0 \times 10^{17}$ to $1.0 \times 10^{20}$ atoms/cm$^3$, e.g., $1.0 \times 10^{18}$ atoms/cm$^3$, are grown sequentially on the n-type SiC substrate 111 made of hexagonal crystal 6H-SiC which has the (0001) plane, i.e., c plane as the principal plane.

Then, an undoped $Al_{0.05}Ga_{0.95}N$ optical guiding layer 124 of 10 to 300 nm, e.g., 100 nm thickness is grown, and then an SQW active layer 125 is formed by growing an undoped $In_{0.15}Ga_{0.85}N$ well layer having a thickness of 3 to 10 nm, e.g., 8 nm, which is sandwiched by undoped $In_{0.05}Ga_{0.95}N$ barrier layers each having a thickness of 1 to 10 nm, e.g., 5 nm.

Then, a p-type $Al_{0.2}Ga_{0.8}N$ overflow preventing layer 126 of 5 to 50 nm, e.g., 20 nm thickness, whose impurity concentration is set to $1.0 \times 10^{17}$ to $1.0 \times 10^{19}$ atoms/cm$^3$, e.g., $5.0 \times 10^{17}$ atoms/cm$^3$, is grown.

After this, like the above third embodiment, the p-type GaN optical guiding layer 117 of 10 to 300 nm, e.g., 100 nm thickness, whose impurity concentration is set to $1.0 \times 10^{17}$ to $1.0 \times 10^{19}$ atoms/cm$^3$ e.g., $5.0 \times 10^{17}$ atoms/cm$^3$; the p-type $Al_{0.15}Ga_{0.85}N$ cladding layer 118 of 0.1 to 2.0 μm, eg., 0.5 μm thickness, whose impurity concentration is set to 1.0×

$10^{17}$ to $1.0\times10^{19}$ atoms/cm$^3$, e.g., $5.0\times10^{17}$ atoms/cm$^3$; and the p-type GaN contact layer 119 of 0.1 to 2.0 μm, e.g., 0.5 μm thickness, whose impurity concentration is set to $1.0\times10^{17}$ to $1.0\times10^{19}$ atoms/cm$^3$, e.g., $1.0\times10^{18}$ atoms/cm$^3$, are grown in sequence.

Finally, the Ni electrode 120 of 100 nm thickness is provided as the n-side electrode on the back surface of the n-type SiC substrate 111 and the Ni electrode 121 which has the thickness of 100 nm and the width W of 10 μm is provided as the p-side electrode on the p-type GaN contact layer 119, and then a resultant structure is divided into respective devices having the resonator length L of 700 μm. As a result, an short wavelength light emitting semiconductor laser having SQW structure can be completed.

In the SQW semiconductor laser, because of the presence of the p-type Al$_{0.2}$Ga$_{0.8}$N overflow preventing layer 126 which is provided to prevent overflow of electron and has the wide forbidden bandwidth, the maximum position of the emitted light intensity distribution is shifted toward the n side. However, since the undoped Al$_{0.05}$Ga$_{0.95}$N optical guiding layer 124 which has the forbidden bandwidth wider than that of the p-type GaN optical guiding layer 117 has been employed as the n-side optical guiding layer as mentioned above, influence of the p-type Al$_{0.2}$Ga$_{0.8}$N overflow preventing layer 126 can be canceled. Hence, the emitted light intensity distribution is shifted toward the p side, so that the maximum position of the emitted light intensity distribution coincides substantially with a central position of the SQW active layer 125.

In this case, there is no necessity that both do always coincide with each other.

In the above fifth embodiment, the undoped Al$_{0.05}$Ga$_{0.95}$N optical guiding layer 124 has been employed as the n-side optical guiding layer, but the present invention is not limitedto such composition. According to composition and thickness of the overflow preventing layer, composition and thickness of the optical guiding layer may be adjusted appropriately such that the maximum position of the emitted light intensity distribution can be placed at the center position of the SQW active layer 125.

In the above fifth embodiment, an influence of the p-type Al$_{0.2}$Ga$_{0.8}$N overflow preventing layer 126 has been canceled by the n-side optical guiding layer. However, such influence may be canceled by setting the forbidden bandwidth of the n-side cladding layer wider than that of the p-type cladding layer.

In this case, the optical guiding layer is not always formed as the syrmetric structure. The influence of the p-type Al$_{0.2}$Ga$_{0.8}$N overflow preventing layer 126 may be canceled by the synergetic effect of the n-side optical guiding layer and the n-type cladding layer if the forbidden bandwidth of the n-side optical guiding layer is set wider than that of the p-side optical guiding layer.

The third and fifth embodiments of the present invention have been explained as above, but the present invention is not limited to the conditions set forth in the enbodiments. For example, the MQW structure or the SQW structure made of In$_{0.15}$Ga$_{0.85}$N/In$_{0.05}$Ga$_{0.95}$N has been employed as the active layer in the explanation of the above third and fifth embodiments, a mixed crystal ratio may be changed in the range of Al$_x$Ga$_y$In$_{1-x-y}$N ($0\leq x<1$, $0<y\leq 1$) according to the required wavelength, and correspondingly a mixed crystal ratio of the optical guiding layer and the cladding layer may be changed in the range of Al$_a$Ga$_b$In$_{1-a-b}$N ($0\leq a\leq 1$, $0\leq b\leq 1$).

In the above third and fifth embodiments, thickness of the p-side optical guiding layer and the n-side optical guiding layer have been set equally, but the thickness of the p-side optical guiding layer may be set thicker than the n-side optical guiding layer. For instancer the thickness of the p-side optical guiding layer may be set thicker by 10 to 100 nm, e.g., 50 nm than the n-side optical guiding layer to form an asymmetric light guide structure. In this event, composition of the p-side optical guiding layer may be set to be identical to that of the n-side optical guiding layer.

In the above third and fifth embodiments, the optical guiding layer has been formed as the single layer structure, but the multi-layered structure or graded band gap structure employing semiconductor layers having different composition maybe employed. For example, in the case of the fifth embodiment, the n-side optical guiding layer may be composed or a two-layer structure consisting of the undoped GaN optical guiding layer of 100 nm thickness and the undoped Al$_{0.2}$Ga$_{0.8}$N optical guiding layer of 20 nm from the n-type cladding layer side.

Next, with reference to FIGS. 25 to 30B, sixth to eleventh embodiments of the present invention which are capable of reducing the threshold current density J$_{th}$ by enhancing a hole mobility in a p-side optical guiding layer or reducing recombination probability in a p-side optical guiding layer will be explained hereinafter.

Figure 25:
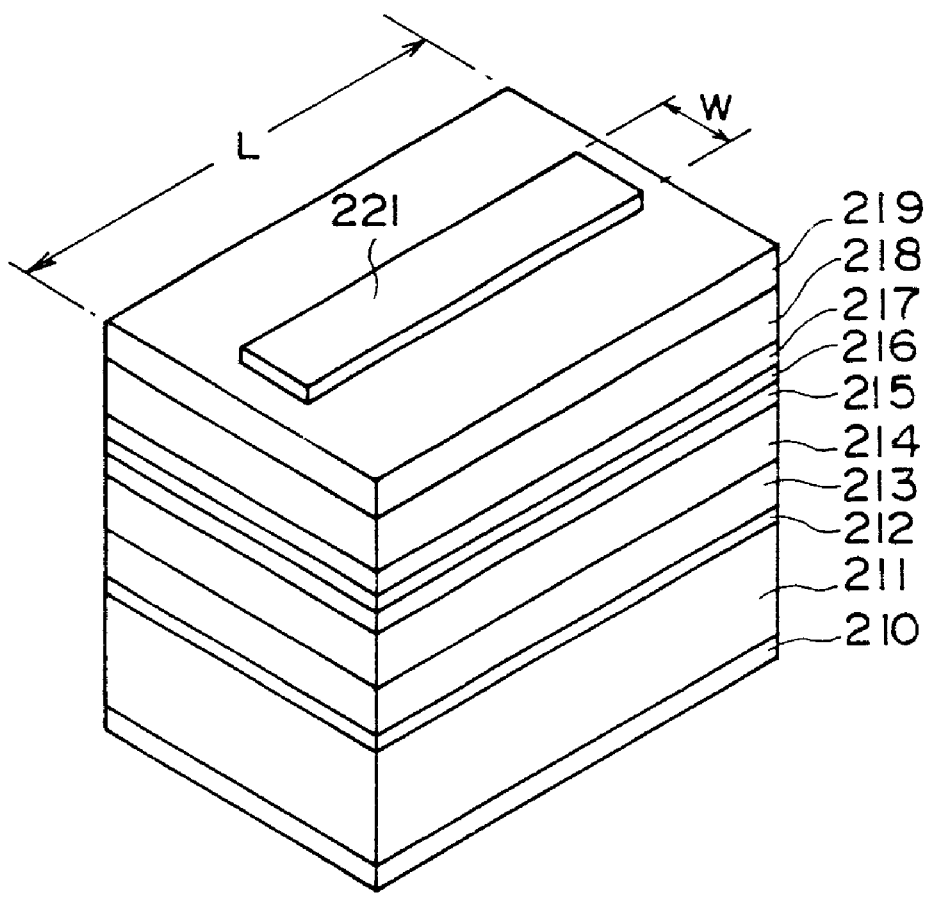
FIG. 25 is a perspective view showing an SQW semiconductor laser according to a sixth embodiment of the present invention.

First, an SQW short wavelength semiconductor laser according to a sixth embodiment of the present invention will be explained with reference to FIG. 25 hereinbelow.

To begin with, an AlGaN buffer layer 212 of 50 to 300 nm, e.g., 50 nm thickness is grown on an n-type SiC substrate 211 made of hexagonal crystal 6H-SiC which has the (0001) plane, i.e., c plane as the principal plane by the MOVPE method( under the condition that the growth pressure is set to 70 to 760 Torr, e.g., 100 Torr and the growth temperature is set to 800 to 1200° C., e.g., 950° C. TMGa, TMAl, ammonia, and hydrogen as the carrier gas are employed as the growth gas in the MOVPE method.

Then, a GaN intermediate layer 213 of 0.1 to 2.0 μm, e.g., 0.5 μm thickness, whose impurity concentration is set to $5\times10^{17}$ to $1\times10^{19}$ atoms/cm$^3$, e.g., $2\times10^{18}$ atoms/cm$^3$, is grown by using TMGa, ammonia, SiH as a dopant source, and hydrogen. as the carrier gas, under the condition that the growth pressure is set to 70 to 760 Torre e.g., 100 Torr and the growth temperature is set to 800 to 1200° C., e.g., 920° C.

Then, an n-type Al$_{0.15}$Ga$_{0.85}$N cladding layer 214 of 0.1 to 2.0 μm, e.g., 0.5 μm thickness, whose impurity concentration is set to $1.0\times10^{17}$ to $1.0\times10^{20}$ atoms/cm$^3$, e.g., $1.0\times10^{18}$ atoms/cm$^3$, is grown by using TMAl, TMGa, ammonia, SiH$_4$ as the dopant source, and hydrogen as the carrier gas, under the condition that the growth pressure is set to 70 to 760 Torr, e.g., 100 Torr and the growth temperature is set to 800 to 1200° C.

Then, an undoped GaN optical guiding layer 215 of 10 to 300 nm, e.g., 100 nm thickness is grown by using TMGa, ammonia, and hydrogen as the carrier gas, under the condition that the growth pressure is set to 70 to 760 Torr, e.g., 100 Torr and the growth temperature is set to 800 to 1200° C., e.g., 930° C.

Then, an SQW active layer 216 made or an undoped In$_{0.15}$Ga$_{0.85}$N well layer of 3 to 30 nm, e.g., 5 nm thickness, which is sandwiched by undoped In$_{0.05}$Ga$_{0.95}$N barrier layers of 1 to 10 nm, e.g., 5 nm thickness, is grown by using TMGa, TMIn, ammonia and N$_2$ as the carrier gas, under the condition that the growth pressure is set to 70 to 760 Torr, e.g., 100 Torr and the growth temperature is set to 550 to 900° C., e.g., 700° C.

Then, an undoped GaN optical guiding layer 217 of 10 to 300 nm, e.g., 100 nm thickness is grown by using TMGa ammonia, and $N_2$ as the carrier gas, under the condition that the growth pressure is set to 70 to 760 Torr, e.g., 100 Torr and the growth temperature is set to 800 to 1200° C., e.g., 1130° C.

Then, a p-type $Al_{0.15}Ga_{0.85}N$ cladding layer 218 of 0.1 to 2.0 μm, e.g., 0.5 μm thickness, whose impurity concentration is set to $1.0 \times 10^{17}$ to $1.0 \times 10^{19}$ atoms/cm$^3$, e.g., $2.0 \times 10^{17}$ atoms/cm$^3$, is grown by using TMAl, TMGa, ammonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 950° C.

Then, a p-type GaN contact layer 219 of 0.1 to 2.0 μm. e.g., 0.5 μm thickness, whose impurity concentration is set to $1.0 \times 10^{17}$ to $1.0 \times 10^{19}$ atoms/cm$^3$, e.g., $1.0 \times 10^{18}$ atoms/cm$^3$, is grown by using TMGa, amonia, bis yclopentadienylmagnesium, and $N_2$ as the carrier gas, under the condition that the growth pressure is set to 70 to 760 Torr, e.g., 100 Torr and the growth temperature is set to 800 to 1200° C., e.g., 930° C.

In the end, a Ni electrode 220 of 100 nm thickness is provided as the n-side electrode on the back surface of the n-type SiC substrate 211 and a,Ni electrode 221 which has a thickness of 100 nm and a width W of 3 μm is provided as the p-side electrode on the p-type GaN contact layer 219, and then a resultant structure is divided into respective devices to have a resonator length L of 700 μm, whereby an short wavelength light emitting semiconductor laser having a SQW structure can be completed.

In the sixth erbodiment of the present invention, the p-side optical guiding layer is composed of the undoped layer in contrast to the common sense in the prior art. Hence, because there is no scattering of the carrier due to impurity, hole mobility can be improved and therefore improvement of a hole injection efficiency can be expected.

If the p-side optical guiding layer is formed of the undoped layer, there is caused no degradation of the crystal quality according to doping of the impurity. Accordingly, recombination which do not contribute the laser oscillation in the p-side optical guiding layer can be extremely reduced.

As a result, since the reactive current in the p-side optical guiding layer can be reduced, the short wavelength semiconductor laser having the low threshold current density can be fabricated. In addition, since heat generation due to the reactive current can be suppressed, reliability of the short wavelength semiconductor laser can be improved.

In this came, pure undoping is not always requested as this undoping, and therefore impurity may be contained to some degree in the growth process. For instance, any impurity concentration may be employed if the hole mobility of more than 2 cm$^2$/V·s which enables the laser oscillation can be obtained. For example, the impurity concentration of less than $1.0 \times 10^{17}$ atoms/cm$^3$ may be employed.

Figure 26:
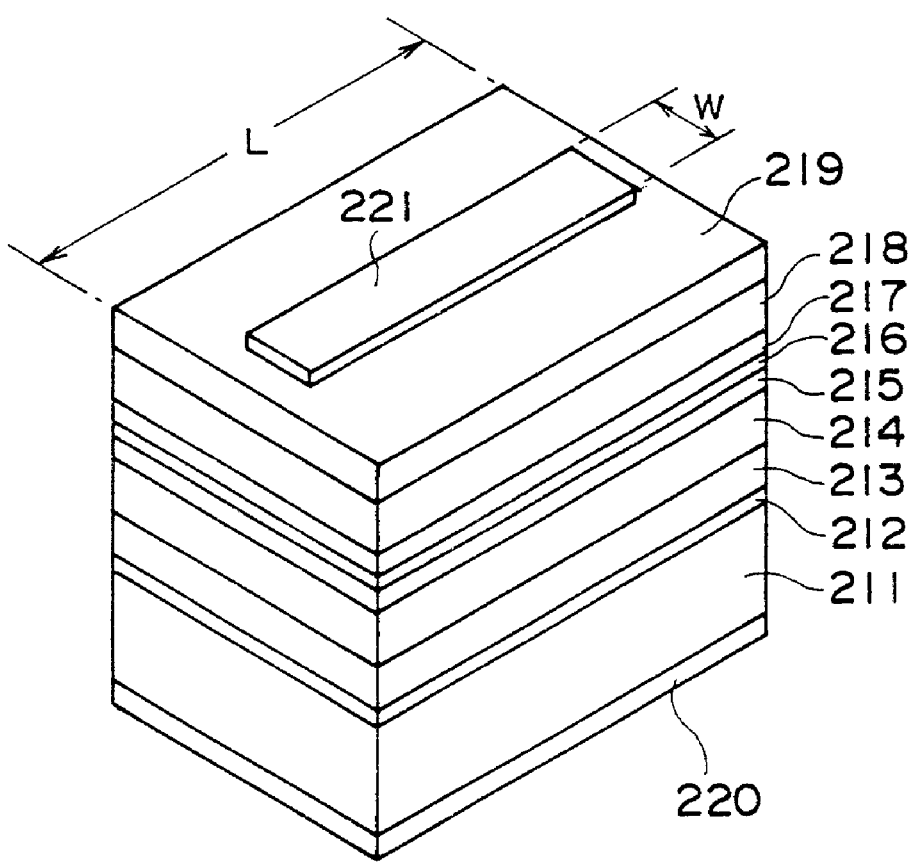
FIG. 26 is a perspective view showing an SQW semiconductor laser according to a seventh embodiment of the present invention.

Then, an SQW semiconductor laser according to a seventh embodiment of the present invention will be explained with reference to FIG. 26 hereinbelow.

In this seventh embodiment, since remainings except a thickness of a p-side optical guiding layer are fully identical to those in the above sixth embodiment, explanations of their manufacturing method will be omitted.

First, like the above sixth embodiment, the AlGaN buffer layer 212 of 50 to 300 nm, e.g., 50 nm thickness; the n-type Si-doped GaN intermediate layer 213 of 0.1 to 2.0 μm, e.g., 0.5 μm thickness, whose impurity concentration is set to $5 \times 10^{17}$ to $1 \times 10^{19}$ atoms/cm$^3$ e.g., $2 \times 10^{18}$ atoms/cm$^3$; and the n-type Si-doped $Al_{0.15}Ga_{0.85}N$ cladding layer 214 of 0.1 to 2.0 μm, e.g., 0.5 μm thickness, whose impurity concentration is set to $1.0 \times 10^{17}$ to $1.0 \times 10^{20}$ atoms/cm$^3$, e.g., $1.0 \times 10^{18}$ atoms/cm$^3$ are grown sequentially on the n-type sic substrate 211 made of hexagonal crystal 6H-SiC which has the (0001) plane, i.e., c plane as the principal plane.

Then, the undoped GaN optical guiding layer 215 having a thickness tn of 10 to 300 nm, e.g., 100 nm is grown. Then, the SQW active layer 16 is formedbygrowing the undoped $In_{0.15}Ga_{0.85}N$ well layer of 3 to 30 nm, e.g., 5 nm thickness, which is sandwiched by undoped $In_{0.05}Ga_{0.95}N$ barrier layers of 1 to 10 nm, e.g., 5 nm thickness.

Then, the undoped GaN optical guiding layer 217 having a thickness tp of less than 100 nm, e.g., 80 nm; the p-type Mg-doped $Al_{0.5}Ga_{0.85}N$ cladding layer 218 of 0.1 to 2.0 μm, e.g., 0.5 μm thickness, whose impurity concentration is set to $1.0 \times 10^{17}$ to $1.0 \times 10^{19}$ atoms/cm$^3$, e.g., $2.0 \times 10^{17}$ atoms/cm$^3$; and the p-type Mg-doped GaN contact layer 219 of 0.1 to 2.0 μm, e.g., 0.5 μm thickness, whose impurity concentration is set to $1.0 \times 10^{17}$ to 10 to $1.0 \times 10^{19}$ atoms/cm$^3$, e.g., $1.0 \times 10^{18}$ atoms/cm$^3$ are grown sequentially.

Finally, the Ni electrode 220 of 100 nm thickness is provided as the n-side electrode on the back surface of the n-type SiC substrate 211 and the Ni electrode 221 which has a thickness of 100 nm and a width W of 3 μm is provided as the p-side electrode aon the p-type GaN contact layer 219, and then a resultant structure is divided into respective devices to have the resonator length L of 700 μm. As a consequence, an short wavelength light emitting semiconductor laser having a SQW structure can be provided.

In this seventh embodiment, since the thickness $t_p$ of the p-side optical guiding layer is set thinner than the thickness $t_n$ of the n-side optical guiding layer, i.e., $t_p < t_n$, recombination current probability in the p-side optical guiding layer can be reduced. Therefore, since the reactive current can be reduced, the threshold current density $J_{th}$ can also be reduced.

In particular, if the thickness tp of the p-side optical guiding layer is set below 100 nm (below 0.1 μm), more preferably, less than 0.08 μm (less than 80 nm), recombination current probability in the p-side optical guiding layer can be reduced. Hence, since the reactive current can be reduced, the threshold current density $J_{th}$ can also be reduced.

If the thickness tp of the p-side optical guiding layer is set below 100 nm, $t_p = t_n$ may be adopted. Therefore, asymmetry of the light guide structure can be corrected.

In this case, the composition of the p-side optical guiding layer is not always set equally to the composition of the n-side optical guiding layer. If both compositions are set such that the forbidden bandwidth of the p-side optical guiding layer becomes wider than that of the n-side optical guiding layer, overflow of the electron can be prevented. In contrast, if both compositions are so set that the forbidden bandwidth of the n-side optical guiding layer becomes wider than that of the p-sice optical guiding layer, asymmetry of the light guide structure due to the thinner thickness of the p-side optical guiding layer can be corrected.

In the seventh embodiment, since the p-side optical guiding layer has been formed of the undoped layer, the advantageous effect of improvement of the hole mobility can also be achieved like the sixth embodiment. In this case, the p-side optical guiding layer may be formed of the p-type doped layer.

Then, an eighth embodiment of the present invention will be explained with reference to FIGS. 27A and 27B hereinbelow.

FIG. 27A is a perspective view showing an SQW semiconductor laser according to the eighth embodiment of the present invention, and FIG. 27B is a view showing a band gap structure in the neighborhood of an active layer in the SQW semiconductor laser in FIG. 27A.

In this eighth embodiment, since remainings other than configurations of an n-side optical guiding layer and a p-side optical guiding layer are substantially identical to those in the above sixth embodimernt, explanations as with their manufacturing method will be omitted.

First of all, similar to the sixth embodiment, the AlGaN buffer layer 212 of 50 to 300 nm, e.g., 50 nm thickness; the n-type Si-doped GaN intermediate layer 213 of 0.1 to 2.0 μm, e.g., 0.5 μm thickness, whose impurity concentration is set to $5\times10^{17}$ to $1\times10^{19}$ atoms/cm$^3$, e.g., $2\times10^{18}$ atoms/cm$^3$; and the n-type Si-doped $Al_{0.15}Ga_{0.85}N$ cladding layer 214 of 0.1 to 2.0 μm, e.g., 0.5 μm thickness, whose impurity concentration is set to $1.0\times10^{17}$ to $1.0\times10^{20}$ atoms/cm$^3$, e.g., $1.0\times10^{18}$ atoms/cm$^3$, are grown in sequence on the n-type SiC substrate 211 made of hexagonal crystal 6H-SiC which has the (0001) plane, i.e., c plane as the principal plane.

Then, an undoped $Al_{0.05}Ga_{0.95}N$ optical guiding layer 222 of 10 to 100 nm, e.g., 50 nm thickness, and an undoped $In_{0.03}Ga_{0.97}N$ optical guiding layer 223 of 10 to 100 nm, e.g. 50 nm thickness are grown in sequence. Then, the SQW active layer 216 is formed by growing the undoped $In_{0.15}Ga_{0.85}N$ well layer of 3 to 30 nm, e. g., 5 nm thickness, which is sandwiched by undoped $In_{0.15}Ga_{0.95}N$ barrier layers each having a thickness of 1 to 10 nm, e.g., 5 nm.

Then, an udoped $In_{0.03}Ga_{0.97}N$ optical guiding layer 224 of 10 to 100 nm, e.g., 50 nm thickness; a p-type Mg-doped $Al_{0.05}Ga_{0.95}N$ optical guiding layer 225 of 10 to 100 nm, e.g., 50 nm thickness, whose impurity concentration is set to $1.0\times10^{17}$ to $1.0\times10^{19}$ atoms/cm$^3$, e.g., $5\times10^{17}$ atoms/cm$^3$; the p-type Mg-doped $Al_{0.15}Ga_{0.85}N$ cladding layer 218 of 0.1 to 2.0 μm, e.g., 0.5 μm thickness, whose impurity concentration is set to $1.0\times10^{17}$ to $1.0\times10^{19}$ atoms/cm$^3$, e.g., $1.0\times10^{17}$ atoms/cm$^3$; and the p-type Mg-dopedGaN contact layer 219 of 0.1 to 2.0 μm, e.g., 0.5 μm thickness, whose impurity concentration is set to $1.0\times10^{17}$ to $1.0\times10^{19}$ atoms/cm$^3$, e.g., $1.0\times10^{18}$ atoms/cm$^3$, are grown in sequence.

Finally, the Ni electrode 220 of 100 nm thickness is provided as the n-side electrode on the back surface of the n-type SiC substrate 211 and the Ni electrode 221 which has the thickness of 100 nm and the width W of 3 μm is provided as the p-side electrode on the p-type GaN contact layer 219, and then a resultant structure is divided into respective devices to have the resonator length L of 700 gm. As a result, an short wavelength light emitting semiconductor laser having a SQW structure can be completed.

In this eighth embodiment, as shown in FIG. 27B, the n-side optical guiding layer and the p-side optical guiding layer have been composed of two-layered structure having different forbidden bandwidths respectively, and the forbidden bandwidths located on the side adjacent to the cladding layers respectively have been set wider. lience, the p-type $Al_{0.05}Ga_{0.95}N$ optical guiding layer 225 constituting the p-side optical guiding layer can also function as the overflow preventing layer for electron, so that leakage of electron into the p-type $Al_{0.05}Ga_{0.95}N$ optical guiding layer 225 or the p-type cladding layer can be reduced while keeping optical confinement necessary for the laser oscillation, Thus, because the reactive current can be reduced, the threshold current density $J_{th}$ can also be reduced.

Although the p-side optical guiding layer having the wider forbidden bandwidth has been composed of the p-type layer in the eighth embodiment, it may be composed of the undoped layer like the above sixth embodiment, so that the hole mobility can be enhanced. In addition, the p-side optical guiding layer or the n-side optical guiding layer may be composed of the multi-layered structure such as three layers or more. In this case, the layer number of the p-side optical guiding layer and the n-side optical guiding layer may not always be set to be equal.

Then, a ninth embodiment of the present invention will be explained with reference to FIGS. 28A and 28B hereinafter.

FIG. 28A is a perspective view showing an SQW semiconductor laser according to a ninth embodiment of the present invention, and FIG. 28B is a view showing a band gap structure in the neighborhood of an active layer in the SQW semiconductor laser in FIG. 26A.

In this ninth embodiment, since remainings other than a configuration of an nside optical guiding layer are identical to those in the above third embodiment, explanations concerning their manufacturing method will be omitted.

First, like the first embodiment, the AlGaN buffer layer 212 of 50 to 300 nm, e.g., 50 nm thickness; the n-type Si-doped GaN intermediate layer 213 of 0.1 to 2.0 m, e.g., 0.5 μm thickness, whose impurity concentration is set to $5\times10^{17}$ to $1\times10^{19}$ atoms/cm$^3$, e.g., $2\times10^{18}$ atoms/cm$^3$; and the n-type Si-doped $Al_{0.15}Ga_{0.85}N$ cladding layer 214 of 0.1 to 2.0 μm, e.g., 0.5 μm thickness, whose impurity concentration is set to $1.0\times10^{17}$ to $1.0\times10^{20}$ atoms/cm$^3$, e.g., $1.0\times10^{18}$ atoms/cm$^3$, are grown in sequence on the n-type SiC substrate 211 made of hexagonal crystal 6H-SiC which has the (0001) plane, i.e., c plane as the principal plane.

Then, an Gap optical guiding layer 226 of 10 to 300 nm, e.g., 100 nm thickness is grown. Then, the SQW active layer 216 is formed by growing the undoped $In_{0.15}Ga_{0.85}N$ well layer of 3 to 30 nm, e.g., 5 nm thickness, which is put between undoped $In_{0.05}Ga_{0.95}N$ barrier layers each having a thickness of 1 to 10 nm, e.g., 5 nm.

Then, the undopqd $In_{0.03}Ga_{0.97}N$ optical guiding layer 224 of 10 to 100 nm, e.g., 50 nm thickness; the p-type Mg-doped $Al_{0.05}Ga_{0.95}N$ optical guiding layer 225 of 10 to 100 nm, e.g., 50 nm thickness, whose impurity concentration is set to $10\times10^{17}$ to $1.0\times10^{19}$ atoms/cm$^3$, e.g., $2\times10^{17}$ atoms/cm$^3$; the p-type Mg-doped $Al_{0.15}Ga_{0.85}N$ cladding layer 218 of 0.1 to 2.0 μm, e.g., 0.5 μpm thickness, whose impurity concentration is set to $1.0\times10^{17}$ to $1.0\times10^{19}$ atoms/cm$^3$, e.g., $1.0\times10^{18}$ atoms/cm$^3$; and the p-type Mg-doped GaN contact layer 219 of 0.1 to 2.0 μm, e.g., 0.5 μm thickness, whose impurity concentration is set to $1.0\times10^{17}$ to $1.0\times10^{19}$ atoms/cm$^3$, e.g., $1.0\times10^{18}$ atoms/cm$^3$, are grown in sequence.

Finally, the Ni electrode 220 of 100 nm thickness is provided as the n-side electrode on the back surface of the n-type SiC substrate 211 and also the Ni electrode 221 which has the thickness of 100 nm and the width W of 3 μm is provided as the p-side electrode on the p-type GaN contact layer 219. Then, a resultant structure is divided into respective devices to have the resonator length L of 700 μm. As a result, an short wavelength light emitting semiconductor laser having a SQW structure can be completed.

According to the ninth embodiment, since the n-side optical guiding layer has been composed of the single layer, film forming steps can be reduced. Also, since composition of the n-side optical guiding layer is set to obtain the middle forbidden bandwidth of the p-side optical guiding layer, asymmetry of the light guide structure can be corrected even if the single layer is employed. Accordingly, since the maximum position of the emitted light intensity distribution can be placed at the position to generate the maximum optical gain, the threshold current density $J_{th}$ can be reduced.

Also, in this case, the p-type $Al_{0.05}Ga_{0.95}N$ optical guiding layer 225 constituting the p-side optical guiding layer can also function as the overflow preventing layer for electron, so that leakage of electron into the p-type $Al_{0.05}Ga_{0.95}N$ optical guiding layer 225 or the p-type cladding layer can be reduced while keeping the optical confinement necessary for the laser oscillation. Accordingly, because the reactive current can be reduced, the threshold current density $J_{th}$ can also be reduced.

In the ninth embodiment, as shown in FIG. 28B, the p-side optical guiding layer having the wider forbidden bandwidth has been formed of the p-type layer, it may be composed of the undoped layer like the above sixth embodiment. As a result, the hole mobility can be enhanced. In addition, the p-side optical guiding layer may be formed of the multi-layered structure such as three layers or more.

In turn, a tenth embodiment of the present invention will be explained with reference to FIGS. 29A and 29B hereinafter.

FIG. 29A is a perspective view showing an SQW semiconductor laser according to a tenth embodiment of the present invention, and FIG. 29B is a view showing a band gap structure in the neighborhood of the SQW semiconductor laser in FIG. 29A.

In this tenth embodiment, since rerainings other than configurations of an n-side optical guiding layer and a p-side optical guiding layer are identical to those in the above sixth embodiment, explanations as for their manufacturing method will be almost omitted.

First, as in the above sixth embodiment, the AlGaN buffer layer 212 of 50 to 300 nm, e.g., 50 nm thickness; the n-type Si-doped GaN intermediate layer 213 of 0.1 to 2.0 μm, e.g., 0.5 μm thickness, whose impurity concentration is set to $5\times10^{17}$ to $1\times10^{19}$ atoms/cm$^3$, e.g., $2\times10^{18}$ atoms/cm$^3$; and the n-type Si-doped $Al_{0.15}Ga_{0.85}N$ cladding layer 214 of 0.1 to 2.0 μm, e.g., 0.5 μm thickness, whose impurity concentration is set to $1.0\times10^{17}$ to $1.0\times10^{20}$ atoms/cm$^3$, e.g., $1.0\times10^{18}$ atoms/cm$^3$, are grown in sequence on the n-type SiC substrate 211 made of hexagonal crystal 6H-SiC which has the (0001) plane, i.e., c plane as the principal plane.

Then, an undoped graded optical guiding layer 227 of 10 to 300 nm, e.g., 100 nm thickness is grown by using TMGa, TMIn, TMAl, ammonia, and hydrogen as the carrier gas, under the condition that the growth pressure is set to 70 to 760 Torr, e.g., 100 Torr and the growth temperature is set to 800 to 1200° C., e.g., 1130° C. More particularly, at first, supply of TMAl is gradually reduced in the situation that TMIn is not supplied, then the temperature is brought down to 800° C. and supply of TMIn is started at the time when supply of TMAl is made 0, and then a supply amount of TMIn is gradually increased, so that $Al_{0.05}Ga_{0.95}N$ can be derived as composition of a region which is brought into contact with the n-type Si-doped $Al_{0.15}Ga_{0.85}N$ cladding layer 214 and also $In_{0.03}Ga_{0.97}N$ can be derived as final composition of the undoped graded optical guiding layer 227.

Then, the SQW active layer 216 is formed by growing the undoped $In_{0.05}Ga_{0.85}N$ well layer or 3 to 10 nm, e.g., 5 nm thickness, which is sandwiched between undoped $In_{0.05}Ga_{0.95}N$ barrier layers each having a thickness of 1 to 10 nm, e.g., 5 nm.

Then, a p-type Mg-doped graded optical guiding layer 228 or 10 to 300 nm, e.g., 100 nm thickness is grown by using TMGa, TMIn, TMAl, ammonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 800° C. More particularly, first, supply of TMIn is gradually reduced in the situation that TMIn is not supplied, then the temperature is brought up to 1130° C. and supply of TMAl is started at the time when supply of TMIn is reduced to 0, and then a supply amount of TMAl is gradually increased, so that $In_{0.03}Ga_{0.97}N$ can be derived as composition of a region which is brought into contact with the SQW active layer 216 and also $Al_{0.05}Ga_{0.95}N$ can be derived as final composition of the p-type Mg-doped graded optical guiding layer 228.

Then, the p-type Mg-doped $Al_{0.15}Ga_{0.85}N$ cladding layer 218 of 0.1 to 2.0 μm, e.g., 0.5 μm thickness, whose impurity concentration is set to $1.0\times10^{17}$ to $1.0\times10^{19}$ atom/cm$^3$, e.g., $1.0\times10^{17}$ atoms/cm$^3$, and the p-type Mg-doped GaN contact layer 219 of 0.1 to 2.0 μm, e.g., 0.5 μm thickness, whose impurity concentration is set to $1.0\times10^{17}$ to $1.0\times10^{19}$ atoms/cm$^3$, e.g., $1.0\times10^{18}$ atoms/cm$^3$, are grown in sequence.

Finally, the Ni electrode 220 of 100 nm thickness is provided as the n-side electrode on the back surface of the n-type SiC substrate 211 and also the Ni electrode 221 which has the thickness of 100 nm and the width W of 3 μm is provided as the p-side electrode on the p-type GaN contact layer 219, and then a resultant structure is divided into respective devices to have the resonator length L or 700 μm. As a result, an short wavelength light emitting semiconductor laser having a SQW structure can be completed.

In the tenth embodiment, as shown in FIG. 29B, the p-side optical guiding layer is constructed by the graded band gap layer in which composition is changed continuously. Therefore, the wide forbidden bandwidth region on the p-type cladding layer side can function as the overflow preventing layer for electron.

Also, in this case, the p-type graded optical guiding layer 228 constituting the p-side optical guiding layer has been composed of the p-type layer, but it may be formed of the undoped layer like the above sixth embodiment, so that the hole mobility can be enhanced. Further, if a supply amount of biscyclopentadienylmagnesium is continuously changed, the active layer side may be consisted of the undoped layer.

In the current faces of the A and the B contacting with the cladding layer 214 and 218, the aluminum composition ratio $x_1$, of $Al_{x_1}Ga_{1-x_1}N$ is 0.05, i.e., the composition of the contact faces are made of $Al_{0.05}Ga_{0.95}N$. However, it may be formed of the aluminum composition ratio of 0.15 or about 0.15 like the cladding layers 214 and 218. Heightening the aluminum composition ratio in the contact portion contacted the cladding layers improving the injection efficiency of hole.

Subsequently, an eleventh embodiment of the present invention will be explained with reference to FIGS. 30A and 30B hereinafter.

FIG. 30A is a perspective view showing an SQW semiconductor laser according to an eleventh embodiment of the present invention, and FIG. 30B is a view showing a band gap structure in the neighborhood of an active layer of the SQW semiconductor laser in FIG. 30A.

Similarly, in this eleventh embodiment, since remainings other than a configuration of a p-side optical guiding layer is substantially identical to those in the above ninth embodiment, explanations of their manufacturing method will be almost omitted.

First, like the above sixth embodiment, the AlGaN buffer layer 212 of 50 to 300 nm, e.g., 50 nm thickness; the n-type Si-doped GaN intermediate layer 213 of 0.1 to 2.0 μm, e.g., 0.5 μm thickness, whose impuxity concentration is set to $5\times10^{17}$ to $1\times10^{19}$ atoms/cm$^3$, e.g., $2\times10^{18}$ atoms/cm$^3$; and the n-type Si-doped $Al_{0.15}Ga_{0.85}N$ cladding layer 214 of 0.1 to 2.0 μm, e.g., 0.5 μm thickness, whose impurity concentration is set to $1.0\times10^{17}$ to $1.0\times10^{20}$ atoms/cm$^3$, e.g., $1.0 \times 10^{18}$ atoms/cm$^3$, are grown in sequence on the n-type SiC substrate 211 made of hexagonal crystal 6H-SiC which has the (0001) plane, i.e., c plane as the principal plane.

Then, an undoped $Al_{0.05}Ga_{0.95}N$ optical guiding layer 229 of 10 to 300 nm, e.g., 100 nm thickness is grown. Then, the SQW active layer 216 is formed by growing the undoped $In_{0.15}Ga_{0.85}N$ well layer of 3 to 30 nm, e.g., 5 nm thickness, which is sandwiched between undoped $In_{0.05}Ga_{0.95}N$ barrier layers each having a thickness of 1 to 10 nm, e.g., 5 nm.

Then, while reducing gradually a supply amount of TMAl, a p-type Mg-doped inversely graded optical guiding layer 230 of 10 to 300 nm, e.g., 100 nm thickness is grown by using TMGa, TMIn, TNAl, ammonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 1130° C. As a result, $Al_{0.20}Ga_{0.80}N$ can be derived as composition of a region which is brought into contact with the SQW active layer 216 and also GaN can be derived as final composition of the p-type Mg-dopld inversely graded optical guiding layer 230.

In this case, InGaN may be employed as composition of a region which is brought into contact with the p-type cladding layer.

Then, the p-type Mg-doped $Al_{0.15}Ga_{0.85}N$ cladding layer 218 of 0.1 to 2.0 µm, e.g., 0.5 µm thickness, whose impurity concentration is set to $1.0 \times 10^{17}$ to $1.0 \times 10^{19}$ atoms/cm$^3$, e.g., $1.0 \times 10^{17}$ atoms/cm$^3$, and then the p-type Mg-doped GaN contact layer 219 of 0.1 to 2.0 µm, e.g., 0.5 µm thickness, whose impurity concentration is set to $1.0 \times 10^{17}$ to $1.0 \times 10^{19}$ atoms/cm$^3$, e.g., $1.0 \times 10^{18}$ atoms/cm$^3$, are grown in sequence.

Finally, the Ni electrode 220 of 100 nm thickness is provided as the n-side electrode on the back surface of the n-type SiC substrate 211 and also the Ni electrode 221 which has the thickness of 100 nm and the width W of 3 µm is provided as the p-side electrode on the p-type GaN contact layer 219, and then a resultant structure is divided into respective devices to have the resonator length L of 700 µm. As a result, an short wavelength light emitting semiconductor laser having a SQW structure can be completed.

In this eleventh embodiment, as shown in FIG. 30B, the p-side optical guiding layer is composed of the inversely graded layer which has a wide forbidden bandwidth on the active layer side. Therefore, since a wide forbidden bandwidth region constituting this p-side optical guiding layer can function as the overflow preventing layer for electron, leakage of electron into the p-side optical guiding layer can be reduced, whereby recombination in the p-side optical guiding layer can be reduced.

Because this p-side optical guiding layer has the inversely graded band gap structure, no energy spike against the hole is formed. Hence, it is difficult for the p-side optical guiding layer to act as the barrier rather than the overflow preventing layer in the prior art, and thus the hole infection efficiency is in no way reduced.

In this case, it is preferable that, since the n-side optical guiding layer has been composed of the single layer, composition of the n-side optical guiding layer should be set to have such composition that can achieve the middle forbidden bandwidth of the p-side optical guiding layer in order to correct the asymmetry of the light guide structure.

Also, in this case, the p-side optical guiding layer has been made of the p-type layer. However, like the above sixth embodiment, the p-side optical guiding layer may be composed of the undoped layer to thus enhance the hole mobility.

The sixth to eleventh embodiments of the present invention have been explained in the above, but the present invention is not limited to such embodiments. For instance, the SQW structure consisting of $In_{0.15}Ga_{0.85}N/In_{0.05}Ga_{0.95}N$ has been employed as the active layer in the above sixth and eleventh embodiments, but a mixed crystal ratio may be changed in the range of $Al_xGa_yIn_{1-x-y}N$ ($0 \leq x < 1$, $0 < y \leq 1$) according to the required wavelength and correspondingly the mixed crystal ratio of the optical guiding layer and thecladding layer may be changed in the range of $Al_aGa_bIn_{1-a-b}N$ ($0 \leq a \leq 1$, $0 \leq b \leq 1$).

In the sixth to eleventh embodiments of the present invention, the active layer has been composed of the SQW structure, but it may be composed of the MQW structure. In this case, for example, the MQW active layer may be formed by growing alternatively unhoped $In_{0.05}Ga_{0.95}N$ barriers layers each having a thickness of 1 to 10 nm, e.g., 5 nm and undoped $In_{0.15}Ga_{0.85}N$ well layers each having a thickness of 3 to 10 nm, e.g., 5 nm such that two to ten layers, e.g., five layers of undoped $In_{0.15}Ga_{0.85}N$ well layers can be deposited.

Next, with reference to FIGS. 31, 32A and 32B, a method of manufacturing a short wavelength semiconductor laser according to a twelfth embodiment of the present invention which is capable of reducing a dislocation density and a PL wavelength distribution by controlling a growth rate and thus reducing the threshold current density $J_{th}$ will be explained hereinafter in FIG. 31.

To begin with, a surface of an n-type SiC substrate 311 made of hexagonal crystal 6H-SiC which has a (0001) plane, i.e., c plane as a principal plane is removed by 0.1 to 2 µm, e.g., 0.2 µm by virtue of dry etching using $CF_4$ to thus reduce a surface defect density. Then, an AlGaN buffer layer 312 of 50 to 300 nm, e.g., 50 nm thickness is grown by a MOVPE method using TMGa, TMAl, and amonia as a growth gas and hydrogen as a carrier gas, under the condition that a growth pressure is set to 70 to 760 Torr, e.g., 100 Torr and a growth temperature is set to 800 to 1200° C., e.g., 950° C.

Then, an n-type Si-doped GaN intermediate layer 313 of 0.1 to 2.0 µm, e.g., 0.5 µm thickness, whose impurity concentration is set to $1.0 \times 10^{17}$ to $1.0 \times 10^{19}$ atoms/cm$^3$, e.g., $2.0 \times 10^{18}$ atoms/cm$^3$, is grown by using TMGa, ammonia, $SiH_4$ as the dopant, and the carrier gas, under the condition that the growth pressure is set to 70 to 760 Torr, a. g., 100 Torr and the growth temperature is set to 800 to 1200° C., e.g., 920° C.

Then, an n-type $Al_{0.15}Ga_{0.85}N$ cladding layer 314 of 0.1 to 2.0 µm, e.g., 0.5 µm thickness, whose impurity concentration is set to $1.0 \times 10^{17}$ to $10 \times 10^{20}$ atoms/cm$^3$, e.g., $1.0 \times 10^{18}$ atoms/cm$^3$, is grown by using TMAl, TMGa, ammonia, $SiH_4$ as the dopant, and hydrogen as the carrier gas, under the condition that the growth pressure is set to 70 to 760 Torr, e.g., 100 Torr and the growth temperature ia aet to 800 to 1200° C., e.g., 950° C.

Then, an undoped GaN optical guiding layer 315 of 10 to 300 nm, e.g., 100 nm thickness is grown by using TMGa, amnuonia, and hydrogen as the carrier gas, under the condition that the growth pressure is set to 70 to 760 Torr, e.g., 100 Torr and the growth temperature is set to 800 to 1200° C., e.g., 930° C.

Then, while keeping a growth rate rg in excess of 0.1 µm/h, e.g., 0.3 µm/h, an MQW active layer 316 is formed by growing alternatively undoped $In_{0.03}Ga_{0.97}N$ barrier layers of 1 to 10 nm, e.g., 5 nm thickness and undoped $In_{0.015}Ga_{0.85}N$ well layers of 3 to 10 nm, e.g., 9 nm thickness such that two or three layers, e.g., two layers of undoped $In_{0.15}Ga_{0.85}N$ well layers are deposited, by using TMGa, TMIn, ammonia, and nitrogen as the carrier gas, under the condition that the growth pressure is set to 70 to 760 Torr, e.g., 100 Torr and the growth temperature is set to 550 to 900° C., e.g., 700° C.

Then, an undoped GaN optical guiding layer 317 of 10 to 300 nm, e.g., 100 nm thickness is grown by using TMGa, ammonia, and nitrogen as the carrier gas, under the condition that the growth pressure is set to 70 to 760 Torr, e.g., 100 Torr and the growth temperature is set to 800 to 1200° C., e.g., 930° C.

Then, a p-type $Al_{0.15}Ga_{0.85}N$ cladding layer 318 of 0.1 to 2.0 µm, e.g., 0.5 µm thickness, whose impurity concentration is set to $1.0 \times 10^{17}$ to $1.0 \times 10^{19}$ atoms/cm$^3$, e.g., $2.0 \times 10^{17}$ atoms/cm$^3$, is grown by using TMAl, TMGa, amonia, biscyclopentadienylmagnesium, and nitrogen as the carrier gas, under the condition that the growth pressure is set to 70 to 760 Torr, e.g., 100 Torr and the growth temperature is set to 800 to 1200° C., e.g., 950° C.

Then, a p-type GaN contact layer 319 of 0.1 to 2.0 µm, e.g., 0.5 µm thickness, whose impurity concentration is set to $1.0 \times 10^{17}$ to $1.0 \times 10^{19}$ atoms/cm$^3$, e.g., $1.0 \times 10^{18}$ atoms/cm$^3$, is grown by using TMGa, ammonia, biscyclopentadienylmagnesium, and nitrogen as the carrier gas, under the condition that the growth pressure is set to 70 to 760 Torr, e.g., 100 Torr and the growth temperature is set to 800 to 1200° C., e.g., 930° C.

Finally, a Ni electrode 320 of 100 nm thickness is provided as an n-side electrode on a back surface of the n-type SiC substrate 311 and a Ni electrode 321 which has a thickness of 100 nm and a width W of 10 µm is provided as a p-side electrode on the p-type GaN contact layer 319. Then, a resultant structure is divided into respective devices to have a resonator length L of 700 µm. As a result, an short wavelength light emitting semiconductor laser having a MQW structure can be completed.

In the above twelfth embodiment of the present invention, 0.1 µm/h or more, particularly 0.3 µm/h has been employed as the growth rate of the active layer. Correlation between crystal quality of the active layer and the growth rate will be explained with reference to FIGS. 32A and 32 hereinbelow.

FIG. 32A is a view illustrating dependence of a PL peak wavelength distribution of InGaN active layer on the growth rate. As apparent from FIG. 32A, it can be deduced that, in the event that the growth rate rg is set to 0.075 µm/h below 0.1 µm/h, the PL peak wavelength distribution has been increased with the increase of flow rate of TMIn (trimetylindium) to thus enhance merely uneven composition of InGaN so that the InGaN mixed crystal with high quality cannot be obtained in the average PL wavelength composition in excess of 400 nm.

On the contrary, in the event that the growth rate rg is set to 0.3 µm/h in excess of 0.1 µm/h, even when the flow rate of TMIn is increased, the average PL wavelength, i.e., In composition ratio is increased but the PL peak wavelength distribution around 420 nm is decreased while keeping the PL peak wavelength distribution small.

With the above, it should be noted that uneven composition can be suppressed by increasing the growth rate and that at least, in the case of the growth rate around 0.3 µm/h, the InGaN active layer which has composition to provide the wavelength range suitable for a blue-light semiconductor laser can be grown with good crystal quality.

FIG. 32B is a view illustrating dependence of a PL light intensity on the growth rate. As apparent from FIG. 32B, it can be deduced that the higher the growth rate the higher the PL light intensity, in particular, relatively high PL light intensity can be derived on the longer wavelength side suitable for the blue-light semiconductor laser. From the above fact, it should be understood that, if the growth rate is set higher, the crystal of uniform composition can be obtained.

According to the twelfth embodiment of the present invention, if the SiC substrate with good quality is prepared and then the surface defect density is reduced by removing the surface of the SiC substrate by dry etching, the InGaN active layer in which the dislocation density is less than $10^9$ atoms/cm$^3$ and the PL peak wavelength is less than 90 meV can be fabricated, and therefore an I-L characteristic with no kink can be achieved.

Taking into account the experiences accumulated up to now, it is supposed that, if the above results is compared with the result obtained when the growth rate rg is set to 0.075 µm/h, the very excellent active layer can be fabricated by the growth rate of more than 0.3 µm/h, and the good active layer can be obtained at least until 0.2 µm/h, and in addition the active layer which can be served in practical use can be obtained by the growth rate of 0.1 µm/h.

This fact is contrary to the conventional common sense that the crystal with uniform qualitycan be formedbythe slower growth rate. From this respect, special characteristics of the nitride compound semiconductor including In as a constituent element can be made clear.

The twelfth embodiment of the present invention has been explained in the above, but the present invention is not limited to conditions set forth in the twelfth embodiment and various modifications maybe applied in the scope of the technical concept. For instance, although $In_{0.15}Ga_{0.85}N$ has been employed as the well layer in the above twelfth embodiment, the mixed crystal ratio may be changed in the range of $Al_xGa_yIn_{1-x-y}N$ ($0 \leq x < 1$, $0 < y \leq 1$) according to the required wavelength and correspondingly the mixed crystal ratio of the optical guiding layer and the cladding layer may be changed in the range of $Al_aGa_bIn_{1-a-b}N$ ($0 \leq a \leq 1$, $0 \leq b \leq 1$).

Also, in the explanation of the above twelfth embodiment, the active layer has been composed of the MQW active layer 16, but it may be formed by the SQW active layer. In this case, under the growth conditions in which the growth rate is set to more than 0.1 µm/h, e.g., 0.3 µm/h, the SQW active layer consisting of the undoped $In_{0.15}Ga_{0.85}N$ well layer of 3 to 30 nm, e.g., 8 nm thickness, which is sandwiched by undoped $In_{0.03}Ga_{0.97}N$ barrier layers each having a thickness of 1 to 10 nm, e.g., 5 nm may be grown.

In addition, in the above twelfth embodiment, the undoped layer has been employed as the active layer to enhance the hole mobility. Since sometimes impurity is auto-doped inevitably into the undoped layer, the impurity concentration of below $1.0 \times 10^{17}$ atoms/cm$^3$ may be accepted as a resultant impurity concentration.

Next, with reference to FIGS. 33A, 332, 34A and 34B, thirteenth to fifteenth embodiments of the present invention which are capable of reducing the threshold current density $J_{th}$ by providing a narrow forbidden bandwidth region in a p-type cladding layer, then generating radiative recombination in this narrow forbidden bandwidth region, and then preventing heat generation due to an overflow current will be explained hereinafter.

First, a thirteenth embodiment of the present invention will be explained with reference to FIGS. 33A and 33B hereinbelow.

FIG. 33A is a perspective view showing an SQW semiconductor laser according to a thirteenth emodiment of the present invention, and FIG. 33B is a view showing an energy level on a conduction band in the neighborhood of an active layer of the SQW semiconductor laser in FIG. 33A.

To begin with, an AlGaN buffer layer 412 of 50 to 300 nm, e.g., 50 nm thickness is grown on an n-type SiC substrate 411 made of hexagonal crystal 6H-SiC which has a (0001) plane, i.e., c plane as a principal plane, by a MOVPE method using TMGa, TMAl, and ammonia as a growth gas and hydrogen as a carrier gas, under the condition that a growth pressure is set to 70 to 760 Torr, e.g., 100 Torr and a growth temperature is set to 800 to 1200° C., e.g., 950° C.

Then, an n-type GaN intermediate layer 413 of 0.1 to 2.0 µm, e.g., 0.5 µm thickness, whose impurity concentration is set to $5.0\times10^{17}$ to $1.0\times10^{19}$ atoms/cm$^3$, e.g., $2.0\times10^{18}$ atoms/cm$^3$, is grown by using TMGa, ammonia, SiH$_4$ as the dopant source, and hydrogen as the carrier gas, under the condition that the growth pressure is set to 70 to 760 Torr, e.g., 100 Torr and the growth temperature is set to 800 to 1200° C., e.g., 920° C.

Then, an n-type $Al_{0.15}Ga_{0.85}N$ cladding layer 414 of 0.1 to 2.0 µm, e.g., 0.5 µm thickness, whose impurity concentration is set to $1.0\times10^{17}$ to $1.0\times10^{20}$ atoms/cm$^3$, e.g., $1.0\times10^{18}$ atoms/cm$^3$, is grown by using TMAl, TMGa, ammonia, SiH$_4$ as the dopant, and hydrogen as the carrier gas, under the condition that the growth pressure is set to 70 to 760 Torr, e.g., 100 Torr and the growth temperature is set to 800 to 1200° C., e.g., 950° C.

Then, an undoped GaN optical guiding layer 415 of 10 to 300 nm, e.g., 100 nm thickness is grown by using TMGa, ammonia, and hydrogen as the carrier gas, under the condition that the growth pressure is set to 70 to 760 Torr, e.g., 100 Torr and the growth temperature is set to 800 to 1200° C., e.g., 930° C.

Then, an SQW active layer 416 is formed by growing an undoped $In_{0.15}Ga_{0.85}N$ well layer of 3 to 30 nm, e.g., 5 nm thickness, which is sandwiched by undoped $In_{0.05}Ga_{0.95}N$ barrier layers each having a thickness of 1 to 10 nm, e.g. 5 nm, by using TMGa, TMIn, amonia, and N$_2$ as the carrier gas, under the condition that the growth pressure is set to 70 to 760 Torr, e.g., 100 Torr and the growth temperature is set to 550 to 900° C., e.g., 700° C.

Then, an undoped GaN optical guiding layer 417 of 10 to 300 nm, e.g., 100 nm thickness is grown by using TMGa, ammonia, and N$_2$ as the carrier gas, under the condition that the growth pressure is set to 70 to 760 Torr, e.g., 100 Torr and the growth temperature is set to 800 to 1200° C., e.g., 1130° C.

Then, a p-type $Al_{0.15}Ga_{0.85}N$ cladding layer 418 of 0.05 to 0.50 µm, e.g., 0.2 µm thickness, whose impurity concentration is set to $1.0\times10^{17}$ to $1.0\times10^{19}$ atoms/cm$^3$, e.g., $2.0\times10^{17}$ atoms/cm$^3$, is grown by using TMAl, TMGa, ammonia, biscyclopentadienylmagnesium, and N$_2$ as the carrier gas, under the condition that the growth pressure is set to 70 to 760 Torr, e.g., 100 Torr and the growth temperature is set to 800 to 1200° C., e.g., 950° C.

Then, a p-type GaN intermediate layer 419 having a thickness T of 1 to 500 nm, e.g., 100 nm, whose impurity concentration is set to $1.0\times10^{17}$ to $1.0\times10^{19}$ atoms/cm$^3$, e.g., $1.0\times10^{18}$ atoms/cm$^3$, is grown by using TMGa, ammonia, biscyclopentadienylmagnesium, and N$_2$ as the carrier gas, under the condition that the growth pressure is set to 70 to 760 Torr, e.g., 100 Torr and the growth temperature is set to 800 to 1200° C., e.g., 950° C.

Then, a p-type $Al_{0.15}Ga_{0.85}N$ cladding layer 420 of 0.05 to 0.50 µm, e.g., 0.2 µm thickness, whose impurity concentration is set to $1.0\times10^{17}$ to $1.0\times10^{19}$ atoms/cm$^3$, e.g., $2.0\times10^{17}$ atoms/cm$^3$, is grown by using TMAl, TMGa, armonia, biscyclqpentadienylmagnesium, and N$_2$ as the carrier gas, under the condition that the growth pressure is set to 70 to 760 Torr, e.g, 100 Torr and the growth temperature is set to 800 to 1200° C., e.g., 950° C.

Then, a p-type GaN contact layer 421 of 0.1 to 2.0 µm, e.g., 0.5 µm thickness, whose impurity concentration is set to $1.0\times10^{17}$ to $1.0\times10^{19}$ atoms/cm$^3$, e.g., $1.0\times10^{18}$ atoms/cm$^3$, is grown by using TMGa, ammonia, biscyclopentadienylragnesium, and N$_2$ as the carrier gas, under the condition that the growth pressure is set to 70 to 760 Torr, e.g., 100 Torr and the growth temperature is set to 800 to 1200° C., e.g., 930° C.

Finally, a Ni electrode 422 of 100 nm thickness is provided as an n-side electrode on a back surface of the n-type SiC substrate 411 and a Ni electrode 423 which has a thickness of 100 nm and a width W of 3 µm is provided as a p-side electrode on the p-type GaN contact layer 319, and then a resultant structure is divided into respective devices to have a resonator length L of 700 µm. As a result, an short wavelength light emitting semiconductor laser having a MQW structure can be completed.

In the thirteenth embodiment of the present invention, as shown in FIG. 33B, since the p-type GaN intermediate layer 419 which has the good crystal quality and the narrow forbidden bandwidth rather than the $Al_{0.15}Ga_{0.85}N$ layer has been put between the p-type $Al_{0.15}Ga_{0.5}N$ cladding layers 418, 420, overflow electron can stay effectively in this p-type GaN intermediate layer 419 to generate the radiative recombination, and therefore heat generation is never caused by the electrons which reach the p-side electrode.

Accordingly, since a device temperature is not increased, a overflow current can be still kept constant and thus a vicious cycle of the increase in the overflow current due to such heat generation can be cut off. As a result, the short wavelength semiconductor laser having the low threshold current density can be fabricated and also device deterioration because of degradation of the p-side electrode can be suppressed to then improve reliability of the device.

Further, in this case, since the p-type GaN intermediate layer has been doped at about $1.0\times10^{18}$ atoms/cm$^3$, resistance of the p-type cladding layer can be reduced smaller than the case where the p-type cladding layer is composed of $Al_{0.5}Ga_{0.85}N$ to have the same thickness.

Then, a fourteenth embodiment of the present invention will be explained with reference to FIG. 34A showing an energy level on the conduction band side of an SQW semiconductor laser hereinbelow.

Where, in this fourteenth embodiment, since remainings other than a configuration of an intermediate layer is completely identical to those in the above thirteenth embodiment, explanations as with their manufacturing method will be omitted.

First, like the above thirteenth embodiment, the AlGaN buffer layer of 50 to 300 nm, e.g., 50 nm thickness; the n-type Si-doped GaN intermediate layer of 0.1 to 2.0 µm, e.g., 0.5 µm thickness, whose impurity concentration is set to $5.0\times10^{17}$ to $1.0\times10^{19}$ atoms/cm$^3$, e.g., $2.0\times10^{18}$ atoms/cm$^3$; and the n-type $Al_{0.15}Ga_{0.85}N$ cladding layer 414 of 0.1 to 2.0 µm, e.g., 0.5 µm thickness, whose impurity concentration is set to $1.0\times10^{17}$ to $1.0\times10^{20}$ atoms/cm$^3$, e.g., $1.0\times10^{18}$ atoms/cm$^3$, are grown sequentially on the n-type SiC substrate made of hexagonal crystal 6H-SiC which has the (0001) plane, i.e., c plane as the principal plane.

Then, the undoped GaN optical guiding layer 415 of 10 to 300 nm, e.g., 100 nm thickness is grown. Then, the SQW active layer 416 is formed by growing the undoped $In_{0.15}Ga_{0.85}N$ well layer of 3 to 30 nm, e.g., 5 nm thickness, which is sandwiched by undoped $In_{0.05}Ga_{0.95}N$ barrier layers each having a thickness of 1 to 10 nm, e.g., 5 nm.

Then, the undoped GaN optical guiding layer 417 of 10 to 300 nm, e.g., 100 nm thickness is grown. Then, the p-type $Al_{0.15}Ga_{0.98}N$ cladding layer 418 of 0.05 to 0.50 μm, e.g., 0.2 μm thickness, whose impurity concentration is set to $1.0\times10^{17}$ to $1.0\times10^{19}$ atoms/cm³, e.g., $2.0\times10^{17}$ atoms/cm³, is grown.

Then, a graded intermediate layer 424 having a thickness T of 1 to 500 nm, e.g., 100 nm, whose impurity concentration is set to $1.0\times10^{17}$ to $1.0\times10^{19}$ atoms/cm³, e.g., $1.0\times10^{18}$ atoms/cm³ is grown. The thickness T is continuously changed by varying continuously a flow rate ratio of TMAl and TMGA such that an Al composition ratio can be reduced to have the lowest GaN in its intermediate region.

Then, the p-type Mg-doped $Al_{0.15}Ga_{0.85}N$ cladding layer 420 of 0.05 to 0.50 μm, e.g., 0.2 μm thickness, whose impurity concentration is set to $1.0\times10^{17}$ to $1.0\times10^{19}$ atoms/cm³, e.g., $2.0\times10^{17}$ atoms/cm³, and then the p-type GaN contact layer of 0.1 to 2.0 μm, e.g., 0.5 μm thickness, whose impurity concentration is set to $1.0\times10^{17}$ to $1.0\times10^{19}$ atoms/cm³, e.g., $1.0\times10^{18}$ atoms/cm³, are grown sequentially, Finally, the Ni electrode of 100 nm thickness is provided as an n-side electrode on a back surface of the n-type SiC substrate and the Ni electrode which has the thickness of 100 nm and the width W of 3 μm is provided as the p-side electrode on the p-type GaN contact layer, and then a resultant structure is divided into respective devices to have a resonator length L of 700 μm. As a result, an short wavelength light emitting semiconductor laser having a MQW structure can be completed.

In the fourteenth embodiment, since the intermediate layer is made of the graded intermediate layer 424 which has a U-shaped forbidden bandwidth, hole injection into the p-type optical guiding layer can be performed smoothly.

In this case, the narrow forbidden bandwidth region in the central area of the graded intermediate layer 424 may be formed as an undoped region. A probability of radiative recombination can be increased by improving the crystal quality of this region.

Then, a fifteenth embodiment of the present invention will be explained with reference to FIG. 34B showing an energy level on the conduction band side of the SQW semiconductor laser hereinbelow.

In this fifteenth embodiment, since remainings other than a configuration of an intermediate layer is completely identical to those in the above thirteenth embodiment, explanations as with their manufacturing method will be omitted.

First of all, like the above thirteenth embodiment, the AlGaN buffer layer of 50 to 300 nm, e.g., 50 nm thickness; the n-type Si-doped GaN intermediate layer of 0.1 to 2.0 μm, e.g., 0.5 μm thickness, whose impurity concentration is set to $5.0\times10^{17}$ to $1.0\times10^{19}$ atoms/cm³, e.g., $2.0\times10^{18}$ atoms/cm³; and the n-type $Al_{0.15}Ga_{0.85}N$ cladding layer 414 of 0.1 to 2.0 μm, e.g., 0.5 μm thickness, whose impurity concentration is set to $1.0\times10^{17}$ to $1.0\times10^{20}$ atoms/cm³, e.g., $1.0\times10^{18}$ atoms/cm³, are grown sequentially on the n-type SiC substrate made of hexagonal crystal 6H-SiC which has the (0001) plane, i.e., c plane as the principal plane.

Then, the undoped GaN optical guiding layer 415 of 10 to 300 nm, e.g., 100 nm thickness is grown. Then, the SQW active layer 416 is formed by growing the undoped $In_{0.15}Ga_{0.85}N$ well layer of 3 to 30 nm, e.g. 5 nm thickness, which is sandwiched by undoped $In_{0.05}Ga_{0.95}N$ barrier layers each having a thickness of 1 to 10 nm, e.g., 5 nm.

Then, the undoped GaN optical guiding layer 417 of 10 to 300 nm, e.g., 100 nm thickness is grown. Then, the p-type $Al_{0.15}Ga_{0.85}N$ cladding layer 418 of 0.05 to 0.50 μm, e.g., 0.2 μm thickness, whose impurity concentration is set to $1.0\times10^{17}$ to $1.0\times10^{19}$ atoms/cm³, e.g., $2.0\times10^{17}$ atoms/cm³, is grown.

Then, a multi-layered structure intermediate layer 425 of 1 to 500 nm, suitably 10 to 500 nm, e.g., 100 nm thickness is composed of a multi-layered structure in which an Al composition ratio can be changed continuously from $Al_{0.15}Ga_{0.85}N$ to GaN by increasing/decreasing alternatively and continuously a flow rate ratio of TNAl and TMGa.

In this case, a thickness t per one cycle is set to 0.3 to 50 nm, suitably 1 to 50 nm, e.g., 20 nm. A narrow forbidden bandwidth area such as about 3 nm (=30 Å) width in which its composition is close to GaN is still kept undoped.

Then, the p-type Mg-doped $Al_{0.15}Ga_{0.85}N$ cladding layer 420 of 0.05 to 0.50 μm, e.g., 0.2 μm thickness, whose impurity concentration is set to $1.0\times10^{17}$ to $1.0\times10^{19}$ atoms/cm³, e.g., $2.0\times10^{17}$ atoms/cm³, and then the p-type GaN contact layer of 0.1 to 2.0 μm, e.g., 0.5 μm thickness, whose impurity concentration is set to $1.0\times10^{17}$ to $1.0\times10^{19}$ atoms/cm³, e.g., $1.0\times10^{18}$ atoms/cm³ are grown in sequence.

Finally, the Ni electrode of 100 nm thickness is provided as an n-side electrode on a back surface of the n-type SiC substrate and the Ni electrode which has the thickness of 100 nm and the width W of 3 μm is provided as the p-side electrode onthe p-type GaN contact layer, and then a resultant structure is divided into respective devices to have a resonator length L of 700 μm. As a result, an SQW short wavelength semiconductor laser can be completed.

In this fifteenth embodiment, because the intermediate layer is constructed by the multi-layered structure intermediate layer 425, resistance of the overall p-type cladding layer is not so increased if the narrow forbidden bandwidth region is made undoped. Hence, crystal quality can be enhanced by providing the undoped region to increase radiative recombination probability, so that heat generation can be suppressed more effectively.

In the above fifteenth modiment, the multi-layered structure intermediate layer 425 has been constructed such that the forbidden bandwidth can be changed continuously to allow the smooth hole injection, but the intermediate layer may be constructed by the multi-layered structure in which the forbidden bandwidth can be changed like a step function.

Although the thirteenth to fifteenth embodiments of the present invention have been explained as above, the present invention is not limited to such embodiments. For instance, in the thirteenth to fifteenth embodiments, the intermediate layer has been composed of GaN or the lowest forbidden bandwidth region has been composed of GaN, but it may be formed by AlGaN or InGaN.

In the above thirteenth to fifteenth embodiments, the SQW structure made of $In_{0.15}Ga_{0.85}N/In_{0.05}Ga_{0.95}N$ has been employed as the active layer. However, the mixed crystal ratio may be changed in the range of $Al_xGa_yIn_{1-x-y}N$ ($0 \leq x<1$, $0<y \leq 1$) according to the required wavelength, and correspondingly the mixed crystal ratio of the optical guiding layer and the cladding layer may be changed in the range of $Al_aGa_bIn_{1-a-b}N$ ($0 \leq a \leq 1$, $0 \leq b \leq 1$).

In the above thirteenth to fifteenth embodiments, the active layer has been composed of the SQW structure, but it may be formed of the MoW structure. In this case, for example, the MQW active layer may be formed by growing the undoped $In_{0.05}Ga_{0.95}N$ barrier layers each having a thickness of 1 to 10 nm, e.g., 5 nm and the undoped $In_{0.15}Ga_{0.85}N$ well layers each having a thickness of 3 to 10 nm, e.g., 5 nm alternatively such that two to ten layers, e.g., five layers of the undoped $In_{0.15}Ga_{0.85}N$ well layers can be deposited.

In addition, in the above embodiment, the p-type optical guiding layer has been constructed by the undoped layer, but it may be doped into p-type.

In turn, with reference to FIGS. 35A, 35B and 36, sixteenth and seventeenth embodiments of the present invention which are capable of improving uneven carrier injection by controlling a thickness of a barrier layer constituting an MQW active layer, and thus reducing the threshold current density $J_{th}$ will be explained hereinafter.

First, a short wavelength semiconductor laser according to a sixteenth embodiment of the present invention will be explained with reference to FIGS. 35A and 35B hereinbelow.

FIG. 35A is a perspective view showing an MQW semiconductor laser according to a sixteenth embodiment of the present invention, and FIG. 35B is an enlarged view showing a layer structure in the neighborhood of an MOW active layer encircled with a broken line in FIG. 35A.

To begin with, an AlGaN buffer layer 512 of 50 to 300 nm, e.g., 100 nm thickness is grown on an n-type SiC substrate 511 made of hexagonal crystal 6H-SiC which has a (0001) plane, i.e., c plane as a principal plane, by a MOVFE method using TMGa, TMAl, and ammonia as a growth gas and hydrogen as a carrier gas, under the condition that a growth pressure is set to 70 to 760 Torr, e.g., 100 Torr and a growth temperature is set to 800 to 1200° C., e.g., 950° C.

Then, an n-type GaN intermediate layer 513 of 0.1 to 2.0 μm, e.g., 0.5 μm thickness, whose impurity concentration is set to $5.0\times10^{17}$ to $1.0\times10^{19}$ atoms/cm$^3$, e.g., $2.0\times10^{18}$ atoms/cm$^3$, is grown by using TMGa, amnonia, SiH as a dopant source, and hydrogen as the carrier gas, under the condition that the growth pressure is set to 70 to 760 Torr, e.g., 100 Torr and the growth temperature is set to 800 to 1200° C., e.g., 920° C.

Then, an n-type $Al_{0.15}Ga_{0.95}N$ cladding layer 514 of 0.1 to 2.0 μm, e.g., 0.5 μm thickness, whose impurity concentration is set to $1.0\times10^{17}$ to $1.0\times10^{20}$ atoms/cm$^3$, e.g., $1.0\times10^{18}$ atoms/cm$^3$, is grown by using TMAl TMGa, ammonia, SiH$_4$ as the dopant, and hydrogen as the carrier gas, under the condition that the growth pressure is set to 70 to 760 Torr, e.g., 100 Torr and the growth temperature is set to 900 to 1200° C., e.g., 950° C.

Then, an undoped GaN optical guiding layer 515 of 10 to 300 nm, e.g., 100 nm thickness is grown by using TMGa, ammonia, and hydrogen as the carrier gas, under the condition that the growth pressure is set to 70 to 760 Torr, e.g., 100 Torr and the growth temperature is set to 800 to 1200° C., e.g., 930° C.

Then, an MQW active layer 516 is formed by growing two to ten layers, e.g., three layers of undoped $In_{0.15}Ga_{0.85}N$ well layers 517 each having a thickness of 3 to 10 nm, e.g., 4 nm, which are separated mutually by undoped $In_{0.05}Ga_{0.95}N$ barrier layers 518 each having a thickness of 1 to 5 nm, e.g., 3 nm, while using TMGa, TMIn, ammonia and N$_2$ as the carrier gas, under the condition that the growth pressure is set to 70 to 760 Torr, e.g., 100 Torr and the growth temperature is set to 550 to 900° C., e.g., 700° C.

Then, an undoped GaN optical guiding layer 519 of 10 to 300 nm, e.g., 100 nm thickness is grown by using TMGa, amonia, and N$_2$ as the carrier gas, under the condition that the growth pressure is set to 70 to 760 Torr, e.g., 100 Torr and the growth temperature is set to 800 to 1200° C., e.g., 1130° C.

Then, a p-type $Al_{0.15}Ga_{0.85}N$ cladding layer 520 of 0.1 to 2.0 μm, e.g., 0.5 μm thickness, whose impurity concentration is set to $1.0\times10^{17}$ to $1.0\times10^{19}$ atoms/cm$^3$, e.g., $2.0\times10^{17}$ atoms/cm$^3$, is grown by using TMAl, TMGa, ammonia, biscyclopentadienylmagnesium, and N$_2$ as the carrier gas, under the condition that the growth pressure is set to 70 to 760 Torr, e.g., 100 Torr and the growth temperature is set to 800 to 1200° C., e.g., 950° C.

Then, a p-type GaN contact layer 521 of 0.1 to 2.0 μm, e.g., 0.5 μm thickness, whose impurity concentration is set to $1.0\times10^{17}$ to $1.0\times10^{19}$ atoms/cm$^3$, e.g., $1.0\times10^{18}$ atoms/cm$^3$, is grown by using TMGa, ammonia, biscyclopentadienylmagnesium, and N$_2$ as the carrier gas, under the condition that the growth pressure is set to 70 to 760 Torr, e.g., 100 Torr and the growth temperature is set to 800 to 1200° C., e.g, 930° C.

Finally, a Ni electrode 522 of 100 nm thickness is provided as an n-side electrode on aback surface of the n-type SiC substrate 511 and a Ni electrode 523 which has a thickness of 100 nm and a width W of 10 μm is provided as a p-side electrode on the p-type GaN contact layer 521, and then a resultant structure is divided into respective devices to have a resonator length L of 700 μm. As a result, an MQW semiconductor laser can be completed.

In this sixteenth embodiment of the present invention, since the thickness of the barrier layer constituting the MQW active layer 516 has been set below 5 nm, the carrier injection efficiency can be improved and also uneven carrier injection can be eliminated.

In the semiconductor having the zincblende crystal structure in the prior art, the problem of penetration of the wave function has been caused if the barrier layer is made thin. However, in the case of the nitride compound semiconductor in the present invention, such penetration of the wave function can be reduced smaller because effective mass of the carrier is heavy and also reduction in optical gain generation is negligible even if the thickness of the barrier layer is set below 5 nm.

The thickness of the barrier layer is sufficient if it is set below 5 nm and an In conposition ratio of the barrier layer may be set below 0.04. But, in order to utilize effectively a strain reduction effect caused by reduction in the thickness of the barrier layer, by setting the thickness of the barrier layer below 3 nm and setting the In composition ratio in the barrier layer made of InGaN to more than 0.04, the forbidden bandwidth of the barrier layer can be narrow without deterioration of the crystal quality, and the carrier injection efficiency can be improved by reducing the height of the barrier.

Then, an MQW semiconductor laser according to a seventeenth embodiment of the present invention using a sapphire substrate as a substrate will be explained with reference to FIG. 36 hereinbelow.

FIG. 36 is a perspective view showing an MQW semiconductor laser according to a seventeenth embodiment of the present invention. At first, a low temperature GaN buffer layer 532 of 0.03 μm thickness is grown on a sapphire substrate 511 which has a (0001) plane as a principal plane, by a MOVPE method using TMGa, and ammonia as a growth gas and hydrogen as a carrier gas, under the condition that a growth pressure is set to 70 to 760 Torr, e.g., 100 Torr and a growth temperature is set to 500° C.

Then, an n-type GaN intermediate layer 533 of 0.1 to 2.0 μm, e.g., 1.0 μm thickness, whose impurity concentration is set to $5.0\times10^{17}$ to $1.0\times10^{19}$ atoms/cm$^3$, e.g., $2.0\times10^{18}$ atoms/cm$^3$, is grown by using TMGa, ammonia, SiH as the dopant source, and hydrogen as the carrier gas, under the condition that the growth pressure is set to 70 to 760 Torr, e.g., 100 Torr and the growth temperature is set to 800 to 1200° C., e.g., 920° C.

Then, following steps are carried out in the same way as the above sixteenth embodiment. That is, an n-type $Al_{0.15}Ga_{0.85}N$ cladding layer 534 of 0.1 to 2.0 μm, e.g., 1.0 μm thickness, whose impurity concentration is set to $1.0\times10^{17}$ to $1.0\times10^{20}$ atoms/cm$^3$, e.g., $1.0\times10^{18}$ atoms/cm$^3$; an undoped GaN optical guiding layer 535 of 10 to 300 μm, e.g., 100 nm thickness, then an MQW active layer 536; an undoped GaN optical guiding layer 537 of 10 to 300 nm, e.g., 100 nm thickness; a p-type $Al_{0.15}Ga_{0.85}N$ cladding layer 538 of 0.1 to 2.0 μm, e.g., 0.5 μm thickness, whose impurity concentration is set to $1.0 \times 10^{17}$ to $1.0 \times 10^{19}$ atoms/cm$^3$, e.g., $2.0 \times 10^{17}$ atoms/cm$^3$; and a p-type GaN contact layer 539 of 0.1 to 2.0 μm, e.g., 0.5 μm thickness, whose impurity concentration is set to $1.0 \times 10^{17}$ to $1.0 \times 10^{19}$ atoms/cm$^3$, e.g., $1.0 \times 10^{18}$ atoms/cm$^3$, are epitaxially grown in sequence.

In this case, the MQW active layer 536 is also formed by growing two to ten layers, e.g., three layers of undoped $In_{0.15}Ga_{0.85}N$ well layers each having a thickness of 3 to 10 nm, e.g., 4 nm, which are separated mutually by undoped $In_{0.05}OGa_{0.95}N$ barrier layers each having a thickness of 1 to 5 nm, e.g., 3 nm.

Then, a part of the layers 539 to 533 are removed by dry etching until a part of the n-type GaN intermediate layer 533 is exposed. Finally, a Ti electrode 540 is provided as an n-side electrode on an exposed surface of the n-type GaN intermediate layer 533 and an Ni electrode 541 which has a width W of 3 μm is provided as a p-side electrode on the p-type GaN contact layer 539, and then a pair of parallel end surfaces are formed by dry etching to have a resonator length L of 700 μm. As a result, an MQW semiconductor laser can be completed.

In the seventeenth embodiment of the present invention, since the thickness of the barrier layer constituting the MQW active layer 516 is set below 5 nm, the carrier injection efficiency can be improved and thus the uneven carrier injection can be eliminated.

Also, in this case, in order to utilize effectively the strain reduction effect caused by the thinner barrier layer, by setting the thickness of the barrier layer below 3 nm and setting the In composition ratio of the barrier layer made of InGaN to more than 0.04, the height of the barrier in the barrier layer can be reduced without deterioration of the crystal quality, so that the carrier injection efficiency can be improved much more.

Although the sixteenth and seventeenth embodiments of the present invention have been explained in the above, the present invention is not limited to configurations set forth in the above sixteenth and seventeenth embodiments. By way of example, in the sixteenth and seventeenth embodiments, the MQW structure made of $In_{0.15}Ga_{0.85}N/In_{0.05}Ga_{0.95}N$ has been employed as the multi-quantum well active layer. However, the mixed crystal ratio may be changed in the range of $Al_xGa_yIn_{1-x-y}N$ ($0 \leq x < 1$, $0 < y \leq 1$) according to the required wavelength, and correspondingly the mixed crystal ratio of the optical guiding layer and the cladding layer may be changed in the range of $Al_aGa_bI_{1-a-b}N$ ($0 \leq a \leq 1$, $0 \leq b \leq 1$).

Subsequently, with reference to FIGS. 37 and 39, eighteenth and nineteenth embodiments of the present invention which are capable of improving a hole injection efficiency by forming an overflow preventing layer, i.e., an electron blocking layer as an undoped layer or a graded layer, and thus reducing the threshold current density $J_{th}$ will be explained hereinafter.

At first, an MQW semiconductor laser according to an eighteenth embodiment of the present invention will be explained with reference to FIG. 37 hereinbelow.

First or all, an AlGaN buffer layer 612 of 50 to 300 nm, e.g., 50 nm thickness is grown on an n-type SiC substrate 611 made of hexagonal crystal 6H-SiC which has a (0001) plane, i.e., c plane as a principal plane by a MOVPE method using TMGa, TMAl, and ammonia as a growth gas and hydrogen as a carrier gas, under the condition that the growth pressure is set to 70 to 760 Torr, e.g., 100 Torr and the growth temperature is set to 800 to 1200° C., e.g., 950° C.

Then, an n-type GaN intermediate layer 613 of 0.1 to 2.0 μm, e.g., 0.5 μm thickness, whose impurity concentration is set to $5.0 \times 10^{17}$ to $1.0 \times 10^{19}$ atoms/cm$^3$, e.g., $2.0 \times 10^{18}$ atoms/cm$^3$, is grown by using TMGa, ammonia, $SiH_4$ as a dopant source and hydrogen as the carrier gas, under the condition that the growth pressure is set to 70 to 760 Torr, e.g., 100 Torr and the growth temperature is set to 800 to 1200° C., e.g., 920° C.

Then, an n-type $Al_{0.09}Ga_{0.91}N$ cladding layer 614 of 0.1 to 2.0 μm, e.g., 0.5 μm thickness, whose impurity concentration is set to $1.0 \times 10^{17}$ to $1.0 \times 10^{20}$ atoms/cm$^3$, e.g., $1.0 \times 10^{18}$ atoms/cm$^3$, is grown by using TMAl, TMGa, ammonia, $SiH_4$ as the dopant, and hydrogen as the carrier gas, under the condition that the growth pressure is set to 70 to 760 Torr, e.g., 100 Torr and the growth temperature is set to 800 to 1200° C., e.g., 950° C.

Then, an undoped GaN optical guiding layer 615 of 10 to 300 nm, e.g., 100 nm thickness is grown by using TMGa, ammonia, and hydrogen as the carrier gas, under the condition that the growth pressure is set to 70 to 760 Torr, e.g., 100 Torr and the growth temperature is set to 800 to 1200° C., e.g., 930° C.

Then, an MQW active layer 616 is formed by growing two to ten layers, e.g., three layers of undoped $In_{0.15}Ga_{0.95}N$ well layers each having a thickness of 3 to 10 nm, e.g., 4 nm, which are separated by undoped $In_{0.03}Ga_{0.97}N$ barrier layers of 1 to 10 nm, e.g., 5 nm thickness respectively, by using TMGa, TMIn, ammonia and $N_2$ as the carrier gas, under the condition that the growth pressure is set to 70 to 760 Torr, e.g., 100 Torr and the growth temperature is set to 550 to 900° C., e.g., 700° C.

Then, an undoped $Al_{0.18}Ga_{0.82}N$ electron blocking layer 617 of 5 to 30 nm, e.g., 20 nm thickness is grown by using TMAl, TMGa, and $N_2$ as the carrier gas, under the condition that the growth pressure ia set to 70 to 760 Torr, e.g., 100 Torr and the growth temperature is set to 800 to 1200° C., e.g., 950° C.

Then, a p-type GaN optical guiding layer 618 or 10 to 300 nm, e.g., 100 nm thickness, whose impurity concentration is set to $1.0 \times 10^{17}$ to $5.0 \times 10^{19}$ atoms/cm$^3$, e.g., $1.0 \times 10^{18}$ atoms/cm$^3$, is grown by using TMGa, ammonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 1130° C.

Then, a p-type $Al_{0.09}Ga_{0.09}N$ cladding layer 619 of 0.1 to 2.0 μm, e.g., 0.5 μm thickness, whose impurity concentration is set to $1.0 \times 10^{17}$ to $1.0 \times 10^{19}$ atoms/cm$^3$, e.g., $2.0 \times 10^{17}$ atomst/cm$^3$, is grown by using TMAl, TMGa, ammonia, biscyclopentadienylmagnesium, and $N_2$ as the carrier gas, under the condition that the growth pressure is set to 70 to 760 Torr, e.g., 100 Torr and the growth temperature is set to 800 to 1200°, e.g., 950° C.

Then, a p-type GaN contact layer 620 or 0.1 to 2.0 μm, e.g., 0.5 μm thickness, whose impurity concentration is set to $1.0 \times 10^{17}$ to $1.0 \times 10^{19}$ atoms/cm$^3$, e.g., $1.0 \times 10^{18}$ atoms/cm$^3$, is grown by using TMGa, amonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 930° C.

Finally, a Ni electrode 621 of 100 nm thickness is provided as the n-side electrode on a back surface of the n-type SiC substrate 611 and a Ni electrode 622 which has a thickness of 100 nm and a width W of 3 µm is provided as the p-side electrode on the p-type GaN contact layer 620, and then a resultant structure is divided into respective devices to have a resonator length L of 700 µm. As a result, an MQW short wavelength semiconductor laser can be completed.

In this eighteenth embodiment, since the $Al_{0.18}Ga_{0.82}N$ electron blocking layer 617 is formed as the undoped layer, the hole density can be lowered and the high applied voltage V is requested whereas, since scattering due to the impurity can be eliminated, the effective mobility can be enhanced. As a result, reduction in the hole density caused in the case the electron blocking layer is formed of the p-type layer having an impurity concentration of about $5.0 \times 10^{17}$ to $5.0 \times 10^{19}$ atoms/cm$^3$, as in the prior art, can be compensated. Therefore, an effect of improving the hole injection efficiency can be expected as a whole.

Because the impurity concentration of the undoped layer in the GaN semiconductor is normally set below $1.0 \times 10^{17}$ atoms/cm$^3$, the same effect as the undoped layer can be achieved if such impurity concentration is below $1.0 \times 10^{17}$ atoms/cm$^3$ when the impurity is doped intentionally.

In the above eighteenth emobodiment, the p-side optical guiding layer has been constructed by the p-type layer for simplicity of explanation, but it may be constructed by the undoped layer. Also, the n-side optical guiding layer has been constructed by the undoped layer, but it may be constructed by the n-type layer.

Next, an MQW semiconductor laser according to a nineteenth embodiment of the present invention will be explained with reference to FIGS. 38A to 39 hereinbelow.

FIG. 38A is a sectional view showing the MQW semiconductor laser according to the nineteenth embodiment of the present invention, taken along its optical axis, FIG. 38B is a view showing a band diagram of the SQW semiconductor laser in FIG. 38A, and FIG. 39 is a view showing an advantageous effect achieved by the MQW semiconductor laser according to the nineteenth embodiment of the present invention.

First, like the above eighteenth embodiment, the AlGaN buffer layer 612, the n-type GaN intermediate layer 613, the n-type $Al_{0.09}Ga_{0.91}N$ cladding layer 614, the undoped GaN optical guiding layer 615, and the MQW active layer 616 are formed sequentially on the n-type SiC substrate 611.

Then, while increasing TMAl from 0 gradually and continuously, a p-type graded AlGaN layer 623 of 5 to 20 nm, e.g., 10 nm thickness, whose impurity concentration is set to $1.0 \times 10^{15}$ to $3.0 \times 10^{20}$ atoms/cm$^3$, e.g., $1.0 \times 10^{19}$ atoms/cm$^3$, is grown by using TMAl, TMGa, ammonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 950° C. Then, while keeping a ratio of TMAl/MGa at a constant value, a p-type $A_{10.18}Ga_{0.82}N$ layer 624 of 1 to 20 nm, e.g., 10 nm thickness, whose impurity concentration is set to $1.0 \times 10^{15}$ to $3.0 \times 10^{20}$ atoms/cm$^3$, e.g., $1.0 \times 10^{19}$ atoms/cm$^3$, is grown. Then, while reducing the ratio of TMAl/ThGa to 0 gradually and continuously, a p-type graded AlGaN layer 625 of 1 to 20 nm, e.g., 10 nm thickness, whose impurity concentration is set to $1.0 \times 10^{15}$ to $3.0 \times 10^{20}$ atoms/cm$^3$, e.g., $1.0 \times 10^{19}$ atoms/cm$^3$, is grown. As a result, a p-type electron blocking layer 626 in which a forbidden bandwidth is changed smoothly continuously is formed by the p-type graded AlGaN layer 623, the p-type $Al_{0.18}Ga_{0.82}N$ layer 624, and the p-type graded AlGaN layer 625.

Subsequently, like the eighteenth embodiment again, the p-type GaN optical guiding layer 618, the p-type $Al_{0.09}Ga_{0.91}N$ cladding layer 619, and the p-type GaN contact layer 620 are grown in sequence.

Then, the p-type GaN contact layer 620 and the p-type $Al_{0.09}Ga_{0.91}N$ cladding layer 619 are mesa-etched by means of dry etching. Finally, the Ni electrode 621 of 100 nm thickness is provided as the n-side electrode on the back surface of the n-type SiC substrate 611 and also the Ni electrode 622 of 100 nmthickness is provided as the p-side electrode on the p-type GaN contact layer 620 via a stripe-like opening of an SiO film 627, and then a resultant structure is divided into respective devices to have a resonator length L of 700 µm. As a result, an MQW short wavelength semiconductor laser can be completed.

In the nineteenth embodiment of the present invention, as shown in FIG. 38B, since the p-type electron blocking layer 626 has been formed by the p-type graded AlGaN layer 623, the p-type $Al_{0.18}Ga_{0.82}N$ layer 624, and the p-type graded AlGaN layer 625, the forbidden bandwidth can be changed smoothly continuously and also electron affinity can be changed continuously. As a consequence, difference in the electron affinity between the $In_{0.03}Ga_{0.97}N$ barrier layer constituting the MQW active layer 616 and the p-type graded AlGaN layer 623 can be almost eliminated on the n side. For this reason, no notch serving as potential barrier against the hole is formed on an interface between the $In_{0.03}Ga_{0.97}N$ barrier layer and the p-type graded AlGaN layer 623.

In addition, difference in the electron affinity between the p-type GaN optical guiding layer 618 and the p-type graded AlGaN layer 625 can also be eliminated on the p side. For this reason, no notch serving as the potential barrier against the hole is formed on an interface between the p-type GaN optical guiding layer 618 And the p-type graded AlGaN layer 625.

Therefore since the notch serving as the potential barrier electron blocking layer 626, the hole injection efficiency can be improved and therefore the driving voltage can be reduced.

FIG. 39 is a view illustrating a voltage-current characteristic obtained by simulation so as to explain an effect achieved in the case where the p-type graded AlGaN layer 623 and the p-type graded AlGaN layer 625 are provided.

As apparent from FIG. 39, it should be understood that, by providing the p-type graded AlGaN layer 623 and the p-type graded AlGaN layer 625, the driving voltage can be reduced lower than the case where no graded layer is provided to the overflow preventing layer, i.e., the electron blocking layer as in the prior art. This is due to suppression of notch formation, as mentioned above.

Although the graded layers have been provided on both sides of the p-type $Al_{0.18}Ga_{0.82}N$ layer 624 including a constant composition in the explanation of the nineteenth embodiment, such graded layer may be provided on either side. In this case, an improvement of the hole injection efficiency is low rather than the case where the graded layers are provided on both sides, nevertheless such hole injection efficiency can be improved rather than the case where no graded layer is provided.

In the above nineteenth embodiment, the impurity concentration such that contribution due to impurity conduction on the valence band side does not become remarkable, like the prior art, has been employed as the impurity concentration of the p-type electron blocking layer 226, but the p-type electron blocking layer may be doped at high concentration of more than $1.5 \times 10^{19}$ atoms/cm$^3$, e.g., $7 \times 10^{19}$ atoms/cm$^3$ suitably. In this case, both the improvement in the hole injection efficiency due to impurity conduction and the improvement in the hole injection efficiency due to notch elimination can be expected.

Further, in the above nineteenth embodiment, the p-type electron blocking layer 626 may be formed of the undoped layer like the above eighteenth embodiment. In this case, both the improvement in the hole injection efficiency due to the improvement in the hole effective mobility according to undoping and the improvement in the hole injection efficiency due to notch elimination can be expected.

In the above nineteenth embodiment and its modification, the p-side optical guiding layer may be composed of the undoped GaN optical guiding layer in place of the p-type GaN optical guiding layer 618. In addition, the n-side optical guiding layer umay be composed of the n-type GaN optical guiding layer in place of the undoped GaN optical guiding layer 615.

With the above, the eighteenth and nineteenth embodiments of the present invention have been explained, but the present invention is not limited to configurations set forth in the above eighteenth and nineteenth embodiments. By way of example, the sapphire substrate may be employed instead of the SiC substrate, like the prior art. In this case, at first, like the prior art, a low temperature GaN buffer layer 612 of 0.03 $\mu$m thickness is grown on the sapphire substrate which has the (0001) plane as the principal plane by the MOVPE method using TMGa, ammonia, and hydrogen (carrier gas) as the growth gas, under the condition that the growth pressure is set to 70 to 760 Torr, e.g., 100 Torr and the growth temperature is set to 500° C. Then, an n-type GaN intermediate layer of 0.1 to 2.0 $\mu$m, e.g., 1.0 $\mu$m thickness is grown by using TMGa, ammonia, and hydrogen as the carrier gas, under the condition that the growth pressure is set to 70 to 760 Torr, e.g., 100 Torr and the growth temperature is set to 800 to 1200° C., e.g., 950° C.

In the following, as completely similar to the above eighteenth and nineteenth embodiments, the n-type $Al_{0.09}Ga_{0.91}N$ cladding layer, the n-side GaN optical guiding layer, the MQW active layer, the electron blocking layer, the p-type GaN optical guiding layer, the p-type $Al_{0.09}Ga_{0.91}N$ cladding layer, and the p-type GaN contact layer are epitaxially grown in sequence.

In this case, the electron blocking layer has a configuration in correspondence to the concerned embodiments.

Next, in the following, like the example in the prior art, the p-type GaN layer and the p-type $Al_{0.09}Ga_{0.91}N$ cladding layer are mesa-etched by means of dry etching. Then, the n-side electrode made of Ti/Au is provided on an exposed area of the n-type GaN intermediate layer after a part of the n-type GaiN intermediate layer has been exposed, and also the p-side electrode made of Ni/Au is provided on the p-type GaN contact layer via an stripe-like opening of the $SiO_2$ film. Then, a pair of parallel end surfaces serving as resonator planes maybe formed by applying dry etching.

In the above eighteenth and nineteenth embodiments, the MQW structure made of $In_{0.15}Ga_{0.85}N/In_{0.03}Ga_{0.97}N$ has been employed as the multi-quantum well active layer. However, the mixed crystal ratio may be changed in the range of $Al_xGa_yIn_{1-x-y}N$ ($0 \leq x < 1$, $0 < y \leq 1$) according to the required wavelength, and correspondingly the mixed crystal ratio of the optical guiding layer and the cladding layer may be changed in the range of $Al_aGa_bIn_{1-a-b}N$ ($0 \leq a \leq 1$, $0 \leq b \leq 1$).

For example, in the above eighteenth and nineteenth embodiments, the InGaN for the InGaN well layer has been employed as the barrier layer, but AlGaN or GaN may be employed in place of InGaN. In particular, in the event that AlGa for GaN is employed, the notch formed on the interface between the barrier layer and the electron blocking layer using the graded layer can be eliminated perfectly.

Then, with reference to FIGS. 40 to 46B, a twentieth embodiment of the present invention which is capable of preventing overflow of electron by setting an impurity concentration in an electron blocking layer to more than $7 \times 10^{19}$ atoms/$cm^3$ and setting a growth temperature of the electron blocking layer to 600° C. to 900° C., and thus reducing the threshold current density will be explained hereinafter.

First, a method of manufacturing a short wavelength semiconductor laser according to a twentieth embodiment of the present invention will be explained with reference to FIG. 40 hereinbelow.

To begin with, an n-type SiC substrate 711 made of hexagonal crystal 6H-SiC which is bulk-grown by an advanced Rayleigh method and has a (0001) plane, i.e., c plane as a principal plane, whose carrier density is $4.0 \times 10^{18}$ atoms/$cm^3$, is prepared. Then, an n-type $Al_{0.09}Ga_{0.91}N$ buffer layer 712 of 50 nm to 5 $\mu$m, e.g., 350 nm thickness, whose impurity concentration is set to $5.0 \times 10^{17}$ to $1.0 \times 10^{19}$ atoms/$cm^3$, e.g., $8.0 \times 10^{18}$ atoms/$cm^3$, is grown on the n-type SiC substrate 711 by the MOVPE method using, as the growth gas, TMGa, TMAl, ammonia, $SiH_4$ as the dopant source, and hydrogen as the carrier gas, under the condition that the growth pressure is set to 70 to 760 Torr, e.g., 100 Torr and the growth temperature is set to 900 to 1200° C., e.g., 1100° C.

Then, an n-type $Al_{0.09}Ga_{0.91}N$ cladding layer 713 of 0.1 to 2.0 $\mu$m, e.g., 0.55 $\mu$m thickness, whose impurity concentration is set to $1.0 \times 10^{17}$ to $1.0 \times 10^{20}$ atoms/$cm^3$, e.g., $2.0 \times 10^{18}$ atoms/$cm^3$, is grown by using TMAl, TMGa, ammonia, $SiH_4$ as the dopant, and hydrogen as the carrier gas, under the condition that the growth pressure is set to 70 to 760 Torr, e.g., 100 Torr and the growth temperature is set to 800 to 1200° C., e.g., 950° C.

Then, an n-type GaN optical guiding layer 714 of 10 to 300 nm, e.g., 100 nm thickness, whose impurity concentration is set to $5.0 \times 10^{17}$ to $1.0 \times 10^{19}$ atoms/$cm^3$, e.g., $2.0 \times 10^{18}$ atoms/$cm^3$, is grown by using TMGa, ammonia, SiH as the dopant, and hydrogen as the carrier gas, under the condition that the growth pressure is set to 70 to 760 Torr, e.g., 100 Torr and the growth temperature is set to 800 to 1200° C., e.g., 1100° C.

Then, an MQW active layer 715 is formed by growing two to ten layers, e.g., three layers of undoped $In_{0.15}Ga_{0.85}N$ well layers each having a thickness of 3 to 10 nm, e.g., 4 nm, which are separated by undoped $In_{0.03}Ga_{0.97}N$ barrier layers each having a thickness of 1 to 10 nm, e.g., 5 nm respectively, by using TMGa, TMIN, ammonia, and $N_2$ as the carrier gas, under the condition that the growth pressure is set to 70 to 760 Torr, e.g., 100 Torr and the growth temperature is set to 600 to 900° C., e.g., 780° C.

Then, a $p^+$-type $Al_{0.18}Ga_{0.82}N$ electron blocking layer 716 of 5 to 30 nm, e.g., 20 nm thickness, whose impurity concentration is get to more than $7 \times 10^{19}$ atoms/$cm^3$, e.g., $1 \times 10^{20}$ atoms/$cm^3$, is grown by using TMAl, TMGA, ammonia, biscyclopentadienylmagnesium, and $N_2$ as the carrier gas, under the condition that the growth pressure is set to 70 to 760 Torr, e.g., 100 Torr and the growth temperature is set to 600 to 900° C., e.g., 780° C.

Then, a p-type GaN optical guiding layer 717 of 10 to 300 nm, e.g., 100 nm thickness, whose impurity concentration is set to $1.0 \times 10^{17}$ to $1.0 \times 10^{20}$ atoms/$cm^3$, e.g., $5.0 \times 10^{19}$ atoms/$cm^3$, is grown by using TMGa, ammonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 1100° C.

Then, a p-type $Al_{0.09}Ga_{0.91}N$ cladding layer 718 of 0.1 to 2.0 μm, e.g., 0.55 μm thickness, whose impurity concentration is set to $1.0 \times 10^{17}$ to $1.0 \times 10^{20}$ atoms/cm$^3$, e.g., $5.0 \times 10^{10}$ atoms/cm$^3$, is grown by using TMAl, TMGa, ammonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 1100° C.

Then, a p-type GaN first contact layer 719 of 0.1 to 2.0 μm, e.g., 0.1 μm thickness, whose impurity concentration is set to $1.0 \times 10^{17}$ to $1.0 \times 10^{20}$ atoms/cm$^3$, e.g., $5.0 \times 10^{19}$ atoms/cm$^3$, is grown by using TMGa, ammonia, biscyclopentadienylmagnesium, and $N_2$ as the carrier gas, under the condition that the growth pressure is set to 70 to 760 Torr, e.g., 100 Torr and the growth temperature is set to 800 to 1200° C., e.g., 1100° C.

Then, as in the growing condition of the p-type GN first contact layer 719, the p$^+$-type GaN second contact layer 720 of 5 to 5 nm thickness, e.g., 20 nm, whose impurity concentration is set $5.0 \times 10^{19}$ to $5.0 \times 10^{20}$ atoms/cm$^3$, e.g., $1.5 \times 10^{20}$ atots/cm$^3$ is grown.

In this case, the growth rates of the n-type layers 712 to 714 are set to 2 μm/hr respectively, the growth rate of the NQW active layer 715 is set to 0.3 μm/hr, the growth rate of the p$^+$-type $Al_{0.18}Ga_{0.82}N$ electron blocking layer 716 is set to 0.9 μm/hr, and the growth rates of the p-type layers 717 to 720 are met to 2.6 μm/hr respectively.

Then, a total thickness of the n-type SiC substrate 711 is thinned to a thickness of about 100 μm by polishing a back surface of the n-type SiC substrate 711. Then, the p$^+$-type second GaN contact layer 720 to the p-type $Al_{0.09}Ga_{0.91}N$ cladding layer 718 are mesa-etched by virtue of dry etching to form a stripe-like mesa which has a width of 4 μm and a height of 0.5 μm, for example.

Finally, an n-side electrode 722 made of Ni/Ti/Au is provided on the back surface or the n-type SiC substrate 711 and also a p-side electrode 723 made of Ni/Ti/Au is provided on the p$^+$-type GaN second contact layer 720 via an SiO$_2$ film 721 having a stripe-like opening of 2 μm width, for example. Then, a resultant structure is divided into respective devices to have a resonator length L of 700 μm, so that an short wavelength light emitting semiconductor laser having a MQW structure can be completed.

FIG. 41 is a view showing the optical output-current characteristic of the device which has the lest threshold current in the output-current characteristic found by the MQW semiconductor laser in the twentieth embodiment. In FIG. 41, the minimum current of the threshold is 380 mA.

The maximum current of the threshold current found in this time is 600 mA, and the average of the threshold is 500 mA as not shown in figure. These value is lower than that of conventional device which has 650 to 1600 mA of the threshold current.

A <1–100> direction is selected as the direction of stripe, and a (1–100) plane is selected as a plane of cleavage In order to confirm an advantageous effect obtained by using the p+-electron blocking layer, a surface light emitting type LED has been fabricated by crystal growth steps, which are identical to those of the above semiconductor laser, to measure photoluminescence spectrum. Therefore, the results will be explained with reference to FIGS. 42 to 44 hereinafter.

FIG. 42B is a schematic sectional view showing a surface light emitting type LED manufactured to measure an advantageous effect achieved by the MQW semiconductor laser according to the twentieth embodiment of the present invention, and FIG. 42A is a top view showing the surface light emitting type LED in FIG. 42B.

On an n-type SiC substrate 731 made of hexagonal crystal 6H-SiC which has a (0001) plane, i.e., c plane as a principal plane, whose carrier density is $4.0 \times 10^{18}$ atoms/cm$^3$, are deposited sequentially an n-type $Al_{0.09}Ga_{0.91}N$ buffer layer 732 of 0.35 μm thickness, whose impurity concentration is set to $8.0 \times 10^{18}$ atoms/cm$^3$; an n-type $Al_{0.09}Ga_{0.91}N$ cladding layer 733 of 0.55 μm thickness, whose impurity concentration is set to $2.0 \times 10^{18}$ atoms/cm$^3$; an n-type GaN optical guiding layer 734 of 100 nm thickness, whose impurity concentration is set to $2.0 \times 10^{18}$ atoms/cm$^3$; an MQW active layer 735 is formed by growing three layers of undoped $In_{0.15}Ga_{0.85}N$ well layers each having a thickness of 4 nm, which are separated by undoped $In_{0.03}Ga_{0.97}N$ barrier layers each having a thickness of 5 nm respectively; a p-type $Al_{0.18}Ga_{0.82}N$ electron blocking layer 736 of 20 nm thickness, a p-type GaN optical guiding layer 737 of 100 nm thickness, whose impurity concentration is set to $5.0 \times 10^{19}$ atoms/cm$^3$; a p-type $Al_{0.09}Ga_{0.91}N$ cladding layer 738 of 0.2 μm thickness whose impurity concentration is set to $5.0 \times 10^{19}$ atoms/cm$^3$; and a p-type GaN contact layer 739 of 0.1 μm thickness, whose impurity concentration is set to $5.0 \times 10^{19}$ atoms/cm$^3$; and a p+-type GaN second contact layer 740 of 20 nm thickness, whose impurity concentration is set to $1.5 \times 10^{19}$ atoms/cm$^3$.

Finally, an n-side electrode 741 made of Ni/Ti/Au is provided on a back surface of the n-type Sic substrate 731. A p-side electrode is formed by providing a semitransparent electrode 743 which is made of Ni/Ti/Au and formed on a surface of the p$^+$-type GaN second contact layer 740 via an SiO$_2$ film 742 having a substantially square opening, and then providing a bonding pad 744 made of Ni/Au on a peripheral area of the semitransparent electrode 743.

A dimension of the p$^+$-type GaN second contact layer 740 which can be viewed via the semitransparent electrode 743 is a 37 μm square, and a device dimension is a 300 μm square.

The surface light emitting type LED has been grown, under the condition that a Mg concentration in the p-type $Al_{0.18}Ga_{0.82}N$ electron blocking layer 736 is changed in the range of 0 to $2 \times 10^{20}$ atoms/cm$^3$ and the growth rate of the p-type $Al_{0.18}Ga_{0.82}N$ electron blocking layer 736 is set to two temperatures of 780° C. and 1100° C.

Then, the measurement has been made by applying a pulse current having a width of 100 μs and a frequency of lkHz to this surface light emitting type LED in the forward direction at room temperature, then collecting a light emitted from the semitransparent electrode 743 by a lense then separating the light into its components via a grating, and then detecting the components by a photomultiplier.

FIG. 43 is a view illustrating dependence of electroluminescence(EL) spectrum in the surface light emitting type LED on forming conditions. More particularly, measured results of the surface light emitting type LED are comparedbetween the sample, which is prepared under the conventional conditions that the Mg concentration in the electron blocking layer is set to $5.0 \times 10^{19}$ atoms/cm$^3$ and the growth temperature is set to 1100° C., and the sample, which is prepared under the new conditions the Mg concentration in the electron blocking layer is set to $1.0 \times 10^{20}$ atoms/cm$^3$ and the growth temperature is set to 780° C.

As evident from FIG. 43, it can be seen that, according the new conditions, the luminescence intensity in the neighborhood of 400 nm as the radiative center wavelength of the MQW active layer 735 made of InGaN can be enhanced strongly and it becomes about ten times as the intensity ratio.

Also, in the LED in the prior art, emitted lights having a wavelength of 363 nm as a peak wavelength exist in the p-type GaN optical guiding layer 737. In the LED according to the new conditions, no emitted light having such wavelength exists. This is because there is no overflow electron to the p-type GaN optical guiding layer 737.

FIG. 44A is a view illustrating dependence of luminescence intensity in the MQW active layer 735 made of InGaN on the Mg concentration. As evident from FIG. 44A, the luminescence intensity is increased abruptly from about $7 \times 10^{19}$ atoms/cm$^3$ as a boundary and it is increased by three digits in comparison with the conditions in the prior art.

In the case of the same Mg concentration, it has been found that, under the new condition that the growth temperature is set to 780° C., the luminescence intensity can be increased by more than two digits.

FIG. 44B is a view illustrating dependence of the luminescence intensity in the p-type GaN optical guiding layer 737 on the Mg concentration. As evident from FIG. 44B, the luminescence intensity is decreased from about $5 \times 10^{19}$ atoms/cm$^3$ as the boundary, nevertheless almost no luminescence has been observed under the new conditions that the growth temperature is set to 780° C.

From the measured results shown in FIGS. 43, 44A and 44B, like the above twentieth embodiment, by setting the Mg concentration in the p$^+$-type Al$_{0.18}$Ga$_{0.82}$N electron blocking layer 716 to more than $7 \times 10^{19}$ atom/cm$^3$s preferably more than $1 \times 10^{20}$ atoms/cm$^3$, overflow of the electron can be prevented and also recombination can be gener ated effectively in the MQW active layer 715, so that the threshold current density J$_{th}$ can be reduced.

Especially, if the crystal growth temperature of the p$^+$-type Al$_{0.18}$Ga$_{0.82}$N electron blocking layer 716 is set in the same range of 600 to 900° C., e.g. 780° C. as the MQW active layer 715, such affect becomes remarkable.

A lower limit of 600° C. is a lower limit of the temperature to enable a single crystal growth of InGaN, while an upper limit of 900° C. is a substantial upper limit of the growth temperature of InGaN.

In this way, the reason why the overflow of the electron can be substantially perfectly suppressed by setting the Mg concentration in the p$^+$-type Al$_{0.18}$Ga$_{0.82}$N electron blocking layer 716 to more than $7 \times 10^{19}$ atoms/cm$^3$ has not become apparent. However, since $1.0 \times 10^{20}$ atoms/cm$^3$ is a high impurity concentration which exceeds an impurity concentration limit to activate Mg, a high concentration impurity level can be formed in the forbidden bandwidth on the valence band side of the p$^+$-type Al$_{0.18}$Ga$_{0.92}$N electron-blocking layer 716, and this impurity level is useful for the improvement of the hole injection efficiency. As a result, it is supposed that overflow of the electron can be suppressed. Such circumstances will be explained with reference to FIG. 45 hereinbelow.

FIG. 45 is a view showing a band diagram in the neighborhood of the MQW active layer 715. Since the holes in the p-type GaN optical guiding layer 717 are injected into the MQW active layer 715 by either tunnel conduction via the impurity level 724 or impurity conduction via the impurity level 724, the hole injection efficiency can be improved. As a result, it will be supposed that, since the electrons which have been attracted by the electric field generatedby the holes remaining in the p-type GaN optical guiding layer 717 in the prior art are not attracted, overflow of the electrons can be suppressed. Therefore, the threshold current density J$_{th}$ can be made small.

Also, if this MQW semiconductor laser is driven, the applied voltage V may be applied to such extent that a band end of the valence band of the p-type GaN optical guiding layer 717 comes up to the impurity level 723. Therefore, in contrast to the MQW semiconductor laser in the prior art, the driving voltage can be made small, i.e., the active voltage is lower than that of the conventional MOW semiconductor laser.

Next, with reference to FIGS. 46A and 46B, it will be discussed hereinbelow whether or not the Mg concentration in the p-type electron blocking layer, i.e., the p-type overflow preventing layer of the short wavelength semiconductor laser in the prior art has been less than $5 \times 10^{19}$ atoms/cm$^3$.

FIG. 46A is a view illustrating dependence of the p-type carrier density, i.e., hole density in the p-type GaN layer on the Mg concentration. The p-type carrier density is increased with the increase of the Mg concentration if the Mg concentration is small, then such p-type carrier density is at its maximum when the Mg concentration is about $5 \times 10^{19}$ atoms/cm$^3$, and then such p-type carrier density is decreased conversely if the Mg concentration is increased still further.

The dependence of the p-type carrier density in the p-type GaN layer on the Mg concentration is true of the p-type AlGaN layer. Hence, it may be supposed that the p-type carrier density is decreased from $5 \times 10^{19}$ atoms/cm$^3$ as the boundary in the p$^+$-type Al$_{0.18}$Ga$_{0.82}$N electron blocking layer 716.

In this fashion, such a phenomenon that the carrier density is saturated or decreased from a certain dopant concentration as the boundary and forth can be commonly found other compound semiconductors. Thereforet it can be guessed that the reason why the value of $5 \times 10^{19}$ atoms/cm$^3$ has been employed as the Mg concentration in the p-type electron blocking layer of the short wavelength semiconductor laser in the prior art is due to the above circumstances.

Therefore, like the twentieth embodiment of the present invention, it is not totally effective as a means for increasing the p-type carrier density, rather it is disadvantageous, to set the Mg concentration in the p-type electron blocking layer to more than $7 \times 10^{19}$ atoms/cm$^3$, For this reason, it is to be noted that the above configuration cannot be implemented practically unless such a new founding detected by the inventors of the present invention that overflow of the electron can be suppressed by setting the Mg concentration to more than $7 \times 10^{19}$ atoms/cm$^3$ is provided.

Normally a phenomenon of degradation of the crystal quality because of excess doping appears in a high doping concentration region in which the carrier density is saturated. Since the carrier mobility is also decreased according to degradation of the crystal quality, such excess doping is not adopted unless another special circumstances exist. In view of this respectf it is also difficult to predict that the Mg concentration in the p-type electron blocking layer should be set to more than $7 \times 10^{19}$ atoms/cm$^3$.

FIG. 46B is a view illustrating dependence of the p-type carrier density in the p-type GaN layer formed by the MOPVD method on the growth temperature. The p-type carrier density is increased as the growth temperature is increased higher.

In other words, it can be understood that, if the growth temperature is lowered, the p-type carrier density is not increased but conversely decreased.

Such dependence of the p-type carrier density in the p-type GaN layer formed by the MOPVD method on the growth temperature is also true of the p-type AlGaN layer. Hence, to set the growth temperature of the p-type electron blocking layer to 600 to 900° C., cannot be adopted in the present invention unless the new finding such that overflow of the electron can be suppressed by setting the growth temperature to 600 to 900° C., preferably 730 and 830° C., e.g., 780° C. is found out by the inventors of the present invention.

Further, surface morphology is extremely degraded if the growth temperature of the GaN layer or the AlGaN layer is lowered to less than 900°, Therefore, usually the high temperature in the range of 900 to 1200° C., e.g., 1100° C. is employed as the crystal growth twmperature of the p-type GaN layer or the p-type AlGaN layer. In view of this respect, it is also difficult to predict that the crystal growth temperature of the p-type electron blocking layer should be set to 600 to 900° C.

Although the twentieth embodiment of the present invention has been explained in the above, the present invention is not limited to the configuration set forth in this embodiment, and therefore various modifications or variations may be employed. For instance, the p-type electron blocking layer is composed of $Al_{0.18}Ga_{0.82}N$, but it is not limited to such composition ratio, and therefore AlGaN with other composition ratio may be employed. In addition, the mixed crystal ratio may be changed in the range of $Al_xGa_yIn_{1-x-y}N$ (0<x<1, 0<y<1) according to the composition of the active layer and the p-type cladding layer.

Also, in the explanation of the above twentieth embodiment of the present invention, the MQW active layer which has the three-layered well layer has been employed as the active layer, but the MQW active layer having another configuration, e.g., the MQW active layer in which five layers of $In_{0.15}Ga_{0.85}N$ well layers each having a thickness of 2.5 nm are sandwiched by six layers of $In_{0.03}Ga_{0.97}N$ barrier layers each having a thickness of 5 nm alternatively may be employed. In addition, the SQW active layer may also be employed.

Also, in the explanation of the above twentieth embodiment of the present invention, the p-side optical guiding layer is composed of the p-type layer and the a-side optical guiding layer is composed of the n-type layer, but at least one of the optical guiding layers may be composed of the undoped layer.

According to the present invention which employs the first and second embodiments as a basic configuration, since the active layer of the short wavelength semiconductor laser made of the nitride compound semiconductor is composed of the single gain layer having a thickness of 3 nm or more and the optical guiding layer or the gain layer is composed of the undoped layer, the threshold current density $J_{th}$ can be reduced. In addition, since the well layer can be composed of the multi-quantum well structure having three layers or less each having a thickness of 6 nm if the cavity loss is heavy, the threshold current density $J_{th}$ can also be reduced. As a result, it is possible to achieve lower power consumption and to suppress heat generation at its minimum, so that reliability of the device can be improved and the semiconductor laser according to the first and second embodiments can contribute considerably to a higher density as a light source of an optical information recording apparatus, etc.

According to the present invention which employs the third to fifth embodiments as a basic configuration, since the forbidden bandwidth and thickness of the optical guiding layer and/or the cladding layer are selected such that the maximum optical gain position and the maximum position of the emitted light intensity distribution in the short wavelength semiconductor laser made of the nitride compound semiconductor coincide with each other, the optical confinement effect can be enhanced and the threshold current density $J_{th}$ can be reduced. As a result, it is possible to achieve lower power consumption and to suppress heat generation at its minimum, so that reliability of the device can be improved and the semiconductor laser according to the first and second embodiments can contribute considerably to the higher density as the light source of the optical information recording apparatus, etc.

According to the present invention which employs the sixth to eleventh embodiments as a basic configuration, since the hole mobility in the p-side optical guiding layer in the short wavelength semiconductor laser made of the nitride compound semiconductor is enhanced, or the recombination probability in the p-side optical guiding layer is reduced, the threshold current density $J_{th}$ can be reduced. As a result, it is possible to achieve lower power consumption and to suppress heat generation at its minimum, so that reliability of the device can be improved and the semiconductor laser according to the sixth to eleventh embodiments can contribute considerably to the higher density as the light source of the optical information recording apparatus, etc.

According to the present invention which employs the twelfth embodiment as a basic configuration, since, when the active layer of the semiconductor light emitting device made of the nitride compound semiconductor is to be grown, the InGaN active layer in which the dislocation density is less than 109 atoms/cm$^3$, the PL peak wavelength distribution is small, and the PL peak wavelength distribution is less than 90 meV, more preferably less than 50 meV, can be fabricated with good reproducibility by setting the growth rate to more than 0.1 $\mu$m/h, more preferably more than 0.3 $\mu$m/h, the low threshold current density of the blue-light semiconductor laser can be achieved. As a result, the semiconductor laser according to the twelfth embodiment can contribute considerably to the higher density as the light source of the optical information recording apparatus, etc.

According to the present invention which employs the thirteenth to fifteenth embodiments as a basic configuration, since the narrow forbidden bandwidth region is provided in the p-type cladding layer of the short wavelength semiconductor laser made of the nitride compound semiconductor and then the radiative recombination of overflow electrons is caused in this narrow forbidden bandwidth region, heat generation due to the overflow current can be significantly reduced. As a result, since the vicious cycle such as the increase of the overflow current due to such heat generation can be cut off, it is possible to achieve the lower threshold current density. In addition, reliability of the device can be improved since the device deterioration due to the electrode degradation can be suppressed, and the semiconductor laser according to the thirteenth to fifteenth embodiments can contribute considerably to the higher density as the light source of the optical information recording apparatus, etc.

According to the present invention which employs the sixteenth and seventeenth embodiments as a basic configuration, since the thickness of the barrier layer constituting the multi-quantum well active layer of the multi-quantum well structure semiconductor laser made of the nitride compound semiconductor is set below 5 nm, uneven carrier injection can be improved and also uneven generation of the optical gain can be improved. As a result, since the threshold current density $J_{th}$ can be reduced, lower power consumption can be achieved, and also reliability of the device can be improved, the semiconductor laser according to the sixteenth and seventeenth embodiments can contribute considerably to the higher density as the light source of the optical information recording apparatus, etc.

According to the present invention which employs the eighteenth and nineteenth embodiments as a basic configuration, since the electron blocking layer inserted into the semiconductor laser made of the nitride compound semiconductor is composed of the layer including the undoped layer or the graded layer, the hole injection efficiency can be improved. As a result, the threshold current density $J_{th}$ can be reduced and lower power consumption can be achieved, the semiconductor laser according to the eighteenth and nineteenth embodiments can contribute considerably to the higher density as the light source of the optical information recording apparatus, etc.

In addition, according to the present invention which employs the twentieth embodiment as a basic configuration, since the p-type electron blocking layer which is inserted into the semiconductor laser using the nitride compound semiconductor is composed of a high concentration layer in which the Mg concentration is set to more than $7 \times 10^{19}$ atoms/cm$^3$, overflow of electrons can be suppressed almost perfectly. As a result, since the threshold current density $J_{th}$ can be reduced to achieve low power consumption, the semiconductor laser according to the twentieth embodiment can contribute considerably to a higher density as a light source of an optical information recording apparatus, etc.

Further, a sapphire may be used as the material of the substrate instead of SiC.

What is claimed is:

1. An edge emitting type semiconductor laser using a nitride compound semiconductor, comprising:
    a substrate;
    a first cladding layer including a first type impurity, and said first cladding layer formed on or above said substrate;
    a first optical guiding layer formed on said first cladding layer;
    an active layer composed of a single gain layer including $Al_xGa_yIn_{1-x-y}N$ (where $0 \leq x < 1$, $0 < y \leq 1$) and having thickness of more than 3 nm, and below 10 nm and formed on said first cladding layer;
    a second optical guiding layer formed on said active layer; and
    a second cladding layer including second type impurity formed on said second optical guiding layer.

2. A semiconductor laser according to claim 1, wherein a thickness of said single gain layer is more than 6 nm.

3. A semiconductor laser according to claim 1, wherein a barrier layer is provided between said single gain layer and said optical guiding layer so as to form a single quantum well structure.

4. A semiconductor laser according to claim 1, wherein a barrier layer is provided between said gain layer and said optical guiding layer so as to form a single quantum well structure.

5. An edge emitting type semiconductor laser using a nitride compound semiconductor, comprising:
    a substrate;
    a first cladding layer including a first type impurity, and said first cladding layer formed on or above said substrate;
    an active layer compound of a single gain layer including $Al_xGa_yIn_{1-x-y}N$ (where $0 \leq x < 1$, $0 < y \leq 1$) and having a thickness of more than 3 mn, and said active layer formed of an undoped compound semiconductor layer and on or above said first cladding layer; and
    a second cladding layer including a second type impurity, and said second cladding layer formed on or above said active layer.

6. A semiconductor laser according to claim 5, wherein an impurity concentration of said uidoped layer is below $1.0 \times 10^{17}$ atoms/cm$^3$.

7. A semiconductor laser according to claim 5, wherein a thickness of said gain layer is more than 6 nm.

8. A semiconductor laser according to claim 5, wherein a thickness of said gain layer is less than 30 nm.

9. A semiconductor laser according to claim 8, wherein a thickness of said gain layer is below 10 nm.

10. An edge emitting type semiconductor laser using a nitride compound semiconductor, comprising:
    a substrate;
    a first cladding layer formed on or above said substrate;
    an active layer composed of a double quantum well structure having two gain layers including $Al_xGa_yIn_{1-x-y}N$ (where $0 \leq x < 1$, $0 < y \leq 1$) and, and said active layer formed on or above said first cladding layer;
    a second cladding layer formed on or above said active layer; and
    an electron blocking layer formed between said active layer and said second cladding layer.

11. A semiconductor laser according to claim 10. wherein said gain layers are formed of undoped layers.

12. An edge emitting type semiconductor laser using a nitride compound semiconductor, comprising:
    a substrate;
    a first cladding layer formed on or above said substrate;
    an active layer composed of a multi-quantum well structure having two or three gain layers each of which includes $Al_xGa_yIn_{1-x-y}N$ (where $0 \leq x < 1$, $0 < Y \leq 1$) and having a thickness of more than 6 nm, and said active layer formed on or above said first cladding layer; and
    a second cladding layer formed on or above said active layer.

13. A semiconductor laser according to claim 12, wherein said gain layers are formed of undoped layers.

14. A semiconductor laser using a nitride compound semiconductor, comprising:
    a substrate;
    p-type and n-type cladding layers formed above said substrate; and
    an active layer including a multi-quantum well structure and having an emitted light intensity distribution, and said active layer formed between said p-type and n-type cladding layers, and said emitted light intensity distribution having a maximum position shifted toward said p-type claddirng layer side.

15. A semiconductor laser according to claim 14, wherein said maximum position of said emitted light intensity distribution coincides with a first quantum well position from said p-type cladding layer side of said multiple quantum well structure.

16. A semiconductor laser according to claim 14, wherein an n-side optical guiding layer and a p-side optical guiding layer are provided between said active layer and an n-type cladding layer and a p-type cladding layer respectively, and a forbidden bandwidth of said n-side optical guiding layer is set wider than that of said p-side optical guiding layer.

17. A semiconductor laser according to claim 14, wherein an n-side optical guiding layer and a p-side optical guiding layer are provided between said active layer and an n-type cladding layer and a p-type cladding layer respectively, and a thickness of said p-side optical guiding layer is set larger than that of said n-side optical ciiding layer.

18. A semiconductor laser according to claim 14, wherein a forbidden bandwidth of said n-type cladding layer of said semiconductor laser is set wider than that of said p-type cladding layer.

19. A semiconductor laser using a nitride compound semiconductor, characterized in that a single quantum well structure is employed as an active layer, and a wide forbidden bandwidth layer is provided between said active layer and a p-side optical guiding layer, said wide forbidden bandwidth layer having a forbidden bandwidth wider than a forbidden bandwidth of said p-side optical guiding layer, wherein a deviation between a maximum position of an emitted light intensity distribution and a center position of said active layer due to said forbidden bandwidth layer can be compensated by an n-side layer.

20. A semiconductor laser according to claim 19, wherein said n-side layer is composed of at least an n-side optical guiding layer and a forbidden bandwidth of said n-side optical guiding layer is set wider than that of said p-side optical guiding layer.

21. A semiconductor laser according to claim 19, wherein said n-side layer is composed of at least an n-side optical guiding layer and a thickness of said n-side optical guiding layer is set thinner than that of said p-side optical guiding layer.

22. A semiconductor laser according to claim 19, wherein said n-side layer is composed of at least an n-type cladding layer, and a forbidden bandwidth of said n-type cladding layer is set wider than that of said p-type cladding layer.

23. A semiconductor laser according to claim 19, wherein said well layer constituting said active layer of said quantum well structure is composed of $Al_xGa_yIn_{1-x-y}N$ (where $0 \leq x < 1$, $0 < y \leq 1$).

24. A semiconductor laser using a nitride compound semiconductor, comprising:
   a substrate;
   p-type and n-type cladding layers formed on or above said substrate;
   an active layer formed between said p-type and n-type cladding layers;
   a p-side optical guiding layer is composed of either InGaN or GaN, and an impurity concentration of said p-side optical guiding layer is set below $1 \times 10^{17}$ atoms/$cm^3$, said p-side optical guiding layer formed between said p-type cladding layer and said active layer; and
   an n-side optical guiding layer formed between said n-type cladding layer and said active layer.

25. A semiconductor laser according to claim 24, wherein said p-side optical guiding layer is composed of an undoped layer.

26. A semiconductor laser according to claim 24, wherein a hole mobility in said p-side optical guiding layer is set more than 2 $cm^2/V \cdot s$.

27. A semiconductor laser using a nitride compound semiconductor, comprising:
   a substrate;
   p-type and n-type cladding layers formed on or above said substrate;
   an active layer formed between said p-type and n-type cladding layers;
   an n-side optical guiding layer formed between said n-type cladding layer and said active layer; and
   a p-side optical guiding layer formed between said p-type cladding layer and said active layer, and said p-side optical guiding layer having a thickness set thinner than that of said n-side optical guiding layer.

28. A semiconductor laser according to claim 27, wherein a forbidden bandwidth of said p-side optical guiding layer is set wider than that of said n-side optical guiding layer.

29. A semiconductor laser using a nitride compound semiconductor, comprising:
   a substrate;
   p-type and n-type cladding layers formed on or above said substrate;
   an active layer formed between said p-type and n-type cladding layers;
   an n-side optical guiding layer formed between said n-type cladding layer and said active layer; and
   a p-side optical guiding layer formed between said p-type cladding layer and said active layer, and said p-side optical guiding layer having a thickness set below 0.1 $\mu m$.

30. A semiconductor laser according to claim 29, wherein a forbidden bandwidth of said p-side optical guiding layer is set wider than that of said n-side optical guiding layer.

31. A semiconductor laser using a nitride compound semiconductor, comprising:
   a substrate;
   p-type and n-type cladding layers formed on or above said substrate;
   an active layer formed between said p-type and n-type cladding layers;
   an n-side optical guiding layer formed between said n-type cladding layer and said active layer; and
   a p-side optical guiding layer formed between said p-type cladding layer and said active layer, and a forbidden bandwidth in a region adjacent said p-type cladding layer wider than that in a region adjacent said active layer.

32. A semiconductor laser according to claim 31, wherein said forbidden bandwidth of said p-side optical guiding layer is changed stepwise.

33. A semiconductor laser according to claim 31, wherein said forbidden bandwidth of said p-side optical guiding layer is changed continuously.

34. A semiconductor laser using a nitride compound semiconductor, comprising:
   a substrate;
   p-type and n-type cladding layers formed on or above said substrate;
   an active layer formed between said p-type and n-type cladding layers;
   an n-side optical guiding layer formed between said n-type cladding layer and said active layer; and
   a p-side optical guiding layer formed between said p-type cladding layer and said active layer, and a forbidden banwidth changed continuously from a side adjacent said active layer to a side adjacent said p-type cladding layer.

35. A semiconductor laser according to claim 34, wherein said active layer includes In as a constituent element.

36. A semiconductor laser according to claim 34, wherein a first layer having a narrower forbidden bandwidth and constituting said p-side optical guiding layer is composed of InGaN, or GaN, and a second layer having a wider forbidden bandwidth wider than said narrower forbidden bandwidth and constituting said p-side optical guiding layer is composed of AlGaN.

37. A semiconductor light emitting device using a nitride compound semiconductor, characterized in that a distribution or photoluminescence wavelengths in an active layer in a resonator is less than 90 meV.

38. A semiconductor light emitting device according to claim 37, wherein said distribution or said photoluminescence wavelengths in said active layer in said resonator is less than 50 meV.

39. A semiconductor light emitting device according to claim 37, wherein said active layer includes In as a constituent element.

40. A semiconductor light emitting device using a nitride compound semiconductor, characterized in that a dislocation density in an active layer in a resonator is set less than $1 \times 10^9$ cm$^{-2}$.

41. A semiconductor light emitting device according to claim 40, wherein said dislocation density in said active layer in said resonator is set less than $1 \times 10^8$ cm$^{-2}$.

42. A semiconductor light emitting device according to claim 41, wherein said active layer includes In as a constituent element.

43. A semiconductor light emitting device according to claim 40, wherein said active layer includes In as a constituent element.

44. A semiconductor laser using a nitride compound semiconductor, comprising:
   a substrate;
   p-type and n-type cladding layers formed on or above said substrate, and said p-type cladding layer composed of a multi-layered structure in which an intermediate layer is put between two p-type semiconductor layers, a forbidden bandwidth of said intermediate layer is narrower than that of said two p-type semiconductor layers; and
   an active layer formed between said p-type and n-type cladding layers.

45. A semiconductor laser according to claim 44, wherein said intermediate layer is composed of a single narrow forbidden bandwidth layer.

46. A semiconductor laser according to claim 44, wherein said forbidden bandwidth is changed continuously in said intermediate layer such that said forbidden bandwidth is made narrowest at an arbitrary position between said two p-type semiconductor layers.

47. A semiconductor laser according to claim 44, wherein said forbidden bandwidth is changed continuously from said first layer to said second layer constituting said intermediate layer.

48. A semiconductor laser according to claim 47, wherein said forbidden bandwidth from said first layer to said second layer constituting said intermediate layer is changed continuously.

49. A semiconductor laser according to claim 44, wherein at least a part of said intermediate layer is composed of an undoped layer.

50. A semiconductor laser according to claim 44, wherein said p-type semiconductor layers are composed of AlGaN, and said intermediate layer is composed of any of InGaN, GaN, and AlGaN.

51. An edge emitting type semiconductor laser using a nitride compound semiconductor, comprising:
   a substrate;
   n-type and p-type cladding layers formed over said substrate;
   an active layer formed between said p-type and n-type cladding layers; and
   an electron blocking layer provided between said p-type cladding layer and said active layer, wherein an impurity concentration in said electron blocking layer is set below $1.0 \times 10^{17}$ atoms/cm$^3$.

52. An edge emitting type semiconductor laser according to claim 51, wherein said electron blocking layer is composed of an undoped compound layer.

53. A semiconductor laser according to claim 52, wherein said electron blocking layer provided on said p side of said active layer is composed of an undoped layer.

54. A semiconductor laser using a nitride compound semiconductor, comprising:
   a substrate;
   p-type and n-type cladding layers formed on or above said substrate;
   an active layer formed between said p-type and n-type cladding layers; and
   an electron blocking layer formed between said active layer and said p-type cladding layer, and said electron blocking layer having an energy bandgap width which changes gradually in a p-side region near said p-type cladding layer.

55. A semiconductor laser using a nitride compound semiconductor according to claim 54, further comprising:
   a optical guiding layer formed between said p-type cladding layer and said electron blocking layer.

56. A semiconductor laser using a nitride compound semiconductor, comprising:
   a substrate;
   p-type and n-type cladding layers formed on or above said substrate;
   an active layer formed between said p-type and n-type cladding layers; and
   an electron blocking layer formed between said active layer and said p-type cladding layer, and said electron blocking layer having an energy band width changing gradually in an n-side region near said active layer.

57. A semiconductor laser using a nitride compound semiconductor, comprising:
   a substrate;
   p-type and n-type cladding layers formed on or above said substrate;
   an active layer formed between said p-type and n-type cladding layers; and
   an electron blocking layer formed between said active layer and said p-type cladding layer, and said electron blocking layer having an energy band width changing gradually in an n-side region near said active layer and changing gradually in a p-side region near said p-type cladding layer.

58. A semiconductor laser using a nitride compound semiconductor, comprising
   a substrate;
   p-type and n-type cladding layers formed on or above said substrate;
   an active layer formed between said p-type and n-type cladding layers; and
   an electron blocking layer formed between said active layer and said p-type cladding layer, and said electron blocking layer including Mg of a concentration more than $7 \times 10^{19}$ atoms/cm$^3$.

* * * * *